(12) United States Patent
Aotake et al.

(10) Patent No.: US 11,333,964 B2
(45) Date of Patent: May 17, 2022

(54) ORGANIC COMPOUND, NEAR INFRARED ABSORBING DYE, PHOTOELECTRIC CONVERSION ELEMENT, LIGHT SENSOR THEREOF, AND IMAGING ELEMENT

(71) Applicant: NIPPON KAYAKU KABUSHIKI KAISHA, Tokyo (JP)

(72) Inventors: Tatsuya Aotake, Saitama (JP); Toshifumi Inouchi, Tokyo (JP); Hidenori Yakushiji, Tokyo (JP); Tatsuya Yamamoto, Tokyo (JP)

(73) Assignee: NIPPON KAYAKU KABUSHIKI KAISHA, Tokyo (JP)

( * ) Notice: Subject to any disclaimer, the term of this patent is extended or adjusted under 35 U.S.C. 154(b) by 747 days.

(21) Appl. No.: 16/085,387

(22) PCT Filed: Mar. 13, 2017

(86) PCT No.: PCT/JP2017/009952
§ 371 (c)(1),
(2) Date: Sep. 14, 2018

(87) PCT Pub. No.: WO2017/159610
PCT Pub. Date: Sep. 21, 2017

(65) Prior Publication Data
US 2019/0086790 A1    Mar. 21, 2019

(30) Foreign Application Priority Data

Mar. 18, 2016 (JP) .............................. JP2016-054621
Mar. 18, 2016 (JP) .............................. JP2016-054622

(51) Int. Cl.
*C09B 23/00* (2006.01)
*C07F 5/02* (2006.01)
(Continued)

(52) U.S. Cl.
CPC ................ *G03C 8/24* (2013.01); *C07F 1/005* (2013.01); *C07F 5/022* (2013.01);
(Continued)

(58) Field of Classification Search
CPC ........... C09B 23/00; C09B 57/10; C09K 3/00; C09K 11/06; G02B 5/20; G02B 5/208;
(Continued)

(56) References Cited

U.S. PATENT DOCUMENTS 3,919,235 A    11/1975   Crounse et al.
3,993,658 A    11/1976   Crounse et al.
(Continued)

FOREIGN PATENT DOCUMENTS

EP    2966080 A1    3/2014
JP    50-1121 A     1/1975
(Continued)

OTHER PUBLICATIONS

Valentina F. Donyagina et al., "Synthesis of N,N-difluoroboryl complexes of 3,3'-diarylazadiisoindolylmethenes", Tetrahedron Letters, vol. 49, Issue 42, Aug. 27, 2008, pp. 6152-6154.
(Continued)

*Primary Examiner* — Peter L Vajda
*Assistant Examiner* — Jayson D Cosgrove
(74) *Attorney, Agent, or Firm* — Greenblum & Bernstein, P.L.C.

(57) ABSTRACT

An organic compound represented by general formula (1) is a novel organic compound having an absorption band in the near infrared region, and is useful for infrared absorbing dyes, optical films, and organic electronic devices such as photoelectric conversion elements, wherein $R^1$ to $R^{18}$ each independently represent a hydrogen atom, an aryl group, a heteroaryl group, an alkyl group, a cycloalkyl group, a
(Continued)

halogen atom, a hydroxy group, an alkoxy group, a mercapto group, an alkylthio group, a nitro group, a substituted amino group, an amide group, an acyl group, a carboxyl group, an acyloxy group, a cyano group, a sulfo group, a sulfamoyl group, an alkylsulfamoyl group, a carbamoyl group, or an alkylcarbamoyl group; and X represents a substituted or unsubstituted methine group, a silylidyne group, a germylidyne group, a stannylidyne group, a nitrogen atom, a phosphorus atom, an arsenic atom, or an antimony atom.

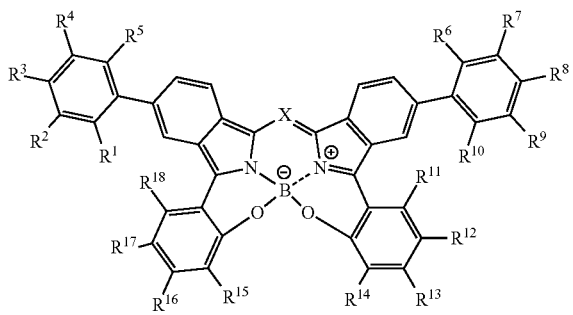

(1)

17 Claims, 10 Drawing Sheets

(51) Int. Cl.
| | |
|---|---|
| G02B 5/20 | (2006.01) |
| G02B 5/22 | (2006.01) |
| C09K 3/00 | (2006.01) |
| H01L 51/42 | (2006.01) |
| H01L 51/46 | (2006.01) |
| G03C 8/24 | (2006.01) |
| C09B 57/10 | (2006.01) |
| H01L 51/00 | (2006.01) |
| C09K 11/06 | (2006.01) |
| C07F 1/00 | (2006.01) |
| C07F 15/00 | (2006.01) |
| G03C 7/392 | (2006.01) |
| G11B 7/245 | (2006.01) |
| G11B 7/2463 | (2013.01) |
| G11B 7/2475 | (2013.01) |
| G11B 7/2478 | (2013.01) |
| H01L 27/146 | (2006.01) |
| H01L 27/30 | (2006.01) |

(52) U.S. Cl.
CPC ...... *C07F 15/0066* (2013.01); *C07F 15/0093* (2013.01); *C09B 57/10* (2013.01); *C09K 11/06* (2013.01); *G02B 5/20* (2013.01); *G02B 5/22* (2013.01); *G03C 7/39284* (2013.01); *G11B 7/245* (2013.01); *G11B 7/2463* (2013.01); *G11B 7/2475* (2013.01); *G11B 7/2478* (2013.01); *H01L 27/14647* (2013.01); *H01L 51/008* (2013.01); *H01L 51/0012* (2013.01); *H01L 51/0064* (2013.01); *H01L 51/4206* (2013.01); *C09K 2211/1029* (2013.01); *H01L 27/307* (2013.01); *H01L 51/42* (2013.01); *Y02E 10/549* (2013.01)

(58) Field of Classification Search
CPC ... G02B 5/223; C07F 5/022; H01L 27/14647; H01L 27/14649; H01L 51/42
See application file for complete search history.

(56) References Cited

U.S. PATENT DOCUMENTS

| | | | |
|---|---|---|---|
| 4,066,653 A | | 1/1978 | Crounse et al. |
| 4,122,261 A | | 10/1978 | Crounse et al. |
| 2007/0238802 A1 | | 10/2007 | Harada et al. |
| 2008/0076044 A1 | | 3/2008 | Mizukawa et al. |
| 2010/0230647 A1 | | 9/2010 | Mizukawa et al. |
| 2012/0037890 A1 | * | 2/2012 | Okuda ............... C07F 5/022 257/40 |
| 2012/0126213 A1 | | 5/2012 | Gresser et al. |
| 2012/0138877 A1 | | 6/2012 | Mizukawa et al. |
| 2012/0238752 A1 | | 9/2012 | Mizukawa et al. |
| 2015/0270501 A1 | | 9/2015 | Thompson et al. |
| 2016/0200970 A1 | | 7/2016 | Sakurai et al. |

FOREIGN PATENT DOCUMENTS

| | | |
|---|---|---|
| JP | H05-37119 A | 2/1993 |
| JP | 7-271081 A | 10/1995 |
| JP | 2007-3944 A | 1/2007 |
| JP | 2007-271745 A | 10/2007 |
| JP | 2009-031713 A | 2/2009 |
| JP | 2012-199541 A | 10/2012 |
| JP | 2012-219258 A | 11/2012 |
| JP | 2012-527748 A | 11/2012 |
| JP | 2013-205820 A | 10/2013 |
| JP | 2015-530761 A | 10/2015 |
| WO | 2013/035303 A1 | 3/2013 |
| WO | 2014/136710 A1 | 9/2014 |
| WO | 2015/022977 A1 | 2/2015 |

OTHER PUBLICATIONS

Yuya Tomimori et al., "Synthesis of p-expanded O-chelated boron-dipyrromethene as an NIR dye", Tetrahedron, 67, 2011, pp. 3187-3193.
Yuji Kubo et al., "Synthesis of a new type of dibenzopyrromethene-boron complex with near-infrared absorption property", Tetrahedron Letters, 51, 12, 2010, pp. 1600-1602.
International Search Report issued with respect to Patent Application No. PCT/JP2017/009952, dated May 16, 2017.
International Preliminary Report on Patentability issued with respect to Patent Application No. PCT/JP2017/009952, dated Sep. 18, 2018.

\* cited by examiner

[Figure 1]
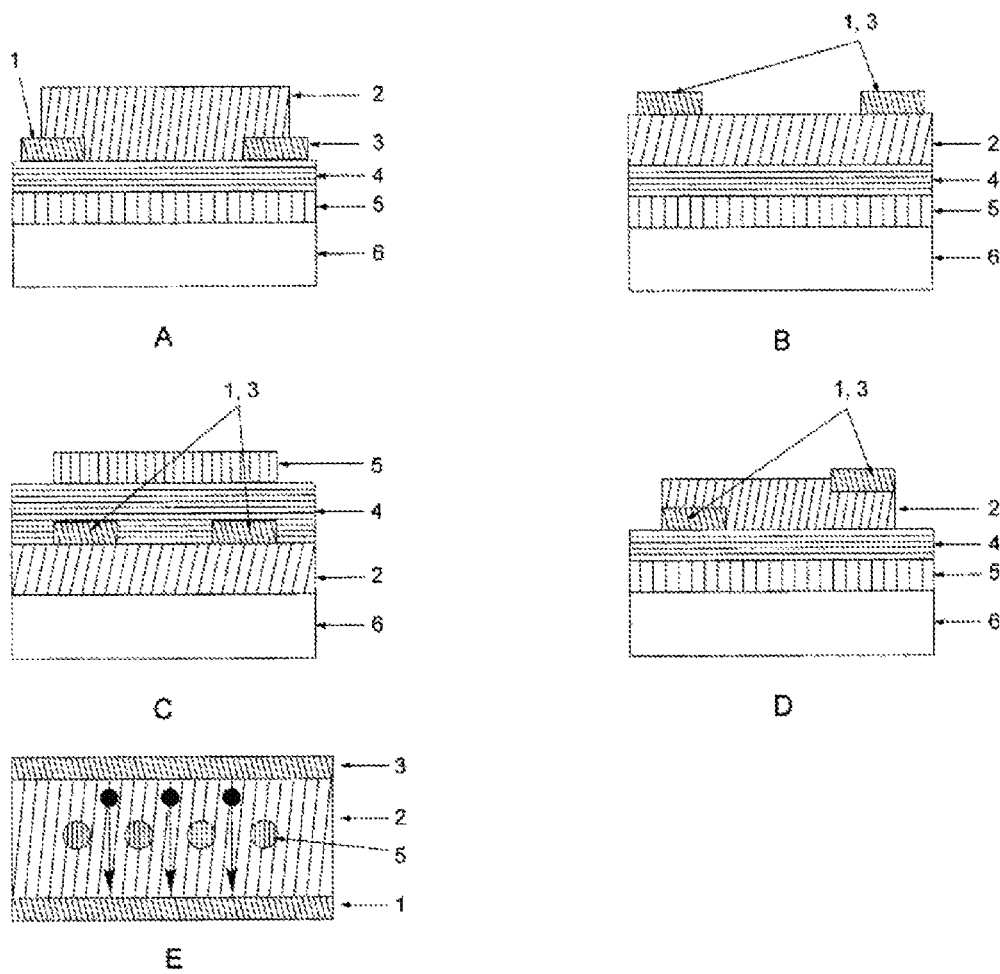

[Figure 2]
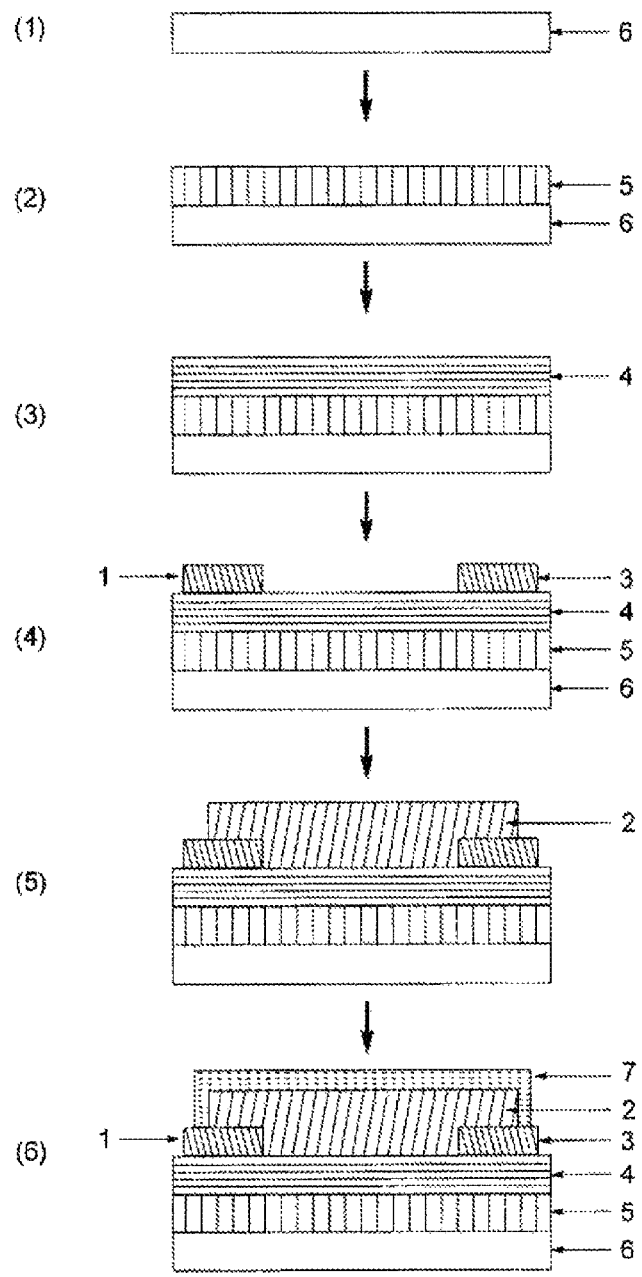

[Figure 3]
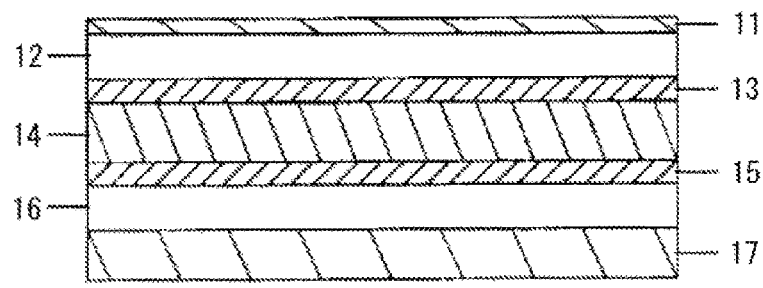
[Figure 4]
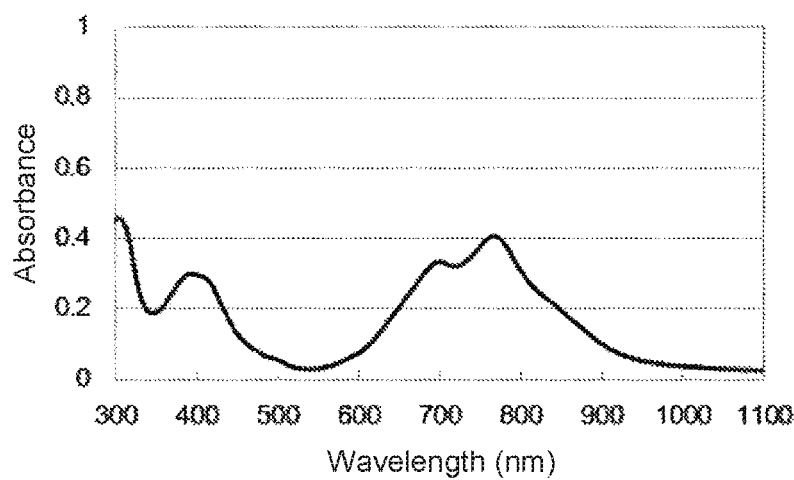

[Figure 5]
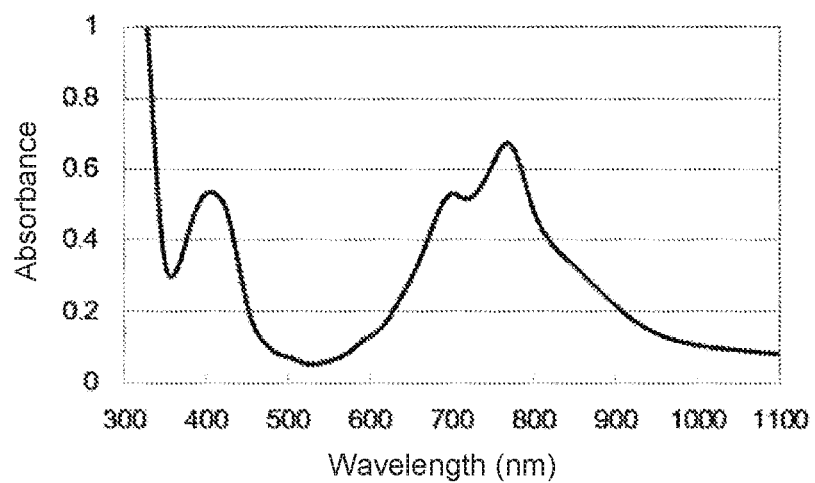
[Figure 6]
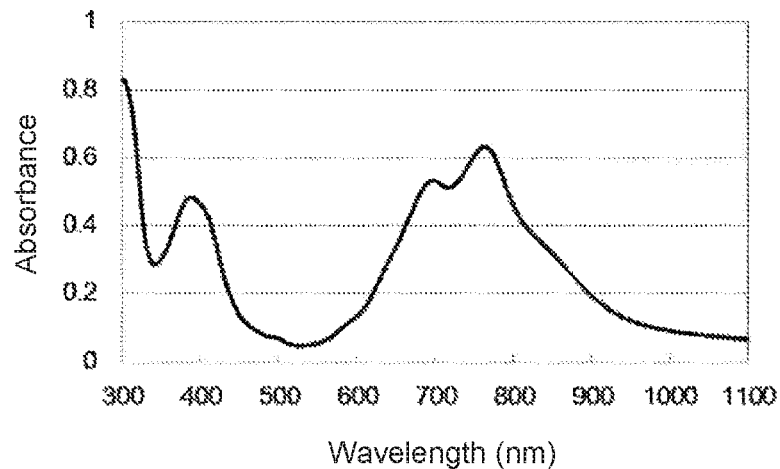

[Figure 7]
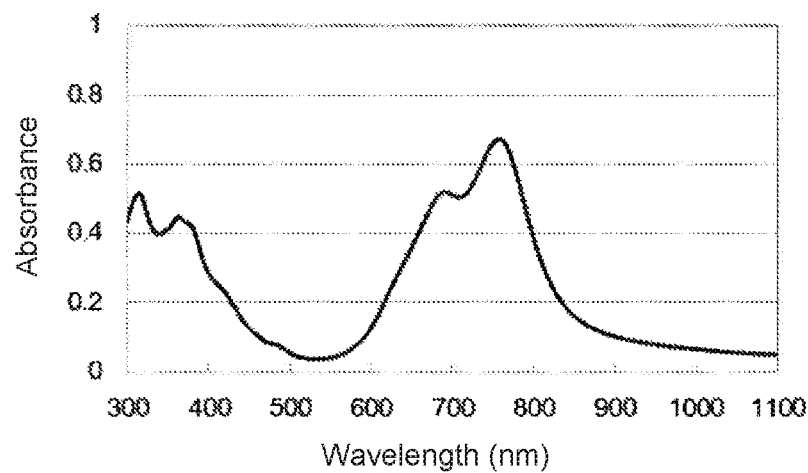
[Figure 8]
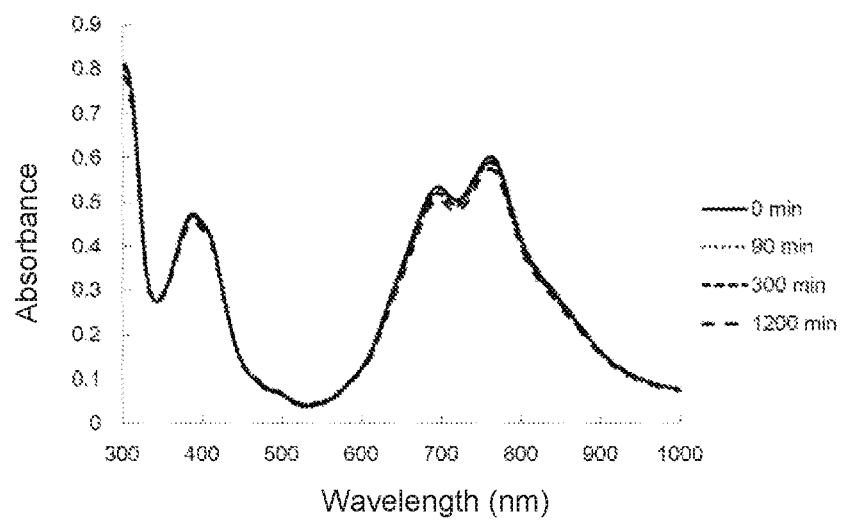

[Figure 9]
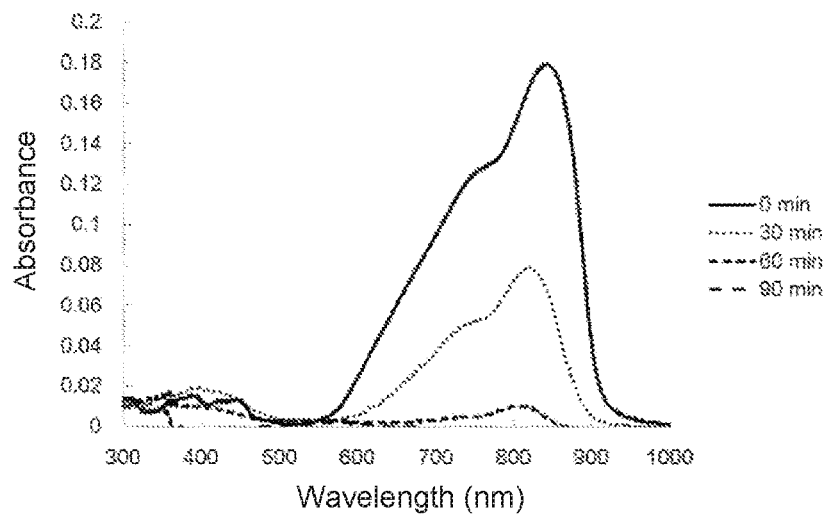
[Figure 10]
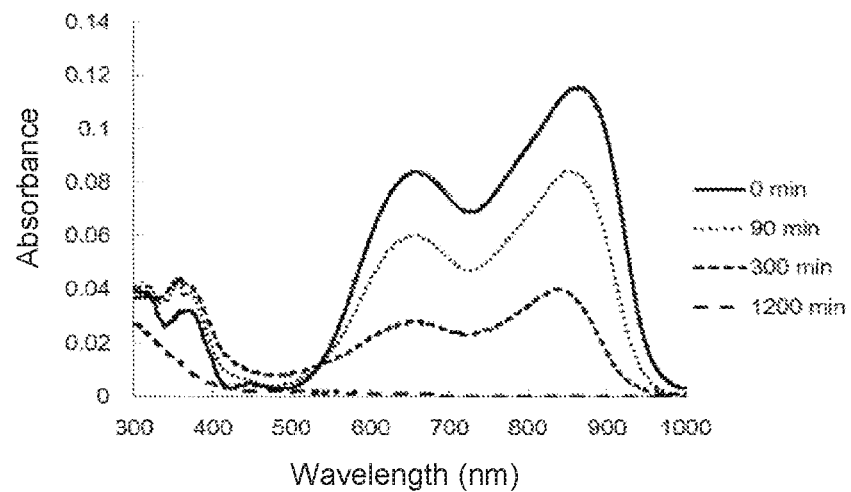

[Figure 11]
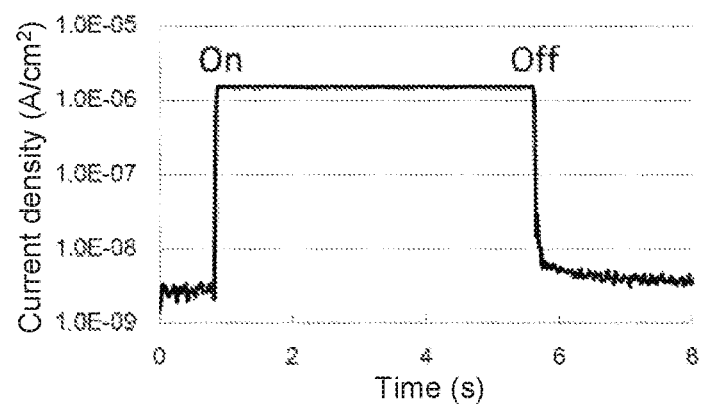
[Figure 12]
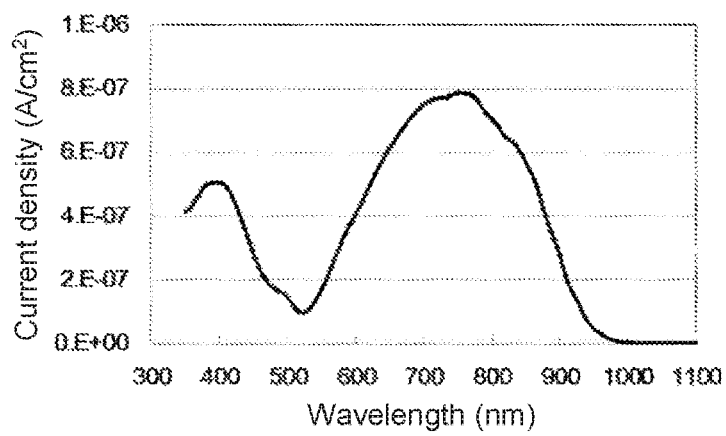

[Figure 13]
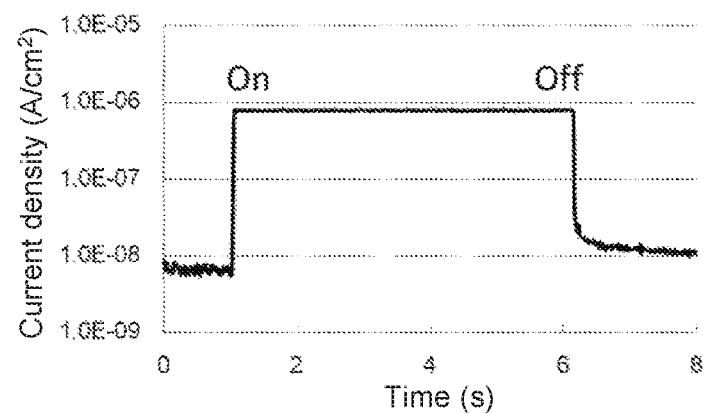
[Figure 14]
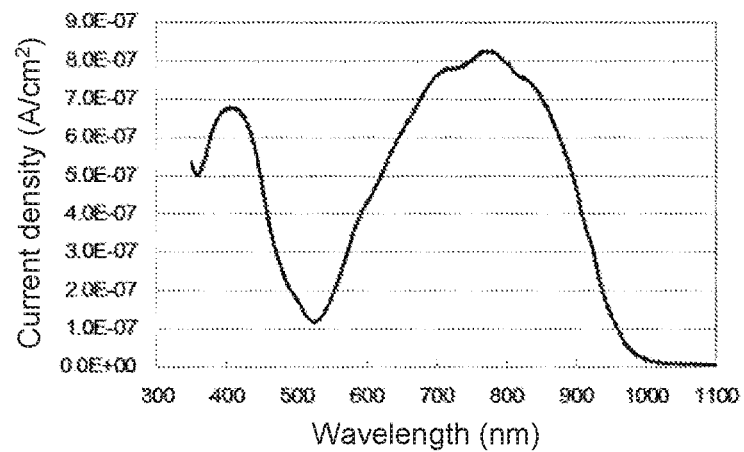

[Figure 15]
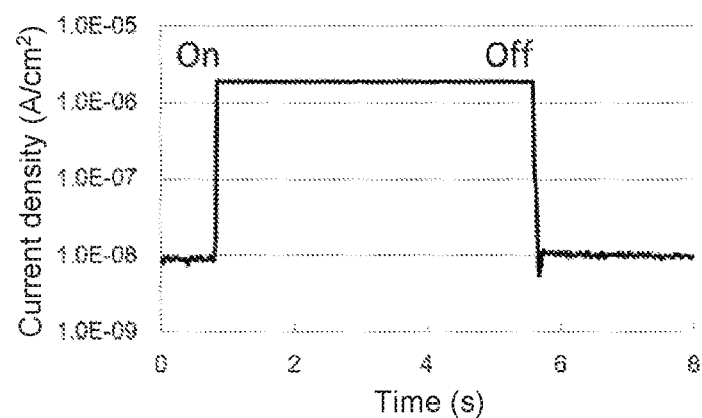
[Figure 16]
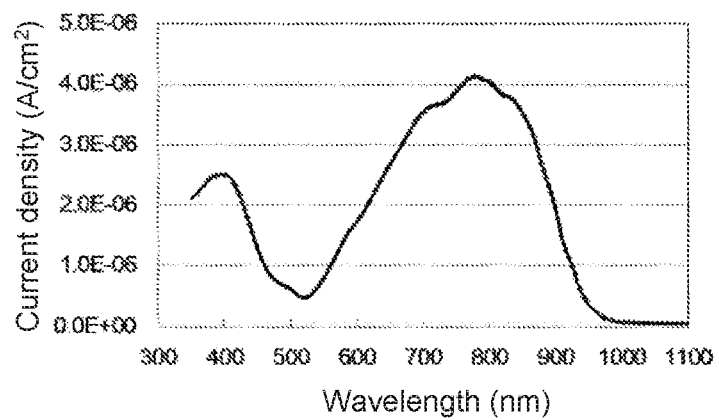

[Figure 17]
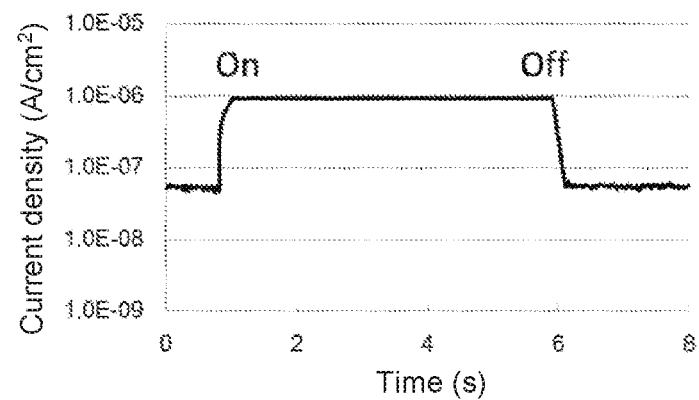
[Figure 18]
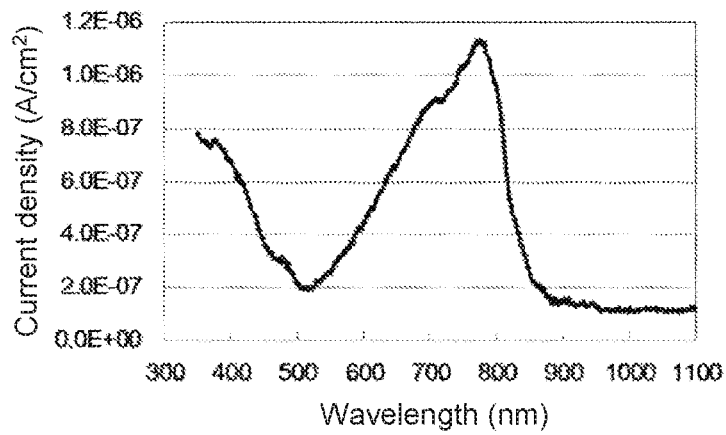

ORGANIC COMPOUND, NEAR INFRARED ABSORBING DYE, PHOTOELECTRIC CONVERSION ELEMENT, LIGHT SENSOR THEREOF, AND IMAGING ELEMENT

TECHNICAL FIELD

The present invention relates to an organic compound having an absorption band in the near infrared region, and an organic electronic device using the organic compound.

BACKGROUND ART

A near infrared light absorbing dye having an absorption in the near infrared region from 700 to 2000 nm has conventionally been studied regarding the application thereof to various intended uses in the industry. For example, such a near infrared light absorbing dye has been used for intended uses including: the intended use as an optical information recording medium such as CD-R (Compact Disk-Recordable); and the intended use as printing such as thermal CTP (Computer To Plate), flash toner fixing, or laser heat-sensitive recording; and intended uses such as a heat insulating sheet. Moreover, utilizing the property of the near infrared light absorbing dye that is selective absorption of a light in a specific wavelength area, it has also been used as a near infrared cut filter, which is used in PDP (plasma display panel) filters, etc., or as a film for the control of plant growth, etc.

Furthermore, such a near infrared light absorbing dye can also be used as a near infrared absorbing ink by being dissolved or dispersed in a solvent. The printed matter obtained using the near infrared absorbing ink is hardly recognized by visual observation, and can be read only using a near infrared detector, etc. Thus, the near infrared absorbing ink is used in printing for the purpose of anti-counterfeiting, etc.

As such infrared absorbing dye for formation of invisible images, inorganic infrared absorbing materials and organic; infrared absorbing materials have already been known. Among them, as inorganic infrared absorbing materials, rare earth metals such as ytterbium, copper phosphate crystallized glass, and the like have been known. However, since the ability of such an inorganic infrared absorbing material to absorb light in the near infrared region is not sufficient, a large amount of infrared absorbing material becomes necessary per unit area of an invisible image. As such, when an invisible image is formed using an inorganic infrared absorbing material, if a visible image is further formed on the surface thereof, the unevenness of the invisible image below the visible image would influence on the visible image on the surface side.

In contrast, since the organic infrared absorbing material has a sufficient light-absorbing property the infrared region thereof, the amount of the organic infrared absorbing material used per unit area of an invisible image can be small. Thus, the organic infrared absorbing material does not cause inconvenience, differing from the case of using the inorganic infrared absorbing material. Accordingly, the development of a large number of organic infrared absorbing materials has been advanced so far.

For example, Patent Literature 1 discloses a naphthalocyanine compound as an organic near infrared absorbing material. However, since the naphthalocyanine compound is problematic in terms of a complicated production method thereof and difficulty in adjusting the solubility thereof, in general, a counterionic dye compound is used as a near infrared absorbing material.

Regarding other organic near infrared absorbing materials, Patent Literature 2 discloses an organic aminium compound as an example of an infrared-absorbing substance having a light-absorbing property in the infrared region.

Patent Literature 3 discloses an indolenine compound as an example of an organic dye compound having a light-absorbing property in the near infrared region.

Patent Literature 4 discloses a naphthofluorescein compound as an example of a near infrared fluorescent dye having a fluorescence wavelength in the near infrared region.

Patent Literature 5 discloses a dibenzopyrromethene boron chelate compound having an absorption characteristic wavelength in the long wavelength side.

Moreover, Non Patent Literature 1 reports a boron dipyrromethene compound as an example of an organic compound having a fluorescence wavelength in the near infrared region.

Non Patent Literature 2 reports a boron dipyrromethene compound as an example of an organic compound having an absorption wavelength in the near infrared region, and this compound is used in the state of a mixture as a sensitizer for solar cells.

CITATION LIST

Patent Literature

Patent Literature 1: Japanese Patent Laid-Open. No. 2007-3944
Patent Literature 2: Japanese Patent Laid-Open No. 7-271081
Patent Literature 3: Japanese Patent Publication No. 5-37119
Patent Literature 4: Japanese Patent Laid-Open. No. 2012-219258
Patent Literature 5: Japanese Patent. Laid-Open No. 2012-199541

Non Patent Literature

Non Patent Literature 1: Tetrahedron 2011, 67, 3187-3193
Non Patent Literature 2: Tetrahedron Letters 2010, 51, 12, 1600-1602

SUMMARY OF INVENTION

Technical Problem

However, these conventional organic compounds having an absorption in the infrared region have low stability in the atmosphere. On the other hand, it has been desired to develop an organic compound having an absorption in the infrared region, which has easy processability into an infrared light film.

Furthermore, when the sensing of a near infrared light, is intended, a material used for the active layer does not need to have an absorption in the visible wavelength region, and thus, a photoelectric conversion element, which is produced only with an organic compound having a strong absorption in the near infrared region, has been desired.

In Non Patent Literature 1, the light absorption maximum wavelength is 711 nm, and thus, a near infrared absorbing material having an absorption band in a longer wavelength region is necessary. Non Patent Literature 2 and Patent Literature 1 merely disclose the use of an organic compound as a sensitizer for organic thin film solar cell elements, and do not disclose other uses thereof.

It is an object of the present invention to provide a novel organic compound, which has easy processability by which it can be used in infrared light films, high stability in the atmosphere, and also, an absorption band in the infrared region thereof.

It is another object of the present invention to provide use of a near infrared absorbing dye, an optical film and an organic electronic device such as a photoelectric conversion element (in particular, an imaging element and a light sensor) using an organic compound having absorption properties in the near infrared region and excellent photoelectric conversion performance.

Solution to Problem

As a result of intensive studies directed towards achieving the aforementioned objects, the present inventors have focused on a compound having a dibenzopyrromethene skeleton, thereby completing the present invention.

Specifically, the present invention relates to the following [1] to [11].

[1] An organic compound represented by the following general formula (1):

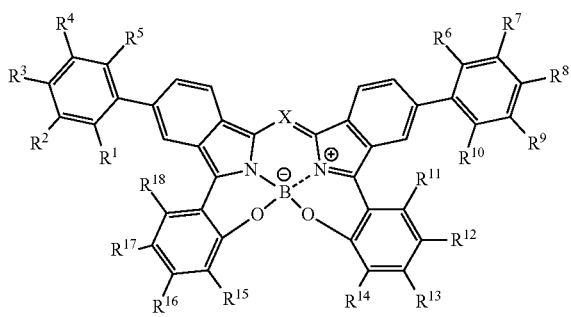

(1)

wherein $R^1$ to $R^{18}$ each independently represent a hydrogen atom, an aryl group, a heteroaryl group, an alkyl group, a cycloalkyl group, a halogen atom, a hydroxy group, an alkoxy group, a mercapto group, an alkylthio group, a nitro group, a substituted amino group, an amide group, an acyl group, a carboxyl group, an acyloxy group, a cyano group, a sulfo group, a sulfamoyl group, an alkylsulfamoyl group, a carbamoyl group, or an alkylcarbamoyl group; and X represents a substituted or unsubstituted methine group, a silylidyne group, a germylidyne group, a stannylidyne group, a nitrogen atom, a phosphorus atom, an arsenic atom, or an antimony atom.

[2] An organic compound represented by the following general formula (2):

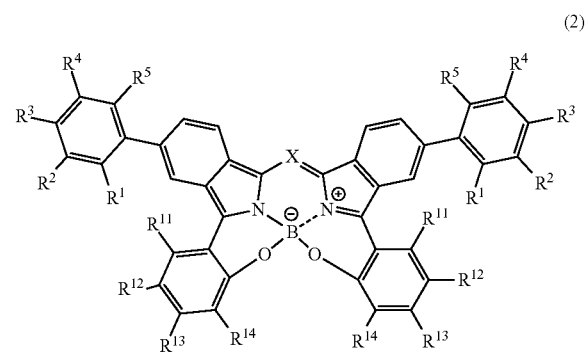

(2)

wherein $R^1$ to $R^5$ or $R^{11}$ to $R^{14}$ each independently represent a hydrogen atom, an aryl group, a heteroaryl group, an alkyl group, a cycloalkyl group, a halogen atom, a hydroxy group, an alkoxy group, a mercapto group, an alkylthio group, a nitro group, a substituted amino group, an amide group, an acyl group, a carboxyl group, an acyloxy group, a cyano group, a sulfo group, a sulfamoyl group, an alkylsulfamoyl group, a carbamoyl group, or an alkylcarbamoyl group; and X represents a substituted or unsubstituted methine group, a silylidyne group, a germylidyne group, a stannylidyne group, a nitrogen atom, a phosphorus atom, an arsenic atom, or an antimony atom.

[3] An organic compound represented by the following general formula (3):

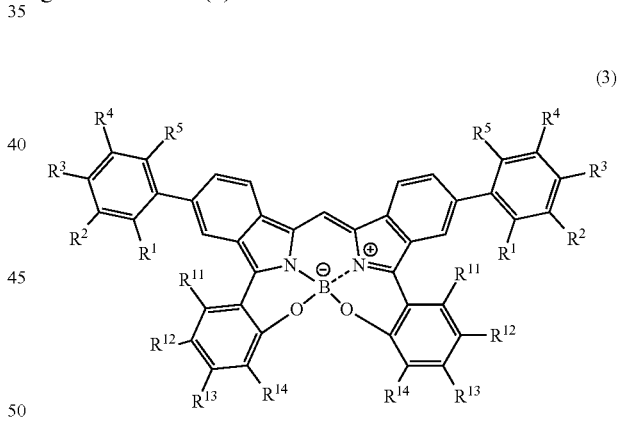

(3)

wherein $R^1$ to $R^5$ or $R^{11}$ to $R^{14}$ each independently represent a hydrogen atom, an aryl group, a heteroaryl group, an alkyl group, a cycloalkyl group, a halogen atom, a hydroxy group, an alkoxy group, a mercapto group, an alkylthio group, a nitro group, a substituted amino group, an amide group, an acyl group, a carboxyl group, an acyloxy group, a cyano group, a sulfo group, a sulfamoyl group, an alkylsulfamoyl group, a carbamoyl group, or an alkylcarbamoyl group.

[4] A near infrared absorbing dye comprising the organic compound according to any one of [1] to [3].

[5] An optical film using the organic compound according to any one of [1] to [3].

[6] An organic electronic device using the organic compound according to any one of [1] to [3].

[7] A photoelectric conversion element comprising a photoelectric conversion film comprising a compound represented by the following general formula (1):

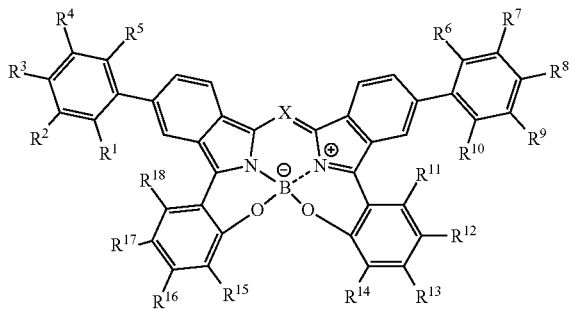

(1)

wherein $R^1$ to $R^{18}$ each independently represent a hydrogen atom, an aryl group, a heteroaryl group, an alkyl group, a cycloalkyl group, a halogen atom, a hydroxy group, an alkoxy group, a mercapto group, an alkylthio group, a nitro group, a substituted amino group, an amide group, an acyl group, a carboxyl group, an acyloxy group, a cyano group, a sulfo group, a sulfamoyl group, an alkylsulfamoyl group, a carbamoyl group, or an alkylcarbamoyl group; and X represents a substituted or unsubstituted methine group, a silylidyne group, a germylidyne group, a stannylidyne group, a nitrogen atom, a phosphorus atom, an arsenic atom, or an antimony atom.

[8] A light sensor comprising the photoelectric conversion element according to [7].

[9] An imaging element comprising the photoelectric conversion element according to [7].

[10] An image sensor comprising the photoelectric conversion element according to [7].

[11] A material for a photoelectric conversion element, comprising a compound represented by the following general formula (1):

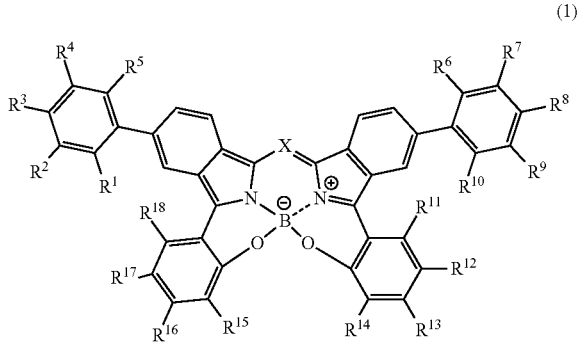

(1)

wherein $R^1$ to $R^{18}$ each independently represent a hydrogen atom, an aryl group, a heteroaryl group, an alkyl group, a cycloalkyl group, a halogen atom, a hydroxy group, an alkoxy group, a mercapto group, an alkylthio group, a nitro group, a substituted amino group, an amide group, an acyl group, a carboxyl group, an acyloxy group, a cyano group, a sulfo group, a sulfamoyl group, an alkylsulfamoyl group, a carbamoyl group, or an alkylcarbamoyl group; and X represents a substituted or unsubstituted methine group, a silylidyne group, a germylidyne group, a stannylidyne group, a nitrogen atom, a phosphorus atom, an arsenic atom, or an antimony atom.

Advantageous Effects of Invention

The organic compound of the present invention has an absorption band in the near infrared region, also has easy processability and high stability in the atmosphere, and is useful for near infrared absorbing dyes, optical films, photoelectric conversion elements, and further, for organic electronic devices.

In particular, since a photoelectric conversion element comprising the organic compound of the present invention has absorption properties in the near infrared region and excellent photoelectric conversion performance, it can be applied not only to organic imaging elements, but also to the field of devices such as a light sensor and an infrared sensor, and cameras, video cameras, infrared cameras, etc., in which the aforementioned devices are used.

BRIEF DESCRIPTION OF DRAWINGS

FIG. 1 shows a cross-sectional view of a thin film transistor.

FIG. 2 shows a flow chart of a method for producing a thin film transistor.

FIG. 3 shows a cross-sectional view of a photoelectric conversion element.

FIG. 4 shows an ultraviolet visible near infrared absorption spectrum of a thin film using Compound (1).

FIG. 5 shows an ultraviolet visible near infrared absorption spectrum of a thin film using Compound (296).

FIG. 6 shows an ultraviolet visible near infrared absorption spectrum of a thin film using Compound (581).

FIG. 7 shows an ultraviolet visible near infrared absorption spectrum of a thin film using Comparative Compound (A).

FIG. 8 shows a wavelength-absorbance graph of a thin film using Compound (1) in an elapsed time.

FIG. 9 shows a wavelength-absorbance graph of a thin film using KAYASORB CY-10 in an elapsed time.

FIG. 10 shows a wavelength-absorbance graph of a thin film using KAYASORB IR-820 in an elapsed time.

FIG. 11 shows current response characteristics of a photoelectric conversion element using Compound (1).

FIG. 12 shows a photoelectric conversion spectrum of a photoelectric conversion element using Compound (1).

FIG. 13 shows current response characteristics of a photoelectric conversion element using Compound (296).

FIG. 14 shows a photoelectric conversion spectrum of a photoelectric conversion element using Compound (296).

FIG. 15 shows current response characteristics of a photoelectric conversion element using Compound (581).

FIG. 16 shows a photoelectric conversion spectrum of a photoelectric conversion element using Compound (581).

FIG. 17 shows current response characteristics of a photoelectric conversion element using Comparative Compound (A).

FIG. 18 shows a photoelectric conversion spectrum of a photoelectric conversion element using Comparative Compound (A).

DESCRIPTION OF EMBODIMENTS

Hereinafter, the present invention will be described in detail.

The organic compound of the present invention has a structure represented by the following formula (1):

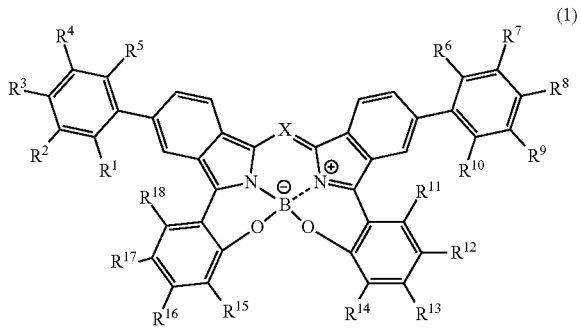

(1)

wherein $R^1$ to $R^{18}$ each independently represent a hydrogen atom, an aryl group, a heteroaryl group, an alkyl group, a cycloalkyl group, a halogen atom, a hydroxy group, an alkoxy group, a mercapto group, an alkylthio group, a nitro group, a substituted amino group, an amide group, an acyl group, a carboxyl group, an acyloxy group, a cyano group, a sulfo group, a sulfamoyl group, an alkylsulfamoyl group, a carbamoyl group, or an alkylcarbamoyl group; and X represents a substituted or unsubstituted methine group, a silylidyne group, a germylidyne group, a stannylidyne group, a nitrogen atom, a phosphorus atom, an arsenic atom, or an antimony atom.

In the general formula (1), examples of the aryl group include substituted or unsubstituted benzene, naphthalene, anthracene, phenanthrene, azulene, biphenyl, and terphenyl. Examples of the heteroaryl group include substituted or unsubstituted thiophene, furan, pyrrole, pyridine, indole, benzothiophene, and benzofuran. Examples of the alkyl group include a methyl group, an ethyl group, a propyl group, an isopropyl group, a normal butyl group, an isobutyl group, a tertiary butyl group, a pentyl group, a hexyl group, a heptyl group, an octyl group, a nonyl group, a decyl group, an undecyl group, and a dodecyl group. Examples of the cycloalkyl group include a cyclopentyl group and a cyclohexyl group. Examples of the halogen atom include a fluorine atom, a chlorine atom, a bromine atom, and an iodine atom. Examples of the alkoxy group include groups in which the above described alkyl group binds to an oxygen atom. Herein, the number of oxygen atoms, the position thereof, and the number of branches is not particularly limited.

Examples of the substituted amino group include amino groups, hydrogen atoms of which are substituted with the substituents represented by the above described $R^1$ to $R^{18}$. Examples of the acyl group include groups in which an aryl group or an alkyl group binds to a carbonyl group. Examples of the alkylsulfamoyl group include sulfamoyl groups, hydrogen atoms of which are substituted with the above described alkyl groups. Examples of the alkylcarbamoyl group include carbamoyl groups, hydrogen atoms of which are substituted with the above described alkyl groups.

From the viewpoint of easy processability, $R^1$ to $R^{10}$ are preferably a hydrogen atom, an alkoxy group, an aryl group and a heteroaryl group, more preferably a hydrogen atom, an alkoxy group and an aryl group, and particularly preferably a hydrogen atom, an alkoxy group containing 1 to 12 carbon atoms, and an aryl group containing 6 to 18 carbon atoms.

$R^{11}$ to $R^{18}$ are preferably a hydrogen atom, an aryl group, a heteroaryl group and an alkyl group, more preferably a hydrogen atom, an aryl group and an alkyl group, and particularly preferably a hydrogen atom, an aryl group containing 6 to 12 carbon atoms, and an alkyl group containing 1 to 12 carbon atoms. In the present description, the term "easy processability" means that an organic compound is soluble in a solvent and can be applied in the form of a solution, and that a film can be easily formed from the organic compound according to a physical deposition method such as vacuum deposition or sputtering.

Moreover, $R^1$ to $R^{18}$ each independently represent a substituent, and the substituents may be identical to or different from one another. From the viewpoint of easy production, $R^1$ and $R^{10}$, $R^2$ and $R^9$, $R^3$ and $R^8$, $R^4$ and $R^7$, $R^5$ and $R^6$, $R^{11}$ and $R^{18}$, $R^{12}$ and $R^{17}$, $R^{13}$ and $R^{16}$, and $R^{14}$ and $R^{15}$ each preferably represent the same substituents as each other.

Furthermore, at least one pair from $R^{11}$ and $R^{12}$, $R^{12}$ and $R^{13}$, $R^{13}$ and $R^{14}$, $R^{15}$ and $R^{16}$, $R^{16}$ and $R^{17}$, and $R^{17}$ and $R^{18}$ may bind to each other to form a cyclic structure.

X represents a substituted or unsubstituted methine group, a silylidyne group, a germylidyne group, a stannylidyne group, a nitrogen atom, a phosphorus atom, an arsenic atom, or an antimony atom. X is preferably an unsubstituted methane group or a nitrogen atom.

The organic compound of the present invention is represented by the following formula (2):

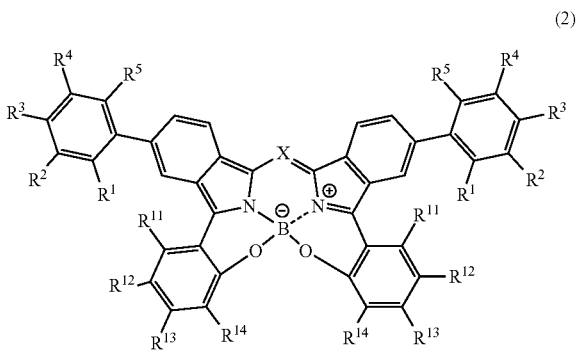

(2)

wherein $R^1$ to $R^5$ or $R^{11}$ to $R^{14}$ each independently represent a hydrogen atom, an aryl group, a heteroaryl group, an alkyl group, a cycloalkyl group, a halogen atom, a hydroxy group, an alkoxy group, a mercapto group, an alkylthio group, a nitro group, a substituted amino group, an amide group, an acyl group, a carboxyl group, an acyloxy group, a cyano group, a sulfa group, a sulfamoyl group, an alkylsulfamoyl group, a carbamoyl group, or an alkylcarbamoyl group; and X represents a substituted or unsubstituted methine group, a silylidyne group, a germylidyne group, a stannylidyne group, a nitrogen atom, a phosphorus atom, an arsenic atom, or an antimony atom.

Specific examples and preferred ranges of $R^1$ to $R^5$ or $R^{11}$ to $R^{14}$ and X in the general formula (2) are the same as those of $R^1$ to $R^{18}$ and X in the formula (1).

The organic compound of the present invention has a structure represented by the following formula (3):

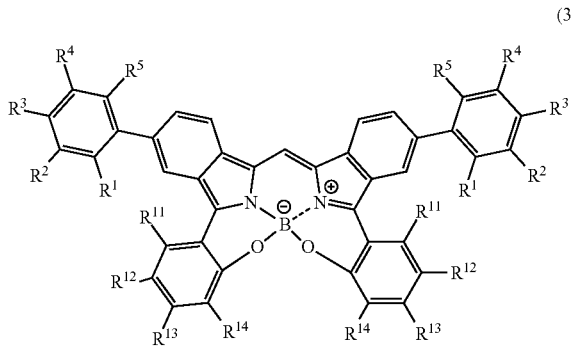

(3)

wherein $R^1$ to $R^5$ or $R^{11}$ to $R^{14}$ each independently represent a hydrogen atom, an aryl group, a heteroaryl group, an alkyl group, a cycloalkyl group, a halogen atom, a hydroxy group, an alkoxy group, a mercapto group, an alkylthio group, a nitro group, a substituted amino group, an amide group, an acyl group, a carboxyl group, an acyloxy group, a cyano group, a sulfo group, a sulfamoyl group, an alkylsulfamoyl group, a carbamoyl group, or an alkylcarbamoyl group.

Specific examples and preferred ranges of $R^1$ to $R^5$ or $R^{11}$ to $R^{14}$ in the general formula (3) are the same as those of $R^1$ to $R^{18}$ in the formula (1).

Specific examples of the compounds represented by the general formulas (1) to (3) will be shown below, but the organic compounds of the present invention are not limited thereto.

TABLE 1

| Compound | $R^1$ | $R^2$ | $R^3$ | $R^4$ | $R^5$ | $R^6$ | $R^7$ | $R^8$ | $R^9$ | $R^{10}$ | $R^{11}$ | $R^{12}$ | $R^{13}$ | $R^{14}$ | $R^{15}$ | $R^{16}$ | $R^{17}$ | $R^{18}$ | X |
|---|---|---|---|---|---|---|---|---|---|---|---|---|---|---|---|---|---|---|---|
| 1 | H | H | H | H | H | H | H | H | H | H | H | H | H | H | H | H | H | H | CH |
| 2 | OCH$_3$ | H | H | H | H | H | H | H | H | H | H | H | H | H | H | H | H | H | CH |
| 3 | OC$_2$H$_5$ | H | H | H | H | H | H | H | H | H | H | H | H | H | H | H | H | H | CH |
| 4 | OC$_3$H$_7$ | H | H | H | H | H | H | H | H | H | H | H | H | H | H | H | H | H | CH |
| 5 | OC$_4$H$_9$ | H | H | H | H | H | H | H | H | H | H | H | H | H | H | H | H | H | CH |
| 6 | OC$_6$H$_{13}$ | H | H | H | H | H | H | H | H | H | H | H | H | H | H | H | H | H | CH |
| 7 | OC$_8$H$_{17}$ | H | H | H | H | H | H | H | H | H | H | H | H | H | H | H | H | H | CH |
| 8 | OC$_{10}$H$_{21}$ | H | H | H | H | H | H | H | H | H | H | H | H | H | H | H | H | H | CH |
| 9 | OC$_{12}$H$_{25}$ | H | H | H | H | H | H | H | H | H | H | H | H | H | H | H | H | H | CH |
| 10 | H | OCH$_3$ | H | H | H | H | H | H | H | H | H | H | H | H | H | H | H | H | CH |
| 11 | H | OC$_2$H$_5$ | H | H | H | H | H | H | H | H | H | H | H | H | H | H | H | H | CH |
| 12 | H | OC$_3$H$_7$ | H | H | H | H | H | H | H | H | H | H | H | H | H | H | H | H | CH |
| 13 | H | OC$_4$H$_9$ | H | H | H | H | H | H | H | H | H | H | H | H | H | H | H | H | CH |
| 14 | H | OC$_6$H$_{13}$ | H | H | H | H | H | H | H | H | H | H | H | H | H | H | H | H | CH |
| 15 | H | OC$_8$H$_{17}$ | H | H | H | H | H | H | H | H | H | H | H | H | H | H | H | H | CH |
| 16 | H | OC$_{10}$H$_{21}$ | H | H | H | H | H | H | H | H | H | H | H | H | H | H | H | H | CH |
| 17 | H | OC$_{12}$H$_{25}$ | H | H | H | H | H | H | H | H | H | H | H | H | H | H | H | H | CH |
| 18 | H | H | OCH$_3$ | H | H | H | H | H | H | H | H | H | H | H | H | H | H | H | CH |
| 19 | H | H | OC$_2$H$_5$ | H | H | H | H | H | H | H | H | H | H | H | H | H | H | H | CH |
| 20 | H | H | OC$_3$H$_7$ | H | H | H | H | H | H | H | H | H | H | H | H | H | H | H | CH |
| 21 | H | H | OC$_4$H$_9$ | H | H | H | H | H | H | H | H | H | H | H | H | H | H | H | CH |
| 22 | H | H | OC$_6$H$_{13}$ | H | H | H | H | H | H | H | H | H | H | H | H | H | H | H | CH |
| 23 | H | H | OC$_8$H$_{17}$ | H | H | H | H | H | H | H | H | H | H | H | H | H | H | H | CH |
| 24 | H | H | OC$_{10}$H$_{21}$ | H | H | H | H | H | H | H | H | H | H | H | H | H | H | H | CH |
| 25 | H | H | OC$_{12}$H$_{25}$ | H | H | H | H | H | H | H | H | H | H | H | H | H | H | H | CH |
| 26 | ―C$_6$H$_5$ | H | H | H | H | H | H | H | H | H | H | H | H | H | H | H | H | H | CH |
| 27 | ―C$_6$H$_4$―CH$_3$ | H | H | H | H | H | H | H | H | H | H | H | H | H | H | H | H | H | CH |
| 28 | ―C$_6$H$_4$―C$_2$H$_5$ | H | H | H | H | H | H | H | H | H | H | H | H | H | H | H | H | H | CH |
| 29 | ―C$_6$H$_4$―C$_3$H$_7$ | H | H | H | H | H | H | H | H | H | H | H | H | H | H | H | H | H | CH |
| 30 | ―C$_6$H$_4$―C$_4$H$_9$ | H | H | H | H | H | H | H | H | H | H | H | H | H | H | H | H | H | CH |

TABLE 1-continued

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 31 | 4-C₆H₁₃-phenyl | H | H | H | H | H | H | H | H | H | H | H | H | H | H | H | H | H | CH |
| 32 | 4-C₈H₁₇-phenyl | H | H | H | H | H | H | H | H | H | H | H | H | H | H | H | H | H | CH |
| 33 | 4-C₁₀H₂₁-phenyl | H | H | H | H | H | H | H | H | H | H | H | H | H | H | H | H | H | CH |
| 34 | 4-C₁₂H₂₅-phenyl | H | H | H | H | H | H | H | H | H | H | H | H | H | H | H | H | H | CH |
| 35 | 4-biphenyl | H | H | H | H | H | H | H | H | H | H | H | H | H | H | H | H | H | CH |
| 36 | 2-naphthyl | H | H | H | H | H | H | H | H | H | H | H | H | H | H | H | H | H | CH |
| 37 | 1-naphthyl | H | H | H | H | H | H | H | H | H | H | H | H | H | H | H | H | H | CH |
| 38 | 2-pyrenyl | H | H | H | H | H | H | H | H | H | H | H | H | H | H | H | H | H | CH |
| 39 | 1-pyrenyl | H | H | H | H | H | H | H | H | H | H | H | H | H | H | H | H | H | CH |
| 40 | 2-anthracenyl | H | H | H | H | H | H | H | H | H | H | H | H | H | H | H | H | H | CH |

TABLE 2

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 41 | 9-anthracenyl | H | H | H | H | H | H | H | H | H | H | H | H | H | H | H | H | H | CH |
| 42 | 2-pyridyl | H | H | H | H | H | H | H | H | H | H | H | H | H | H | H | H | H | CH |
| 43 | 3-pyridyl | H | H | H | H | H | H | H | H | H | H | H | H | H | H | H | H | H | CH |
| 44 | 4-pyridyl | H | H | H | H | H | H | H | H | H | H | H | H | H | H | H | H | H | CH |
| 45 | H | phenyl | H | H | H | H | H | H | H | H | H | H | H | H | H | H | H | H | CH |
| 46 | H | 4-CH₃-C₆H₄ | H | H | H | H | H | H | H | H | H | H | H | H | H | H | H | H | CH |
| 47 | H | 4-C₂H₅-C₆H₄ | H | H | H | H | H | H | H | H | H | H | H | H | H | H | H | H | CH |
| 48 | H | 4-C₃H₇-C₆H₄ | H | H | H | H | H | H | H | H | H | H | H | H | H | H | H | H | CH |
| 49 | H | 4-C₄H₉-C₆H₄ | H | H | H | H | H | H | H | H | H | H | H | H | H | H | H | H | CH |
| 50 | H | 4-C₆H₁₃-C₆H₄ | H | H | H | H | H | H | H | H | H | H | H | H | H | H | H | H | CH |
| 51 | H | 4-C₈H₁₇-C₆H₄ | H | H | H | H | H | H | H | H | H | H | H | H | H | H | H | H | CH |
| 52 | H | 4-C₁₀H₂₁-C₆H₄ | H | H | H | H | H | H | H | H | H | H | H | H | H | H | H | H | CH |
| 53 | H | 4-C₁₂H₂₅-C₆H₄ | H | H | H | H | H | H | H | H | H | H | H | H | H | H | H | H | CH |
| 54 | H | 4-biphenyl | H | H | H | H | H | H | H | H | H | H | H | H | H | H | H | H | CH |
| 55 | H | 2-naphthyl | H | H | H | H | H | H | H | H | H | H | H | H | H | H | H | H | CH |

TABLE 2-continued

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 56 | H | 1-naphthyl | H | H | H | H | H | H | H | H | H | H | H | H | H | H | H | H | CH |
| 57 | H | 2-pyrenyl | H | H | H | H | H | H | H | H | H | H | H | H | H | H | H | H | CH |
| 58 | H | 1-pyrenyl | H | H | H | H | H | H | H | H | H | H | H | H | H | H | H | H | CH |
| 59 | H | 2-anthracenyl | H | H | H | H | H | H | H | H | H | H | H | H | H | H | H | H | CH |
| 60 | H | 9-anthracenyl | H | H | H | H | H | H | H | H | H | H | H | H | H | H | H | H | CH |
| 61 | H | 2-pyridyl | H | H | H | H | H | H | H | H | H | H | H | H | H | H | H | H | CH |
| 62 | H | 3-pyridyl | H | H | H | H | H | H | H | H | H | H | H | H | H | H | H | H | CH |
| 63 | H | 4-pyridyl | H | H | H | H | H | H | H | H | H | H | H | H | H | H | H | H | CH |
| 64 | H | H | phenyl | H | H | H | H | H | H | H | H | H | H | H | H | H | H | H | CH |

TABLE 3

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 65 | H | H | 4-methylphenyl | H | H | H | H | H | H | H | H | H | H | H | H | H | H | H | CH |
| 66 | H | H | 4-ethylphenyl (–C₂H₅) | H | H | H | H | H | H | H | H | H | H | H | H | H | H | H | CH |
| 67 | H | H | 4-propylphenyl (–C₃H₇) | H | H | H | H | H | H | H | H | H | H | H | H | H | H | H | CH |
| 68 | H | H | 4-butylphenyl (–C₄H₉) | H | H | H | H | H | H | H | H | H | H | H | H | H | H | H | CH |
| 69 | H | H | 4-hexylphenyl (–C₆H₁₃) | H | H | H | H | H | H | H | H | H | H | H | H | H | H | H | CH |
| 70 | H | H | 4-octylphenyl (–C₈H₁₇) | H | H | H | H | H | H | H | H | H | H | H | H | H | H | H | CH |
| 71 | H | H | 4-decylphenyl (–C₁₀H₂₁) | H | H | H | H | H | H | H | H | H | H | H | H | H | H | H | CH |
| 72 | H | H | 4-dodecylphenyl (–C₁₂H₂₅) | H | H | H | H | H | H | H | H | H | H | H | H | H | H | H | CH |
| 73 | H | H | 4-biphenylyl | H | H | H | H | H | H | H | H | H | H | H | H | H | H | H | CH |
| 74 | H | H | 2-naphthyl | H | H | H | H | H | H | H | H | H | H | H | H | H | H | H | CH |
| 75 | H | H | 1-naphthyl | H | H | H | H | H | H | H | H | H | H | H | H | H | H | H | CH |
| 76 | H | H | pyrenyl | H | H | H | H | H | H | H | H | H | H | H | H | H | H | H | CH |

TABLE 3-continued

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 77 | H | H | 1-pyrenyl | H | H | H | H | H | H | H | H | H | H | H | H | H | H | H | CH |
| 78 | H | H | 2-anthracenyl | H | H | H | H | H | H | H | H | H | H | H | H | H | H | H | CH |
| 79 | H | H | 9-anthracenyl | H | H | H | H | H | H | H | H | H | H | H | H | H | H | H | CH |
| 80 | H | H | 2-pyridyl | H | H | H | H | H | H | H | H | H | H | H | H | H | H | H | CH |
| 81 | H | H | 3-pyridyl | H | H | H | H | H | H | H | H | H | H | H | H | H | H | H | CH |
| 82 | H | H | 4-pyridyl | H | H | H | H | H | H | H | H | H | H | H | H | H | H | H | CH |

TABLE 4

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 83 | H | H | H | H | H | H | H | H | H | H | H | H | H | H | H | H | H | H | N |
| 84 | $OCH_3$ | H | H | H | H | H | H | H | H | H | H | H | H | H | H | H | H | H | N |
| 85 | $OC_2H_5$ | H | H | H | H | H | H | H | H | H | H | H | H | H | H | H | H | H | N |
| 86 | $OC_3H_7$ | H | H | H | H | H | H | H | H | H | H | H | H | H | H | H | H | H | N |
| 87 | $OC_4H_9$ | H | H | H | H | H | H | H | H | H | H | H | H | H | H | H | H | H | N |
| 88 | $OC_6H_{13}$ | H | H | H | H | H | H | H | H | H | H | H | H | H | H | H | H | H | N |
| 89 | $OC_8H_{17}$ | H | H | H | H | H | H | H | H | H | H | H | H | H | H | H | H | H | N |
| 90 | $OC_{10}H_{21}$ | H | H | H | H | H | H | H | H | H | H | H | H | H | H | H | H | H | N |
| 91 | $OC_{12}H_{25}$ | H | H | H | H | H | H | H | H | H | H | H | H | H | H | H | H | H | N |
| 92 | H | $OCH_3$ | H | H | H | H | H | H | H | H | H | H | H | H | H | H | H | H | N |
| 93 | H | $OC_2H_5$ | H | H | H | H | H | H | H | H | H | H | H | H | H | H | H | H | N |
| 94 | H | $OC_3H_7$ | H | H | H | H | H | H | H | H | H | H | H | H | H | H | H | H | N |
| 95 | H | $OC_4H_8$ | H | H | H | H | H | H | H | H | H | H | H | H | H | H | H | H | N |
| 96 | H | $OC_6H_{13}$ | H | H | H | H | H | H | H | H | H | H | H | H | H | H | H | H | N |
| 97 | H | $OC_8H_{17}$ | H | H | H | H | H | H | H | H | H | H | H | H | H | H | H | H | N |
| 98 | H | $OC_{10}H_{21}$ | H | H | H | H | H | H | H | H | H | H | H | H | H | H | H | H | N |
| 99 | H | $OC_{12}H_{25}$ | H | H | H | H | H | H | H | H | H | H | H | H | H | H | H | H | N |
| 100 | H | H | $OCH_3$ | H | H | H | H | H | H | H | H | H | H | H | H | H | H | H | N |
| 101 | H | H | $OC_2H_5$ | H | H | H | H | H | H | H | H | H | H | H | H | H | H | H | N |
| 102 | H | H | $OC_3H_7$ | H | H | H | H | H | H | H | H | H | H | H | H | H | H | H | N |
| 103 | H | H | $OC_4H_9$ | H | H | H | H | H | H | H | H | H | H | H | H | H | H | H | N |
| 104 | H | H | $OC_6H_{13}$ | H | H | H | H | H | H | H | H | H | H | H | H | H | H | H | N |
| 105 | H | H | $OC_8H_{17}$ | H | H | H | H | H | H | H | H | H | H | H | H | H | H | H | N |
| 106 | H | H | $OC_{10}H_{21}$ | H | H | H | H | H | H | H | H | H | H | H | H | H | H | H | N |

TABLE 4-continued

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 107 | H | H | OC₁₂H₂₅ | H | H | H | H | H | H | H | H | H | H | H | H | H | H | H | N |
| 108 | phenyl | H | H | H | H | H | H | H | H | H | H | H | H | H | H | H | H | H | N |
| 109 | 4-methylphenyl | H | H | H | H | H | H | H | H | H | H | H | H | H | H | H | H | H | N |
| 110 | 4-C₂H₅-phenyl | H | H | H | H | H | H | H | H | H | H | H | H | H | H | H | H | H | N |
| 111 | 4-C₃H₇-phenyl | H | H | H | H | H | H | H | H | H | H | H | H | H | H | H | H | H | N |
| 112 | 4-C₄H₉-phenyl | H | H | H | H | H | H | H | H | H | H | H | H | H | H | H | H | H | N |
| 113 | 4-C₆H₁₃-phenyl | H | H | H | H | H | H | H | H | H | H | H | H | H | H | H | H | H | N |
| 114 | 4-C₈H₁₇-phenyl | H | H | H | H | H | H | H | H | H | H | H | H | H | H | H | H | H | N |
| 115 | 4-C₁₀H₂₁-phenyl | H | H | H | H | H | H | H | H | H | H | H | H | H | H | H | H | H | N |
| 116 | 4-C₁₂H₂₅-phenyl | H | H | H | H | H | H | H | H | H | H | H | H | H | H | H | H | H | N |
| 117 | biphenyl | H | H | H | H | H | H | H | H | H | H | H | H | H | H | H | H | H | N |
| 118 | 2-naphthyl | H | H | H | H | H | H | H | H | H | H | H | H | H | H | H | H | H | N |
| 119 | 1-naphthyl | H | H | H | H | H | H | H | H | H | H | H | H | H | H | H | H | H | N |

TABLE 4-continued

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 120 | pyrenyl | H | H | H | H | H | H | H | H | H | H | H | H | H | H | H | H | H | H | N |
| 121 | pyrenyl | H | H | H | H | H | H | H | H | H | H | H | H | H | H | H | H | H | H | N |
| 122 | anthracenyl | H | H | H | H | H | H | H | H | H | H | H | H | H | H | H | H | H | H | N |

TABLE 5

| | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 123 | anthracenyl | H | H | H | H | H | H | H | H | H | H | H | H | H | H | H | H | H | H | N |
| 124 | 2-pyridyl | H | H | H | H | H | H | H | H | H | H | H | H | H | H | H | H | H | H | N |
| 125 | 3-pyridyl | H | H | H | H | H | H | H | H | H | H | H | H | H | H | H | H | H | H | N |
| 126 | 4-pyridyl | H | H | H | H | H | H | H | H | H | H | H | H | H | H | H | H | H | H | N |
| 127 | H | phenyl | H | H | H | H | H | H | H | H | H | H | H | H | H | H | H | H | H | N |
| 128 | H | 4-CH₃-phenyl | H | H | H | H | H | H | H | H | H | H | H | H | H | H | H | H | H | N |
| 129 | H | 4-C₂H₅-phenyl | H | H | H | H | H | H | H | H | H | H | H | H | H | H | H | H | H | N |
| 130 | H | 4-C₃H₇-phenyl | H | H | H | H | H | H | H | H | H | H | H | H | H | H | H | H | H | N |

TABLE 5-continued

| | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 131 | H | 4-C₄H₉-phenyl | H | H | H | H | H | H | H | H | H | H | H | H | H | H | H | H | N |
| 132 | H | 4-C₆H₁₃-phenyl | H | H | H | H | H | H | H | H | H | H | H | H | H | H | H | H | N |
| 133 | H | 4-C₈H₁₇-phenyl | H | H | H | H | H | H | H | H | H | H | H | H | H | H | H | H | N |
| 134 | H | 4-C₁₀H₂₁-phenyl | H | H | H | H | H | H | H | H | H | H | H | H | H | H | H | H | N |
| 135 | H | 4-C₁₂H₂₅-phenyl | H | H | H | H | H | H | H | H | H | H | H | H | H | H | H | H | N |
| 136 | H | biphenyl | H | H | H | H | H | H | H | H | H | H | H | H | H | H | H | H | N |
| 137 | H | 2-naphthyl | H | H | H | H | H | H | H | H | H | H | H | H | H | H | H | H | N |
| 138 | H | 1-naphthyl | H | H | H | H | H | H | H | H | H | H | H | H | H | H | H | H | N |
| 139 | H | 2-pyrenyl | H | H | H | H | H | H | H | H | H | H | H | H | H | H | H | H | N |
| 140 | H | 1-pyrenyl | H | H | H | H | H | H | H | H | H | H | H | H | H | H | H | H | N |
| 141 | H | 2-anthracenyl | H | H | H | H | H | H | H | H | H | H | H | H | H | H | H | H | N |
| 142 | H | 9-anthracenyl | H | H | H | H | H | H | H | H | H | H | H | H | H | H | H | H | N |

TABLE 5-continued

| | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 143 | H | 2-pyridyl | H | H | H | H | H | H | H | H | H | H | H | H | H | H | H | H | N |
| 144 | H | 3-pyridyl | H | H | H | H | H | H | H | H | H | H | H | H | H | H | H | H | N |
| 145 | H | 4-pyridyl | H | H | H | H | H | H | H | H | H | H | H | H | H | H | H | H | N |
| 146 | H | H | phenyl | H | H | H | H | H | H | H | H | H | H | H | H | H | H | H | N |

TABLE 6

| | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 147 | H | H | 4-CH₃-C₆H₄ | H | H | H | H | H | H | H | H | H | H | H | H | H | H | H | N |
| 148 | H | H | 4-C₂H₅-C₆H₄ | H | H | H | H | H | H | H | H | H | H | H | H | H | H | H | N |
| 149 | H | H | 4-C₃H₇-C₆H₄ | H | H | H | H | H | H | H | H | H | H | H | H | H | H | H | N |
| 150 | H | H | 4-C₄H₉-C₆H₄ | H | H | H | H | H | H | H | H | H | H | H | H | H | H | H | N |
| 151 | H | H | 4-C₆H₁₃-C₆H₄ | H | H | H | H | H | H | H | H | H | H | H | H | H | H | H | N |
| 152 | H | H | 4-C₈H₁₇-C₆H₄ | H | H | H | H | H | H | H | H | H | H | H | H | H | H | H | N |
| 153 | H | H | 4-C₁₀H₂₁-C₆H₄ | H | H | H | H | H | H | H | H | H | H | H | H | H | H | H | N |
| 154 | H | H | 4-C₁₂H₂₅-C₆H₄ | H | H | H | H | H | H | H | H | H | H | H | H | H | H | H | N |
| 155 | H | H | 4-biphenyl | H | H | H | H | H | H | H | H | H | H | H | H | H | H | H | N |

TABLE 6-continued

| | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|----|----|----|----|----|----|----|----|----|-----|-----|-----|-----|-----|-----|-----|-----|-----|---|
| 156 | H | H | 2-naphthyl | H | H | H | H | H | H | H | H | H | H | H | H | H | H | H | N |
| 157 | H | H | 1-naphthyl | H | H | H | H | H | H | H | H | H | H | H | H | H | H | H | N |
| 158 | H | H | 2-pyrenyl | H | H | H | H | H | H | H | H | H | H | H | H | H | H | H | N |
| 159 | H | H | 1-pyrenyl | H | H | H | H | H | H | H | H | H | H | H | H | H | H | H | N |
| 160 | H | H | 2-anthracenyl | H | H | H | H | H | H | H | H | H | H | H | H | H | H | H | N |
| 161 | H | H | 9-anthracenyl | H | H | H | H | H | H | H | H | H | H | H | H | H | H | H | N |
| 162 | H | H | 2-pyridyl | H | H | H | H | H | H | H | H | H | H | H | H | H | H | H | N |
| 163 | H | H | 3-pyridyl | H | H | H | H | H | H | H | H | H | H | H | H | H | H | H | N |
| 164 | H | H | 4-pyridyl | H | H | H | H | H | H | H | H | H | H | H | H | H | H | H | N |

TABLE 7

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 165 | H | H | 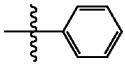 | H | H | H | H | H | H | H | CH₃ | H | H | H | H | H | H | CH₃ | CH |
| 166 | H | H | 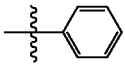 | H | H | H | H | H | H | H | C₂H₅ | H | H | H | H | H | H | C₂H₅ | CH |
| 167 | H | H | 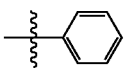 | H | H | H | H | H | H | H | C₃H₇ | H | H | H | H | H | H | C₃H₇ | CH |
| 168 | H | H | 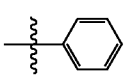 | H | H | H | H | H | H | H | C₄H₉ | H | H | H | H | H | H | C₄H₉ | CH |
| 169 | H | H | 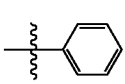 | H | H | H | H | H | H | H | C₆H₁₃ | H | H | H | H | H | H | C₆H₁₃ | CH |
| 170 | H | H | 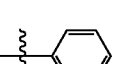 | H | H | H | H | H | H | H | C₈H₁₇ | H | H | H | H | H | H | C₈H₁₇ | CH |
| 171 | H | H | 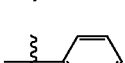 | H | H | H | H | H | H | H | C₁₀H₂₁ | H | H | H | H | H | H | C₁₀H₂₁ | CH |
| 172 | H | H | 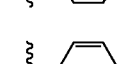 | H | H | H | H | H | H | H | C₁₂H₂₅ | H | H | H | H | H | H | C₁₂H₂₅ | CH |
| 173 | H | H | 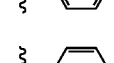 | H | H | H | H | H | H | H | H | CH₃ | H | H | H | H | CH₃ | H | CH |
| 174 | H | H | 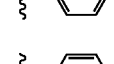 | H | H | H | H | H | H | H | H | C₂H₅ | H | H | H | H | C₂H₅ | H | CH |
| 175 | H | H | 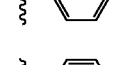 | H | H | H | H | H | H | H | H | C₃H₇ | H | H | H | H | C₃H₇ | H | CH |
| 176 | H | H | 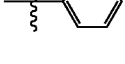 | H | H | H | H | H | H | H | H | C₄H₉ | H | H | H | H | C₄H₉ | H | CH |
| 177 | H | H | 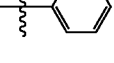 | H | H | H | H | H | H | H | H | C₆H₁₃ | H | H | H | H | C₆H₁₃ | H | CH |
| 178 | H | H | 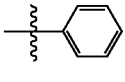 | H | H | H | H | H | H | H | H | C₈H₁₇ | H | H | H | H | C₈H₁₇ | H | CH |
| 179 | H | H | 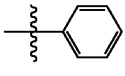 | H | H | H | H | H | H | H | H | C₁₀H₂₁ | H | H | H | H | C₁₀H₂₁ | H | CH |
| 180 | H | H | 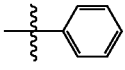 | H | H | H | H | H | H | H | H | C₁₂H₂₅ | H | H | H | H | C₁₂H₂₅ | H | CH |
| 181 | H | H | 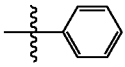 | H | H | H | H | H | H | H | H | H | CH₃ | H | CH₃ | H | H | H | CH |
| 182 | H | H | 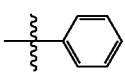 | H | H | H | H | H | H | H | H | H | C₂H₅ | H | C₂H₅ | H | H | H | CH |

TABLE 7-continued

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 183 | H | H | 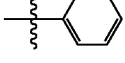 | H | H | H | H | H | H | H | H | H | $C_3H_7$ | H | H | $C_3H_7$ | H | H | CH |
| 184 | H | H | 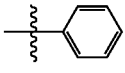 | H | H | H | H | H | H | H | H | H | $C_4H_9$ | H | H | $C_4H_9$ | H | H | CH |
| 185 | H | H | 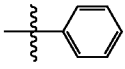 | H | H | H | H | H | H | H | H | H | $C_6H_{13}$ | H | H | $C_6H_{13}$ | H | H | CH |
| 186 | H | H | 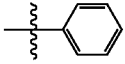 | H | H | H | H | H | H | H | H | H | $C_8H_{17}$ | H | H | $C_8H_{17}$ | H | H | CH |
| 187 | H | H | 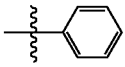 | H | H | H | H | H | H | H | H | H | $C_{10}H_{21}$ | H | H | $C_{10}H_{21}$ | H | H | CH |
| 188 | H | H | 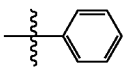 | H | H | H | H | H | H | H | H | H | $C_{12}H_{25}$ | H | H | $C_{12}H_{25}$ | H | H | CH |
| 189 | H | H | 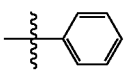 | H | H | H | H | H | H | H | H | H | H | $CH_3$ | $CH_3$ | H | H | H | CH |
| 190 | H | H | 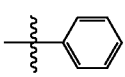 | H | H | H | H | H | H | H | H | H | H | $C_2H_5$ | $C_2H_5$ | H | H | H | CH |
| 191 | H | H | 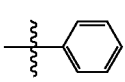 | H | H | H | H | H | H | H | H | H | H | $C_3H_7$ | $C_3H_7$ | H | H | H | CH |
| 192 | H | H | 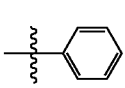 | H | H | H | H | H | H | H | H | H | H | $C_4H_9$ | $C_4H_9$ | H | H | H | CH |
| 193 | H | H | 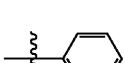 | H | H | H | H | H | H | H | H | H | H | $C_6H_{13}$ | $C_6H_{13}$ | H | H | H | CH |
| 194 | H | H | 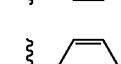 | H | H | H | H | H | H | H | H | H | H | $C_8H_{17}$ | $C_8H_{17}$ | H | H | H | CH |
| 195 | H | H | 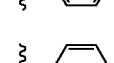 | H | H | H | H | H | H | H | H | H | H | $C_{10}H_{21}$ | $C_{10}H_{21}$ | H | H | H | CH |
| 196 | H | H | 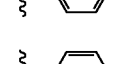 | H | H | H | H | H | H | H | H | H | H | $C_{12}H_{25}$ | $C_{12}H_{25}$ | H | H | H | CH |

TABLE 8

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 197 | H | H |  | H | H | H | H | H | H | H | $CH_3$ | H | H | H | H | H | H | $CH_3$ | N |
| 198 | H | H | 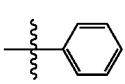 | H | H | H | H | H | H | H | $C_2H_5$ | H | H | H | H | H | H | $C_2H_5$ | N |
| 199 | H | H | 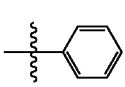 | H | H | H | H | H | H | H | $C_3H_7$ | H | H | H | H | H | H | $C_3H_7$ | N |

TABLE 8-continued

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 200 | H | H | 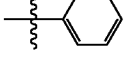 | H | H | H | H | H | H | H | $C_4H_9$ | H | H | H | H | H | H | $C_4H_9$ | N |
| 201 | H | H | 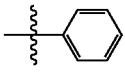 | H | H | H | H | H | H | H | $C_6H_{13}$ | H | H | H | H | H | H | $C_6H_{13}$ | N |
| 202 | H | H | 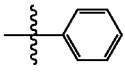 | H | H | H | H | H | H | H | $C_8H_{17}$ | H | H | H | H | H | H | $C_8H_{17}$ | N |
| 203 | H | H | 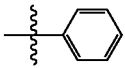 | H | H | H | H | H | H | H | $C_{10}H_{21}$ | H | H | H | H | H | H | $C_{10}H_{21}$ | N |
| 204 | H | H | 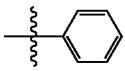 | H | H | H | H | H | H | H | $C_{12}H_{25}$ | H | H | H | H | H | H | $C_{12}H_{25}$ | N |
| 205 | H | H | 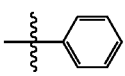 | H | H | H | H | H | H | H | H | $CH_3$ | H | H | H | H | $CH_3$ | H | N |
| 206 | H | H | 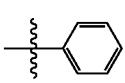 | H | H | H | H | H | H | H | H | $C_2H_5$ | H | H | H | H | $C_2H_5$ | H | N |
| 207 | H | H | 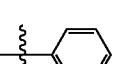 | H | H | H | H | H | H | H | H | $C_3H_7$ | H | H | H | H | $C_3H_7$ | H | N |
| 208 | H | H | 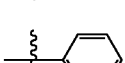 | H | H | H | H | H | H | H | H | $C_4H_9$ | H | H | H | H | $C_4H_9$ | H | N |
| 209 | H | H | 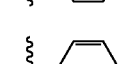 | H | H | H | H | H | H | H | H | $C_6H_{13}$ | H | H | H | H | $C_6H_{13}$ | H | N |
| 210 | H | H | 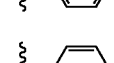 | H | H | H | H | H | H | H | H | $C_8H_{17}$ | H | H | H | H | $C_8H_{17}$ | H | N |
| 211 | H | H | 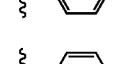 | H | H | H | H | H | H | H | H | $C_{10}H_{21}$ | H | H | H | H | $C_{10}H_{21}$ | H | N |
| 212 | H | H | 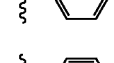 | H | H | H | H | H | H | H | H | $C_{12}H_{25}$ | H | H | H | H | $C_{12}H_{25}$ | H | N |
| 213 | H | H | 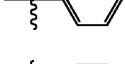 | H | H | H | H | H | H | H | H | H | $CH_3$ | H | H | $CH_3$ | H | H | N |
| 214 | H | H | 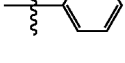 | H | H | H | H | H | H | H | H | H | $C_2H_5$ | H | H | $C_2H_5$ | H | H | N |
| 215 | H | H | 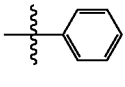 | H | H | H | H | H | H | H | H | H | $C_3H_7$ | H | H | $C_3H_7$ | H | H | N |
| 216 | H | H | 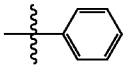 | H | H | H | H | H | H | H | H | H | $C_4H_9$ | H | H | $C_4H_9$ | H | H | N |
| 217 | H | H | 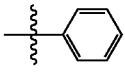 | H | H | H | H | H | H | H | H | H | $C_6H_{13}$ | H | H | $C_6H_{13}$ | H | H | N |

TABLE 8-continued

| Compound | R¹ | R² | R³ | R⁴ | R⁵ | R⁶ | R⁷ | R⁸ | R⁹ | R¹⁰ | R¹¹ | R¹² | R¹³ | R¹⁴ | R¹⁵ | R¹⁶ | R¹⁷ | R¹⁸ | X |
|---|---|---|---|---|---|---|---|---|---|---|---|---|---|---|---|---|---|---|---|
| 218 | H | H | —CH₂—C₆H₅ | H | H | H | H | H | H | H | H | H | $C_8H_{17}$ | H | H | $C_8H_{17}$ | H | H | N |
| 219 | H | H | —CH₂—C₆H₅ | H | H | H | H | H | H | H | H | H | $C_{10}H_{21}$ | H | H | $C_{10}H_{21}$ | H | H | N |
| 220 | H | H | —CH₂—C₆H₅ | H | H | H | H | H | H | H | H | H | $C_{12}H_{25}$ | H | H | $C_{12}H_{25}$ | H | H | N |
| 221 | H | H | —CH₂—C₆H₅ | H | H | H | H | H | H | H | H | H | H | $CH_3$ | $CH_3$ | H | H | H | N |
| 222 | H | H | —CH₂—C₆H₅ | H | H | H | H | H | H | H | H | H | H | $C_2H_5$ | $C_2H_5$ | H | H | H | N |
| 223 | H | H | —CH₂—C₆H₅ | H | H | H | H | H | H | H | H | H | H | $C_3H_7$ | $C_3H_7$ | H | H | H | N |
| 224 | H | H | —CH₂—C₆H₅ | H | H | H | H | H | H | H | H | H | H | $C_4H_9$ | $C_4H_9$ | H | H | H | N |
| 225 | H | H | —CH₂—C₆H₅ | H | H | H | H | H | H | H | H | H | H | $C_6H_{13}$ | $C_6H_{13}$ | H | H | H | N |
| 226 | H | H | —CH₂—C₆H₅ | H | H | H | H | H | H | H | H | H | H | $C_8H_{17}$ | $C_8H_{17}$ | H | H | H | N |
| 227 | H | H | —CH₂—C₆H₅ | H | H | H | H | H | H | H | H | H | H | $C_{10}H_{21}$ | $C_{10}H_{21}$ | H | H | H | N |
| 228 | H | H | —CH₂—C₆H₅ | H | H | H | H | H | H | H | H | H | H | $C_{12}H_{25}$ | $C_{12}H_{25}$ | H | H | H | N |

Specific examples of the compound represented by the general formula (2) will be shown below, but the organic compounds of the present invention are not limited thereto.

TABLE 9

| Compound | R¹ | R² | R³ | R⁴ | R⁵ | R¹¹ | R¹² | R¹³ | R¹⁴ | X |
|---|---|---|---|---|---|---|---|---|---|---|
| 229 | $OCH_3$ | H | H | H | H | H | H | H | H | CH |
| 230 | $OC_2H_5$ | H | H | H | H | H | H | H | H | CH |
| 231 | $OC_3H_7$ | H | H | H | H | H | H | H | H | CH |
| 232 | $OC_4H_9$ | H | H | H | H | H | H | H | H | CH |
| 233 | $OC_6H_{13}$ | H | H | H | H | H | H | H | H | CH |
| 234 | $OC_8H_{17}$ | H | H | H | H | H | H | H | H | CH |
| 235 | $OC_{10}H_{21}$ | H | H | H | H | H | H | H | H | CH |
| 236 | $OC_{12}H_{25}$ | H | H | H | H | H | H | H | H | CH |
| 237 | H | $OCH_3$ | H | H | H | H | H | H | H | CH |
| 238 | H | $OC_2H_5$ | H | H | H | H | H | H | H | CH |
| 239 | H | $OC_3H_7$ | H | H | H | H | H | H | H | CH |
| 240 | H | $OC_4H_9$ | H | H | H | H | H | H | H | CH |
| 241 | H | $OC_6H_{13}$ | H | H | H | H | H | H | H | CH |
| 242 | H | $OC_8H_{17}$ | H | H | H | H | H | H | H | CH |
| 243 | H | $OC_{10}H_{21}$ | H | H | H | H | H | H | H | CH |
| 244 | H | $OC_{12}H_{25}$ | H | H | H | H | H | H | H | CH |
| 245 | H | H | $OCH_3$ | H | H | H | H | H | H | CH |
| 246 | H | H | $OC_2H_5$ | H | H | H | H | H | H | CH |
| 247 | H | H | $OC_3H_7$ | H | H | H | H | H | H | CH |
| 248 | H | H | $OC_4H_9$ | H | H | H | H | H | H | CH |
| 249 | H | H | $OC_6H_{13}$ | H | H | H | H | H | H | CH |

TABLE 9-continued
| Compound | R¹ | R² | R³ | R⁴ | R⁵ | R¹¹ | R¹² | R¹³ | R¹⁴ | X |
|---|---|---|---|---|---|---|---|---|---|---|
| 250 | H | H | OC$_8$H$_{17}$ | H | H | H | H | H | H | CH |
| 251 | H | H | OC$_{10}$H$_{21}$ | H | H | H | H | H | H | CH |
| 252 | H | H | OC$_{12}$H$_{25}$ | H | H | H | H | H | H | CH |
| 253 | 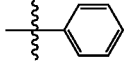 | H | H | H | H | H | H | H | H | CH |
| 254 | 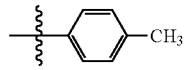 | H | H | H | H | H | H | H | H | CH |
| 255 | 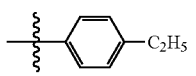 | H | H | H | H | H | H | H | H | CH |
| 256 | 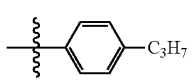 | H | H | H | H | H | H | H | H | CH |
| 257 | 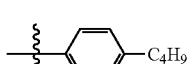 | H | H | H | H | H | H | H | H | CH |
| 258 | 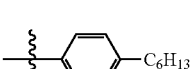 | H | H | H | H | H | H | H | H | CH |
| 259 |  | H | H | H | H | H | H | H | H | CH |
| 260 |  | H | H | H | H | H | H | H | H | CH |
| 261 | 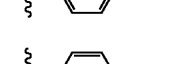 | H | H | H | H | H | H | H | H | CH |
| 262 | 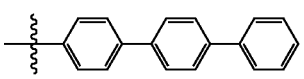 | H | H | H | H | H | H | H | H | CH |
| 263 | 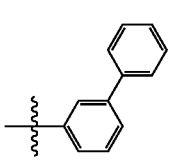 | H | H | H | H | H | H | H | H | CH |
| 264 | 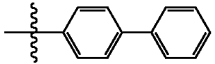 | H | H | H | H | H | H | H | H | CH |
| 265 | 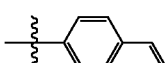 | H | H | H | H | H | H | H | H | CH |
| 266 | 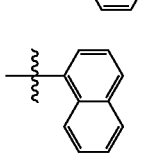 | H | H | H | H | H | H | H | H | CH |
| 267 |  | H | H | H | H | H | H | H | H | CH |

TABLE 10

| Compound | R¹ | R² | R³ | R⁴ | R⁵ | R¹¹ | R¹² | R¹³ | R¹⁴ | X |
|---|---|---|---|---|---|---|---|---|---|---|
| 268 | pyrenyl | H | H | H | H | H | H | H | H | CH |
| 269 | anthracen-2-yl | H | H | H | H | H | H | H | H | CH |
| 270 | H | phenyl | H | phenyl | H | H | H | H | H | CH |
| 271 | anthracen-9-yl | H | H | H | H | H | H | H | H | CH |
| 272 | pyridin-2-yl | H | H | H | H | H | H | H | H | CH |
| 273 | pyridin-3-yl | H | H | H | H | H | H | H | H | CH |
| 274 | pyridin-4-yl | H | H | H | H | H | H | H | H | CH |
| 275 | H | phenyl | H | H | H | H | H | H | H | CH |
| 276 | H | 4-CH₃-C₆H₄ | H | H | H | H | H | H | H | CH |
| 277 | H | 4-C₂H₅-C₆H₄ | H | H | H | H | H | H | H | CH |
| 278 | H | 4-C₃H₇-C₆H₄ | H | H | H | H | H | H | H | CH |
| 279 | H | 4-C₄H₉-C₆H₄ | H | H | H | H | H | H | H | CH |
| 280 | H | 4-C₆H₁₃-C₆H₄ | H | H | H | H | H | H | H | CH |
| 281 | H | 4-C₁₂H₂₆-C₆H₄ | H | H | H | H | H | H | H | CH |
| 282 | H | 4-C₁₀H₂₁-C₆H₄ | H | H | H | H | H | H | H | CH |
| 283 | H | 4-C₁₂H₂₅-C₆H₄ | H | H | H | H | H | H | H | CH |

TABLE 10-continued

| Compound | R¹ | R² | R³ | R⁴ | R⁵ | R¹¹ | R¹² | R¹³ | R¹⁴ | X |
|---|---|---|---|---|---|---|---|---|---|---|
| 284 | H | biphenyl-4-yl | H | H | H | H | H | H | H | CH |
| 285 | H | p-terphenyl-4-yl | H | H | H | H | H | H | H | CH |
| 286 | H | biphenyl-3-yl | H | H | H | H | H | H | H | CH |
| 287 | H | naphthalen-2-yl | H | H | H | H | H | H | H | CH |
| 288 | H | naphthalen-1-yl | H | H | H | H | H | H | H | CH |
| 289 | H | pyren-2-yl | H | H | H | H | H | H | H | CH |
| 290 | H | pyren-1-yl | H | H | H | H | H | H | H | CH |
| 291 | H | anthracen-2-yl | H | H | H | H | H | H | H | CH |
| 292 | H | anthracen-9-yl | H | H | H | H | H | H | H | CH |

TABLE 11

| Compound | R¹ | R² | R³ | R⁴ | R⁵ | R¹¹ | R¹² | R¹³ | R¹⁴ | X |
|---|---|---|---|---|---|---|---|---|---|---|
| 293 | H | pyridin-2-yl | H | H | H | H | H | H | H | CH |
| 294 | H | pyridin-3-yl | H | H | H | H | H | H | H | CH |

TABLE 11-continued
| Compound | R¹ | R² | R³ | R⁴ | R⁵ | R¹¹ | R¹² | R¹³ | R¹⁴ | X |
|---|---|---|---|---|---|---|---|---|---|---|
| 295 | H | 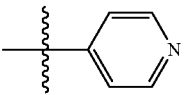 [SMILES: *c1ccncc1] | H | H | H | H | H | H | H | CH |
| 296 | H | H | 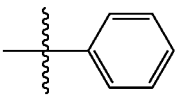 | H | H | H | H | H | H | CH |
| 297 | H | H | 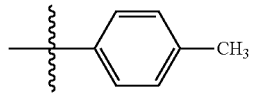 [SMILES: *c1ccc(C)cc1] | H | H | H | H | H | H | CH |
| 298 | H | H | 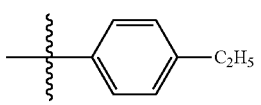 | H | H | H | H | H | H | CH |
| 299 | H | H | 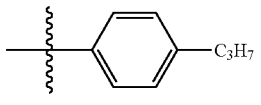 | H | H | H | H | H | H | CH |
| 300 | H | H | 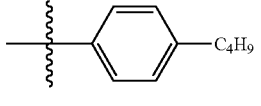 | H | H | H | H | H | H | CH |
| 301 | H | H | 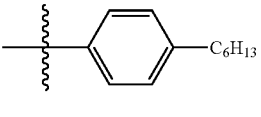 | H | H | H | H | H | H | CH |
| 302 | H | H | 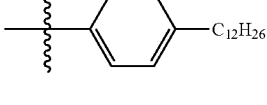 | H | H | H | H | H | H | CH |
| 303 | H | H | 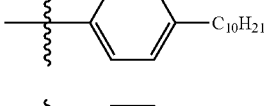 | H | H | H | H | H | H | CH |
| 304 | H | H | 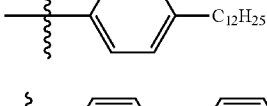 | H | H | H | H | H | H | CH |
| 305 | H | H | 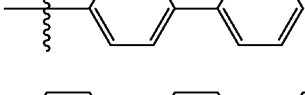 | H | H | H | H | H | H | CH |
| 306 | H | H | 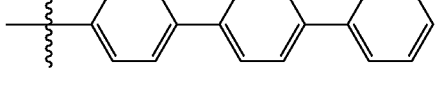 | H | H | H | H | H | H | CH |
| 307 | H | H | 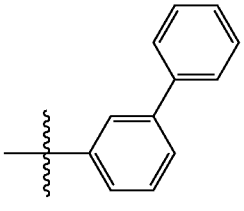 | H | H | H | H | H | H | CH |

TABLE 11-continued
| Compound | R¹ | R² | R³ | R⁴ | R⁵ | R¹¹ | R¹² | R¹³ | R¹⁴ | X |
|---|---|---|---|---|---|---|---|---|---|---|
| 308 | H | H | 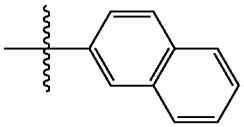 [SMILES: *c1ccc2ccccc2c1] | H | H | H | H | H | H | CH |
| 309 | H | H | 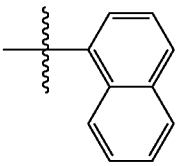 [SMILES: *c1cccc2ccccc12] | H | H | H | H | H | H | CH |
| 310 | H | H | 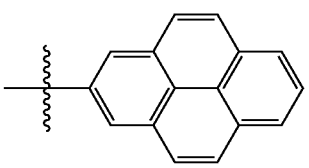 [SMILES: *c1cc2ccc3cccc4ccc(c1)c2c34] | H | H | H | H | H | H | CH |
| 311 | H | H | 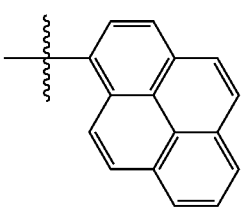 [SMILES: *c1ccc2ccc3cccc4ccc1c2c34] | H | H | H | H | H | H | CH |
| 312 | H | H | 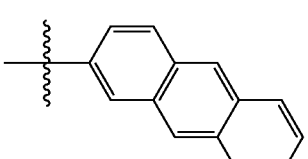 | H | H | H | H | H | H | CH |
| 313 | H | H | 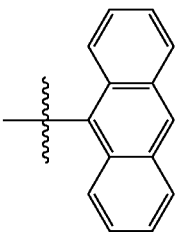 [SMILES: *c1c2ccccc2cc2ccccc12] | H | H | H | H | H | H | CH |
| 314 | H | H | 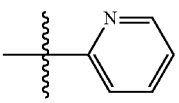 | H | H | H | H | H | H | CH |
| 315 | H | H | 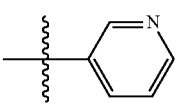 | H | H | H | H | H | H | CH |
| 316 | H | H | 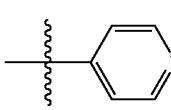 | H | H | H | H | H | H | CH |

TABLE 12

| Compound | R¹ | R² | R³ | R⁴ | R⁵ | R¹¹ | R¹² | R¹³ | R¹⁴ | X |
|---|---|---|---|---|---|---|---|---|---|---|
| 317 | OCH$_3$ | H | H | H | H | H | H | H | H | N |
| 318 | OC$_2$H$_5$ | H | H | H | H | H | H | H | H | N |
| 319 | OC$_3$H$_7$ | H | H | H | H | H | H | H | H | N |
| 320 | OC$_4$H$_9$ | H | H | H | H | H | H | H | H | N |
| 321 | OC$_6$H$_{13}$ | H | H | H | H | H | H | H | H | N |
| 322 | OC$_8$H$_{17}$ | H | H | H | H | H | H | H | H | N |
| 323 | OC$_{10}$H$_{21}$ | H | H | H | H | H | H | H | H | N |
| 324 | OC$_{12}$H$_{25}$ | H | H | H | H | H | H | H | H | N |
| 325 | H | OCH$_3$ | H | H | H | H | H | H | H | N |
| 326 | H | OC$_2$H$_5$ | H | H | H | H | H | H | H | N |
| 327 | H | OC$_3$H$_7$ | H | H | H | H | H | H | H | N |
| 328 | H | OC$_4$H$_9$ | H | H | H | H | H | H | H | N |
| 329 | H | OC$_6$H$_{13}$ | H | H | H | H | H | H | H | N |
| 330 | H | OC$_8$H$_{17}$ | H | H | H | H | H | H | H | N |
| 331 | H | OC$_{10}$H$_{21}$ | H | H | H | H | H | H | H | N |
| 332 | H | OC$_{12}$H$_{25}$ | H | H | H | H | H | H | H | N |
| 333 | H | H | OCH$_3$ | H | H | H | H | H | H | N |
| 334 | H | H | OC$_2$H$_5$ | H | H | H | H | H | H | N |
| 335 | H | H | OC$_3$H$_7$ | H | H | H | H | H | H | N |
| 336 | H | H | OC$_4$H$_9$ | H | H | H | H | H | H | N |
| 337 | H | H | OC$_6$H$_{13}$ | H | H | H | H | H | H | N |
| 338 | H | H | OC$_8$H$_{17}$ | H | H | H | H | H | H | N |
| 339 | H | H | OC$_{10}$H$_{21}$ | H | H | H | H | H | H | N |
| 340 | H | H | OC$_{12}$H$_{25}$ | H | H | H | H | H | H | N |
| 341 | phenyl | H | H | H | H | H | H | H | H | N |
| 342 | 4-methylphenyl (–C$_6$H$_4$–CH$_3$) | H | H | H | H | H | H | H | H | N |
| 343 | 4-ethylphenyl (–C$_6$H$_4$–C$_2$H$_5$) | H | H | H | H | H | H | H | H | N |
| 344 | 4-propylphenyl (–C$_6$H$_4$–C$_3$H$_7$) | H | H | H | H | H | H | H | H | N |
| 345 | 4-butylphenyl (–C$_6$H$_4$–C$_4$H$_9$) | H | H | H | H | H | H | H | H | N |
| 346 | 4-hexylphenyl (–C$_6$H$_4$–C$_6$H$_{13}$) | H | H | H | H | H | H | H | H | N |
| 347 | 4-octylphenyl (–C$_6$H$_4$–C$_8$H$_{17}$) | H | H | H | H | H | H | H | H | N |
| 348 | 4-decylphenyl (–C$_6$H$_4$–C$_{10}$H$_{21}$) | H | H | H | H | H | H | H | H | N |
| 349 | 4-dodecylphenyl (–C$_6$H$_4$–C$_{12}$H$_{25}$) | H | H | H | H | H | H | H | H | N |

TABLE 12-continued

| Compound | R¹ | R² | R³ | R⁴ | R⁵ | R¹¹ | R¹² | R¹³ | R¹⁴ | X |
|---|---|---|---|---|---|---|---|---|---|---|
| 350 | 4-biphenyl | H | H | H | H | H | H | H | H | N |
| 351 | 2-naphthyl | H | H | H | H | H | H | H | H | N |
| 352 | 1-naphthyl | H | H | H | H | H | H | H | H | N |
| 353 | 2-pyrenyl | H | H | H | H | H | H | H | H | N |
| 354 | 1-pyrenyl | H | H | H | H | H | H | H | H | N |
| 355 | 2-anthracenyl | H | H | H | H | H | H | H | H | N |

TABLE 13

| Compound | R¹ | R² | R³ | R⁴ | R⁵ | R¹¹ | R¹² | R¹³ | R¹⁴ | X |
|---|---|---|---|---|---|---|---|---|---|---|
| 356 | 9-anthracenyl | H | H | H | H | H | H | H | H | N |
| 357 | 2-pyridyl | H | H | H | H | H | H | H | H | N |
| 358 | 3-pyridyl | H | H | H | H | H | H | H | H | N |

TABLE 13-continued

| Compound | R$^1$ | R$^2$ | R$^3$ | R$^4$ | R$^5$ | R$^{11}$ | R$^{12}$ | R$^{13}$ | R$^{14}$ | X |
|---|---|---|---|---|---|---|---|---|---|---|
| 359 | 4-pyridyl | H | H | H | H | H | H | H | H | N |
| 360 | H | phenyl | H | H | H | H | H | H | H | N |
| 361 | H | 4-CH$_3$-phenyl | H | H | H | H | H | H | H | N |
| 362 | H | 4-C$_2$H$_5$-phenyl | H | H | H | H | H | H | H | N |
| 363 | H | 4-C$_3$H$_7$-phenyl | H | H | H | H | H | H | H | N |
| 364 | H | 4-C$_4$H$_9$-phenyl | H | H | H | H | H | H | H | N |
| 365 | H | 4-C$_6$H$_{13}$-phenyl | H | H | H | H | H | H | H | N |
| 366 | H | 4-C$_{12}$H$_{26}$-phenyl | H | H | H | H | H | H | H | N |
| 367 | H | 4-C$_{10}$H$_{21}$-phenyl | H | H | H | H | H | H | H | N |
| 368 | H | 4-C$_{12}$H$_{25}$-phenyl | H | H | H | H | H | H | H | N |
| 369 | H | 4-biphenyl | H | H | H | H | H | H | H | N |
| 370 | H | 2-naphthyl | H | H | H | H | H | H | H | N |
| 371 | H | 1-naphthyl | H | H | H | H | H | H | H | N |

TABLE 13-continued

| Compound | R¹ | R² | R³ | R⁴ | R⁵ | R¹¹ | R¹² | R¹³ | R¹⁴ | X |
|---|---|---|---|---|---|---|---|---|---|---|
| 372 | H | ![pyrene] | H | H | H | H | H | H | H | N |
| 373 | H | ![pyrene] | H | H | H | H | H | H | H | N |
| 374 | H | ![anthracene] | H | H | H | H | H | H | H | N |
| 375 | H | ![anthracene] | H | H | H | H | H | H | H | N |
| 376 | H | ![2-pyridyl] | H | H | H | H | H | H | H | N |
| 377 | H | ![3-pyridyl] | H | H | H | H | H | H | H | N |
| 378 | H | ![4-pyridyl] | H | H | H | H | H | H | H | N |
| 379 | H | H | ![phenyl] | H | H | H | H | H | H | N |

TABLE 14

| Compound | R¹ | R² | R³ | R⁴ | R⁵ | R¹¹ | R¹² | R¹³ | R¹⁴ | X |
|---|---|---|---|---|---|---|---|---|---|---|
| 380 | H | H | ![4-methylphenyl with CH₃] | H | H | H | H | H | H | N |

TABLE 14-continued
| Compound | R¹ | R² | R³ | R⁴ | R⁵ | R¹¹ | R¹² | R¹³ | R¹⁴ | X |
|---|---|---|---|---|---|---|---|---|---|---|
| 381 | H | H | 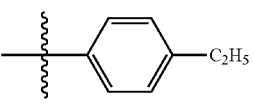 -C₂H₅ | H | H | H | H | H | H | N |
| 382 | H | H | 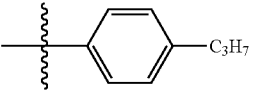 -C₃H₇ | H | H | H | H | H | H | N |
| 383 | H | H | 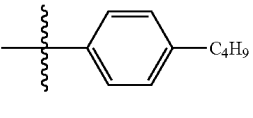 -C₄H₉ | H | H | H | H | H | H | N |
| 384 | H | H | 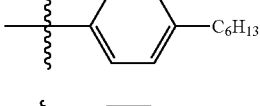 -C₆H₁₃ | H | H | H | H | H | H | N |
| 385 | H | H | 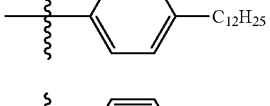 -C₁₂H₂₅ | H | H | H | H | H | H | N |
| 386 | H | H | 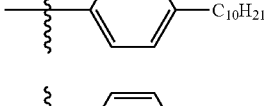 -C₁₀H₂₁ | H | H | H | H | H | H | N |
| 387 | H | H | 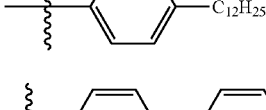 -C₁₂H₂₅ | H | H | H | H | H | H | N |
| 388 | H | H | 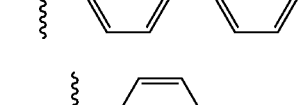 | H | H | H | H | H | H | N |
| 389 | H | H | 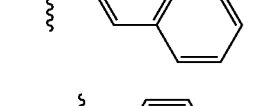 | H | H | H | H | H | H | N |
| 390 | H | H | 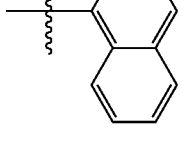 | H | H | H | H | H | H | N |
| 391 | H | H | 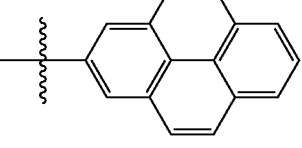 | H | H | H | H | H | H | N |
| 392 | H | H | 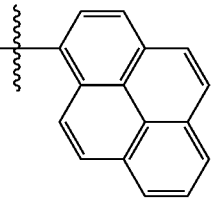 | H | H | H | H | H | H | N |

TABLE 14-continued

| Compound | R¹ | R² | R³ | R⁴ | R⁵ | R¹¹ | R¹² | R¹³ | R¹⁴ | X |
|---|---|---|---|---|---|---|---|---|---|---|
| 393 | H | H | 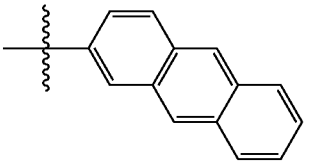 [SMILES: *c1ccc2cc3ccccc3cc2c1] | H | H | H | H | H | H | N |
| 394 | H | H | 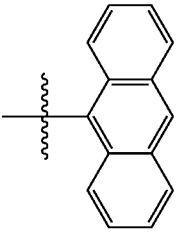 [SMILES: *c1c2ccccc2cc2ccccc12] | H | H | H | H | H | H | N |
| 395 | H | H | 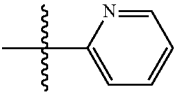 [SMILES: *c1ccccn1] | H | H | H | H | H | H | N |
| 396 | H | H | 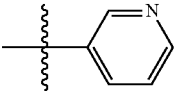 [SMILES: *c1cccnc1] | H | H | H | H | H | H | N |
| 397 | H | H | 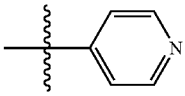 | H | H | H | H | H | H | N |

TABLE 15

| Compound | R¹ | R² | R³ | R⁴ | R⁵ | R¹¹ | R¹² | R¹³ | R¹⁴ | X |
|---|---|---|---|---|---|---|---|---|---|---|
| 398 | H | H | H | H | H | CH₃ | H | H | H | CH |
| 399 | H | H | H | H | H | C₂H₅ | H | H | H | CH |
| 400 | H | H | H | H | H | C₃H₇ | H | H | H | CH |
| 401 | H | H | H | H | H | C₄H₉ | H | H | H | CH |
| 402 | H | H | H | H | H | C₆H₁₃ | H | H | H | CH |
| 403 | H | H | H | H | H | C₈H₁₇ | H | H | H | CH |
| 404 | H | H | H | H | H | C₁₀H₂₁ | H | H | H | CH |
| 405 | H | H | H | H | H | C₁₂H₂₅ | H | H | H | CH |
| 406 | H | H | H | H | H | H | CH₃ | H | H | CH |
| 407 | H | H | H | H | H | H | C₂H₅ | H | H | CH |
| 408 | H | H | H | H | H | H | C₃H₇ | H | H | CH |
| 409 | H | H | H | H | H | H | C₄H₉ | H | H | CH |
| 410 | H | H | H | H | H | H | C₆H₁₃ | H | H | CH |
| 411 | H | H | H | H | H | H | C₈H₁₇ | H | H | CH |
| 412 | H | H | H | H | H | H | C₁₀H₂₁ | H | H | CH |
| 413 | H | H | H | H | H | H | C₁₂H₂₅ | H | H | CH |
| 414 | H | H | H | H | H | H | H | CH₃ | H | CH |
| 415 | H | H | H | H | H | H | H | C₂H₅ | H | CH |
| 416 | H | H | H | H | H | H | H | C₃H₇ | H | CH |
| 417 | H | H | H | H | H | H | H | C₄H₉ | H | CH |
| 418 | H | H | H | H | H | H | H | C₆H₁₃ | H | CH |
| 419 | H | H | H | H | H | H | H | C₈H₁₇ | H | CH |
| 420 | H | H | H | H | H | H | H | C₁₀H₂₁ | H | CH |
| 421 | H | H | H | H | H | H | H | C₁₂H₂₅ | H | CH |
| 422 | H | H | H | H | H | H | H | H | CH₃ | CH |
| 423 | H | H | H | H | H | H | H | H | C₂H₅ | CH |
| 424 | H | H | H | H | H | H | H | H | C₃H₇ | CH |
| 425 | H | H | H | H | H | H | H | H | C₄H₉ | CH |
| 426 | H | H | H | H | H | H | H | H | C₆H₁₃ | CH |

TABLE 15-continued

| Compound | R¹ | R² | R³ | R⁴ | R⁵ | R¹¹ | R¹² | R¹³ | R¹⁴ | X |
|---|---|---|---|---|---|---|---|---|---|---|
| 427 | H | H | H | H | H | H | H | H | $C_8H_{17}$ | CH |
| 428 | H | H | H | H | H | H | H | H | $C_{10}H_{21}$ | CH |
| 429 | H | H | H | H | H | H | H | H | $C_{12}H_{25}$ | CH |

TABLE 16

| Compound | R¹ | R² | R³ | R⁴ | R⁵ | R¹¹ | R¹² | R¹³ | R¹⁴ | X |
|---|---|---|---|---|---|---|---|---|---|---|
| 430 | H | H | H | H | H | phenyl | H | H | H | CH |
| 431 | H | H | H | H | H | 4-biphenyl | H | H | H | CH |
| 432 | H | H | H | H | H | 2-naphthyl | H | H | H | CH |
| 433 | H | H | H | H | H | 1-naphthyl | H | H | H | CH |
| 434 | H | H | H | H | H | 2-thienyl | H | H | H | CH |
| 435 | H | H | H | H | H | 5-hexyl-2-thienyl | H | H | H | CH |
| 436 | H | H | H | H | H | H | phenyl | H | H | CH |
| 437 | H | H | H | H | H | H | 4-biphenyl | H | H | CH |

TABLE 16-continued
| Compound | R¹ | R² | R³ | R⁴ | R⁵ | R¹¹ | R¹² | R¹³ | R¹⁴ | X |
|---|---|---|---|---|---|---|---|---|---|---|
| 438 | H | H | H | H | H | H |  2-naphthyl | H | H | CH |
| 439 | H | H | H | H | H | H |  1-naphthyl | H | H | CH |
| 440 | H | H | H | H | H | H |  thienyl | H | H | CH |
| 441 | H | H | H | H | H | H |  5-hexylthienyl | H | H | CH |
| 442 | H | H | H | H | H | H | H |  phenyl | H | CH |
| 443 | H | H | H | H | H | H | H |  biphenyl | H | CH |
| 444 | H | H | H | H | H | H | H | 2-naphthyl | H | CH |

TABLE 16-continued
| Compound | R[1] | R[2] | R[3] | R[4] | R[5] | R[11] | R[12] | R[13] | R[14] | X |
|---|---|---|---|---|---|---|---|---|---|---|
| 445 | H | H | H | H | H | H | H |  | H | CH |
| 446 | H | H | H | H | H | H | H |  | H | CH |
| 447 | H | H | H | H | H | H | H |  | H | CH |
| 448 | H | H | H | H | H | H | H | H |  | CH |
| 449 | H | H | H | H | H | H | H | H |  | CH |
| 450 | H | H | H | H | H | H | H | H |  | CH |
| 451 | H | H | H | H | H | H | H | H |  | CH |
| 452 | H | H | H | H | H | H | H | H |  | CH |

TABLE 16-continued
| Compound | R¹ | R² | R³ | R⁴ | R⁵ | R¹¹ | R¹² | R¹³ | R¹⁴ | X |
|---|---|---|---|---|---|---|---|---|---|---|
| 453 | H | H | H | H | H | H | H | H | 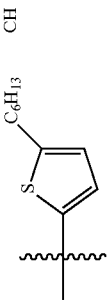 | CH |

TABLE 17

| Compound | $R^1$ | $R^2$ | $R^3$ | $R^4$ | $R^5$ | $R^{11}$ | $R^{12}$ | $R^{13}$ | $R^{14}$ | X |
|---|---|---|---|---|---|---|---|---|---|---|
| 454 | H | H | H | H | H | $CH_3$ | H | H | H | N |
| 455 | H | H | H | H | H | $C_2H_5$ | H | H | H | N |
| 456 | H | H | H | H | H | $C_3H_7$ | H | H | H | N |
| 457 | H | H | H | H | H | $C_4H_9$ | H | H | H | N |
| 458 | H | H | H | H | H | $C_6H_{13}$ | H | H | H | N |
| 459 | H | H | H | H | H | $C_8H_{17}$ | H | H | H | N |
| 460 | H | H | H | H | H | $C_{10}H_{21}$ | H | H | H | N |
| 461 | H | H | H | H | H | $C_{12}H_{25}$ | H | H | H | N |
| 462 | H | H | H | H | H | H | $CH_3$ | H | H | N |
| 463 | H | H | H | H | H | H | $C_2H_5$ | H | H | N |
| 464 | H | H | H | H | H | H | $C_3H_7$ | H | H | N |
| 465 | H | H | H | H | H | H | $C_4H_9$ | H | H | N |
| 466 | H | H | H | H | H | H | $C_6H_{13}$ | H | H | N |
| 467 | H | H | H | H | H | H | $C_8H_{17}$ | H | H | N |
| 468 | H | H | H | H | H | H | $C_{10}H_{21}$ | H | H | N |
| 469 | H | H | H | H | H | H | $C_{12}H_{25}$ | H | H | N |
| 470 | H | H | H | H | H | H | H | $CH_3$ | H | N |
| 471 | H | H | H | H | H | H | H | $C_2H_5$ | H | N |
| 472 | H | H | H | H | H | H | H | $C_3H_7$ | H | N |
| 473 | H | H | H | H | H | H | H | $C_4H_9$ | H | N |
| 474 | H | H | H | H | H | H | H | $C_6H_{13}$ | H | N |
| 475 | H | H | H | H | H | H | H | $C_8H_{17}$ | H | N |
| 476 | H | H | H | H | H | H | H | $C_{10}H_{21}$ | H | N |
| 477 | H | H | H | H | H | H | H | $C_{12}H_{25}$ | H | N |
| 478 | H | H | H | H | H | H | H | H | $CH_3$ | N |
| 479 | H | H | H | H | H | H | H | H | $C_2H_5$ | N |
| 480 | H | H | H | H | H | H | H | H | $C_3H_7$ | N |
| 481 | H | H | H | H | H | H | H | H | $C_4H_9$ | N |
| 482 | H | H | H | H | H | H | H | H | $C_6H_{13}$ | N |
| 483 | H | H | H | H | H | H | H | H | $C_8H_{17}$ | N |
| 484 | H | H | H | H | H | H | H | H | $C_{10}H_{21}$ | N |
| 485 | H | H | H | H | H | H | H | H | $C_{12}H_{25}$ | N |

TABLE 18
| Compound | R¹ | R² | R³ | R⁴ | R⁵ | R¹¹ | R¹² | R¹³ | R¹⁴ | X |
|---|---|---|---|---|---|---|---|---|---|---|
| 486 | H | H | H | H | H | 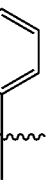 | H | H | H | N |
| 487 | H | H | H | H | H | 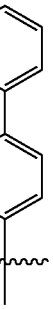 | H | H | H | N |
| 488 | H | H | H | H | H | 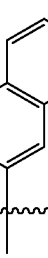 | H | H | H | N |
| 489 | H | H | H | H | H | 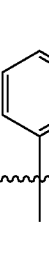 | H | H | H | N |
| 490 | H | H | H | H | H | 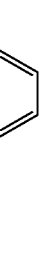 | H | H | H | N |
| 491 | H | H | H | H | H | 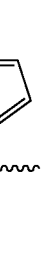 | H | H | H | N |
| 492 | H | H | H | H | H | 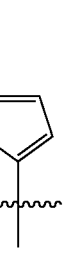 | H | H | H | N |
| 493 | H | H | H | H | H | 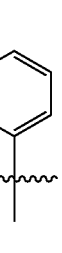 | H | H | H | N |

TABLE 18-continued
| Compound | R¹ | R² | R³ | R⁴ | R⁵ | R¹¹ | R¹² | R¹³ | R¹⁴ | X |
|---|---|---|---|---|---|---|---|---|---|---|
| 494 | H | H | H | H | H | H |  | H | H | N |
| 495 | H | H | H | H | H | H |  | H | H | N |
| 496 | H | H | H | H | H | H | 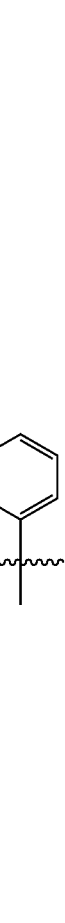 | H | H | N |
| 497 | H | H | H | H | H | H | 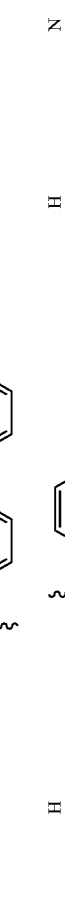 | H | H | N |
| 498 | H | H | H | H | H | H | H |  | H | N |
| 499 | H | H | H | H | H | H | H |  | H | N |
| 500 | H | H | H | H | H | H | H |  | H | N |

TABLE 18-continued

| Compound | R¹ | R² | R³ | R⁴ | R⁵ | R¹¹ | R¹² | R¹³ | R¹⁴ | X |
|---|---|---|---|---|---|---|---|---|---|---|
| 501 | H | H | H | H | H | H | H | 1-naphthyl | H | N |
| 502 | H | H | H | H | H | H | H | 2-thienyl | H | N |
| 503 | H | H | H | H | H | H | H | 5-hexyl-2-thienyl | H | N |
| 504 | H | H | H | H | H | H | H | H | phenyl | N |
| 505 | H | H | H | H | H | H | H | H | 4-biphenyl | N |
| 506 | H | H | H | H | H | H | H | H | 2-naphthyl | N |
| 507 | H | H | H | H | H | H | H | H | 1-naphthyl | N |
| 508 | H | H | H | H | H | H | H | H | 2-thienyl | N |

TABLE 18-continued
| Compound | R$^1$ | R$^2$ | R$^3$ | R$^4$ | R$^5$ | R$^{11}$ | R$^{12}$ | R$^{13}$ | R$^{14}$ | X |
|---|---|---|---|---|---|---|---|---|---|---|
| 509 | H | H | H | H | H | H | H | H | 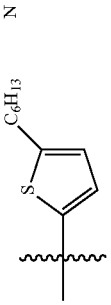 | N |

TABLE 19
| Compound | R$^1$ | R$^2$ | R$^3$ | R$^4$ | R$^5$ | R$^{11}$ | R$^{12}$ | R$^{13}$ | R$^{14}$ | X |
|---|---|---|---|---|---|---|---|---|---|---|
| 510 | H | H | H | H | H |  | | H | H | CH |
| 511 | H | H | H | H | H |  | | H | H | CH |
| 512 | H | H | H | H | H |  | | H | H | CH |
| 513 | H | H | H | H | H |  | | H | H | CH |
| 514 | H | H | H | H | H | H |  | H | H | CH |
| 515 | H | H | H | H | H | H |  | H | H | CH |
| 516 | H | H | H | H | H | H |  | H | H | CH |
| 517 | H | H | H | H | H | H |  | H | H | CH |
| 518 | H | H | H | H | H | H | H |  | | CH |
| 519 | H | H | H | H | H | H | H |  | | CH |
| 520 | H | H | H | H | H | H | H |  | | CH |
| 521 | H | H | H | H | H | H | H |  | | CH |
| 522 | H | H | H | H | H |  | |  | | CH |

TABLE 20
| Compound | R¹ | R² | R³ | R⁴ | R⁵ | R¹¹ | R¹² | R¹³ | R¹⁴ | X |
|---|---|---|---|---|---|---|---|---|---|---|
| 523 | H | H | H | H | H |  | | H | H | N |
| 524 | H | H | H | H | H |  | | H | H | N |
| 525 | H | H | H | H | H |  | | H | H | N |
| 526 | H | H | H | H | H |  | | H | H | N |
| 527 | H | H | H | H | H | H |  | H | H | N |
| 528 | H | H | H | H | H | H |  | H | H | N |
| 529 | H | H | H | H | H | H |  | H | H | N |
| 530 | H | H | H | H | H | H |  | H | H | N |
| 531 | H | H | H | H | H | H | H |  | | N |
| 532 | H | H | H | H | H | H | H |  | | N |
| 533 | H | H | H | H | H | H | H |  | | N |
| 534 | H | H | H | H | H | H | H |  | | N |
| 535 | H | H | H | H | H |  | |  | | N |

TABLE 21
| Compound | R¹ | R² | R³ | R⁴ | R⁵ | R¹¹ | R¹² | R¹³ | R¹⁴ | X |
|---|---|---|---|---|---|---|---|---|---|---|
| 536 | H | H | 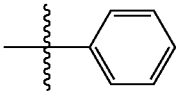 | H | H |  | | H | H | CH |
| 537 | H | H | 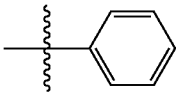 | H | H |  | | H | H | CH |
| 538 | H | H | 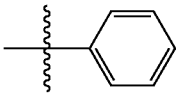 [SMILES: *c1ccccc1] | H | H |  | | H | H | CH |
| 539 | H | H | 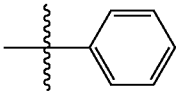 [SMILES: *c1ccccc1] | H | H |  | | H | H | CH |
| 540 | H | H | 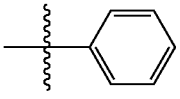 | H | H | H |  | | H | CH |
| 541 | H | H | 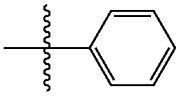 [SMILES: *c1ccccc1] | H | H | H |  | | H | CH |
| 542 | H | H | 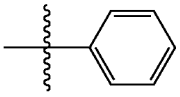 | H | H | H |  | | H | CH |
| 543 | H | H | 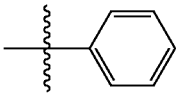 | H | H | H |  | | H | CH |
| 544 | H | H | 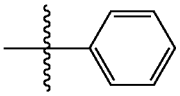 | H | H | H | H |  | | CH |
| 545 | H | H | 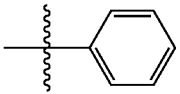 | H | H | H | H |  | | CH |
| 546 | H | H | 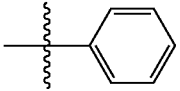 [SMILES: *c1ccccc1] | H | H | H | H |  | | CH |
| 547 | H | H | 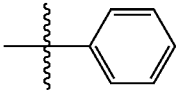 | H | H | H | H |  | | CH |
| 548 | H | H | 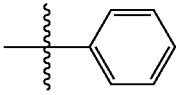 [SMILES: *c1ccccc1] | H | H |  | |  | | CH |

TABLE 22
| Compound | R¹ | R² | R³ | R⁴ | R⁵ | R¹¹ | R¹² | R¹³ | R¹⁴ | X |
|---|---|---|---|---|---|---|---|---|---|---|
| 549 | H | H | 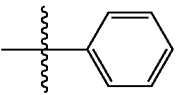 | H | H |  | | H | H | N |
| 550 | H | H | 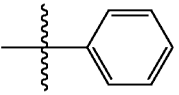 | H | H |  | | H | H | N |
| 551 | H | H | 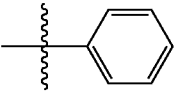 | H | H |  | | H | H | N |
| 552 | H | H | 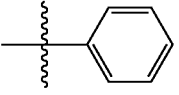 [SMILES: *c1ccccc1] | H | H |  | | H | H | N |
| 553 | H | H | 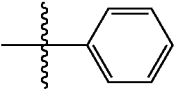 | H | H | H |  | | H | N |
| 554 | H | H | 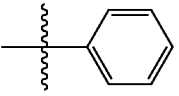 | H | H | H |  | | H | N |
| 555 | H | H | 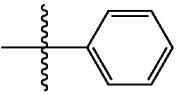 | H | H | H |  | | H | N |
| 556 | H | H | 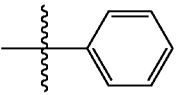 [SMILES: *c1ccccc1] | H | H | H |  | | H | N |
| 557 | H | H | 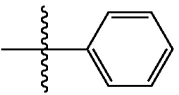 | H | H | H | H |  | | N |
| 558 | H | H | 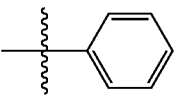 | H | H | H | H |  | | N |
| 559 | H | H | 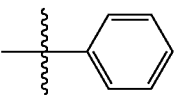 [SMILES: *c1ccccc1] | H | H | H | H |  | | N |
| 560 | H | H | 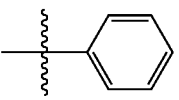 | H | H | H | H |  | | N |
| 561 | H | H | 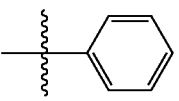 [SMILES: *c1ccccc1] | H | H |  | |  | | N |

TABLE 23
| Compound | R¹ | R² | R³ | R⁴ | R⁵ | R¹¹ | R¹² | R¹³ | R¹⁴ | X |
|---|---|---|---|---|---|---|---|---|---|---|
| 562 | H | H | 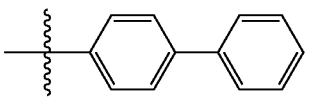 | H | H |  |  | H | H | CH |
| 563 | H | H | 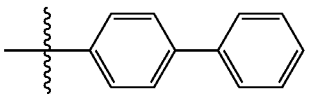 | H | H |  |  | H | H | CH |
| 564 | H | H | 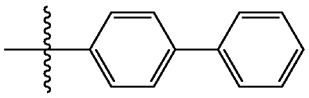 [SMILES: *c1ccc(-c2ccccc2)cc1] | H | H |  |  | H | H | CH |
| 565 | H | H | 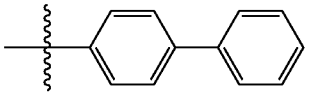 | H | H |  |  | H | H | CH |
| 566 | H | H | 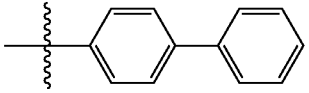 | H | H | H |  | H | H | CH |
| 567 | H | H | 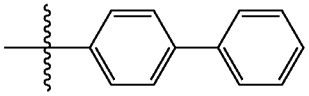 | H | H | H |  | H | H | CH |
| 568 | H | H | 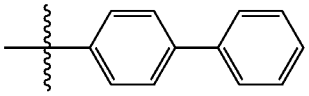 | H | H | H |  | H | H | CH |
| 569 | H | H | 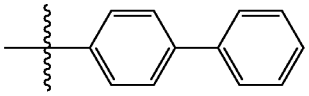 | H | H | H |  | H | H | CH |
| 570 | H | H | 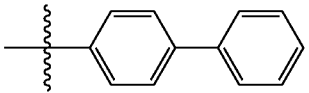 | H | H | H | H |  | H | CH |
| 571 | H | H | 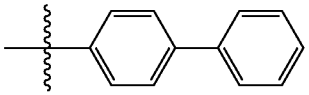 | H | H | H | H |  | H | CH |
| 572 | H | H | 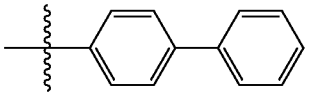 | H | H | H | H |  | H | CH |
| 573 | H | H | 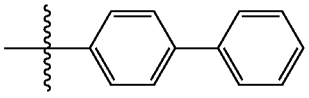 | H | H | H | H |  | H | CH |
| 574 | H | H | 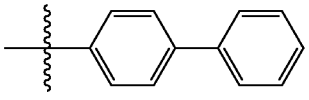 | H | H |  |  |  | H | CH |

TABLE 24

| Compound | R¹ | R² | R³ | R⁴ | R⁵ | R¹¹ | R¹² | R¹³ | R¹⁴ | X |
|---|---|---|---|---|---|---|---|---|---|---|
| 575 | F  | H  | H  | H | H | H | H | H | H | CH |
| 576 | Cl | H  | H  | H | H | H | H | H | H | CH |
| 577 | Br | H  | H  | H | H | H | H | H | H | CH |
| 578 | H  | F  | H  | H | H | H | H | H | H | CH |
| 579 | H  | Cl | H  | H | H | H | H | H | H | CH |
| 580 | H  | Br | H  | H | H | H | H | H | H | CH |
| 581 | H  | H  | F  | H | H | H | H | H | H | CH |
| 582 | H  | H  | Cl | H | H | H | H | H | H | CH |
| 583 | H  | H  | Br | H | H | H | H | H | H | CH |

The organic compounds represented by the general formulas (1) to (3) of the present invention can be synthesized by a known method. For example, these organic compounds are obtained in the same manner as the following reaction process (Org. Lett., 2011, 4547). By using Compound (2-6) in the following reaction equation (1) as an intermediate, the organic compounds represented by the above general formulas (1) to (3) can be synthesized.

Besides, various types of compounds obtained in Synthesis Examples are measured in terms of MS (mass spectrum) and NMR (nuclear magnetic resonance spectrum), as necessary, so that the structures thereof can be determined.

Reaction Equation (1)

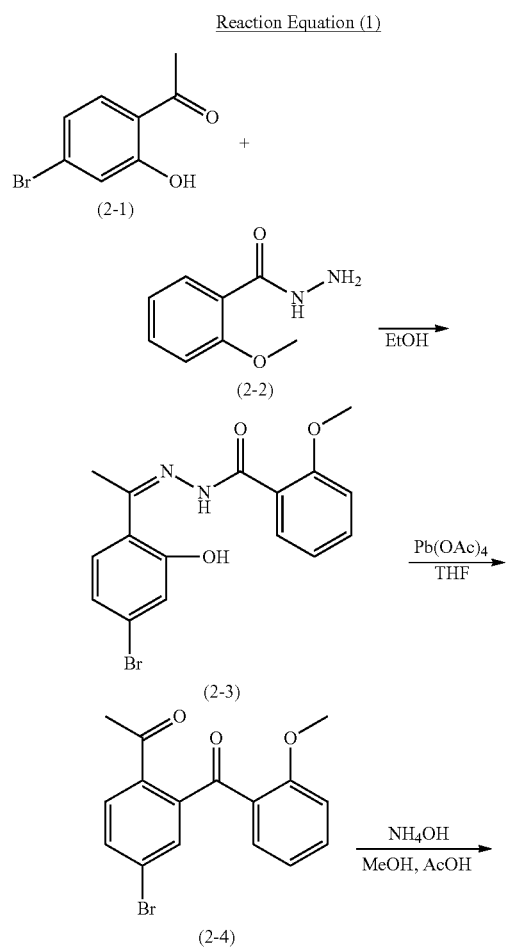

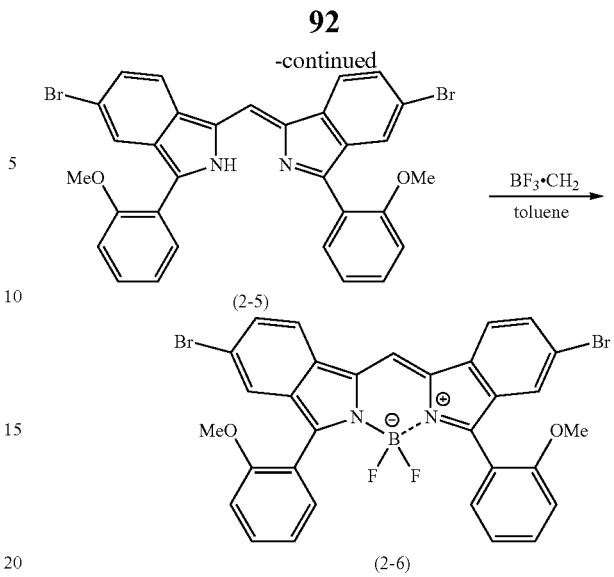

A method of purifying the organic compounds represented by the general formulas (1) to (3) is not particularly limited, and known methods such as recrystallization, column chromatography and vacuum sublimation purification can be adopted. In addition, these methods may be used in combination, as necessary.

The organic compounds represented by the general formulas (1) to (3) are characterized in that they have high industrial applicability and high stability in the atmosphere. In addition, the organic compounds represented by the general formulas (1) to (3) are soluble, and thus, the organic compounds are each applied in the state of a solution to produce a thin film, and as a result, the manufacturing process of the organic compounds becomes easy, such that the organic compounds are easily applied to devices by a physical deposition method such as vacuum deposition or sputtering.

The organic compounds represented by the general formulas (1) to (3) of the present invention have an absorption band in the near infrared region. Herein, the near infrared region is a region from 700 to 2500 nm, preferably a region from 700 to 2000 nm, and particularly preferably a region from 700 to 1500 nm. The organic compound of the present invention can be used as a material for a near infrared absorbing dye having an absorption band, particularly, in a region of 700 nm or more and 2500 nm or less, and a near infrared absorbing ink comprising the near infrared absorbing dye can produce a thin film having an absorption band in the near infrared region according to coating or the like.

The thickness of the thin film is different depending on the intended use thereof. It is generally 0.01 nm to 10 μm, preferably 0.05 nm to 3 μm, and more preferably 0.1 nm to 1 μm.

Examples of a general method of forming a thin film include: gas phase methods such as resistance heating deposition that is a vacuum process, electron beam evaporation, sputtering, or a molecule laminating method; solution methods, such as spin-coating, drop casting, dip coating, or spraying; letterpress printing methods such as flexography or resin letterpress printing; lithographic printing methods such as offset printing, dry offset printing, or pad printing; intaglio printing methods such as gravure printing method; stencil printing methods such as silk screen printing, mimeograph printing, or lithographic printing; and inkjet printing, microcontact printing, and further, methods involving a combination of some of the aforementioned methods.

Among the above described methods, a resistance heating deposition method that is a vacuum process, a spin-coating method and a dip-coating method that are solution processes, an inkjet method, a screen printing, letterpress printing, etc. are preferable.

Moreover, the organic compounds represented by the general formulas (1) to (3) can be used as materials for use in optical films (including near infrared cut films, etc.) and organic electronic devices.

Examples of the organic electronic devices include a thin film transistor, a photoelectric conversion element, an organic solar cell element, an organic electronic luminescence element (hereinafter abbreviated as an "organic EL element"), an organic light-emitting transistor element, and an organic semiconductor laser element. In particular, the organic compounds represented by the general formulas (1) to (3) are useful as materials for photoelectric conversion elements (a light sensor, an image sensor, an imaging element, etc.).

Hereinafter, these elements will be described in detail.

(Optical Film)

Because the organic compounds of the present invention selectively absorbs the light of an infrared wavelength region, an organic thin film using the organic compound can be used as an optical film for suppressing the light of the emission light wavelength.

Examples of the optical film include an infrared shielding film, an antireflection film, an oriented film, a polarization film, a polarization plate protective film, a phase difference film, a viewing angle enlarging film, a luminance improving film, and an electromagnetic shielding film, which can be used for a flat panel display (FPD) such as liquid crystal display (LCD) and plasma display (PDP) and windows of building or vehicle, etc. Among the above, the infrared shielding film can be applied to a wide range of fields. For example, as a widow bonding film for imparting the infrared shielding effects by bonding the organic film to facilities exposed to the solar light for a long time such as outside window of buildings and automotive windows and an agriculture plastic greenhouse films, the infrared shielding film can be used for purpose of mainly improving the weather resistance.

The entire film thickness of the optical film of the present invention is preferably 10 μm to 300 μm, more preferably 20 μm to 250 μm, and further preferably 100 μm to 175 μm. When the film thickness falls within the range, the film is excellent in transparency after long time use.

(Thin Film Transistor)

Next, a thin film transistor element will be described. A thin film transistor may have two electrodes (i.e., a source electrode and a drain electrode) in contact with a semiconductor. The current flowing between the electrodes is controlled by voltage applied to another electrode called a gate electrode.

Generally, the thin film transistor element may frequently have a MIS (Metal-Insulator-Semiconductor) structure where a gate electrode is insulated by an insulation film. The structure where a metal oxide is used for the insulation film is called a MOS structure. Besides these, there is a structure where a gate electrode is formed via a Schottky barrier (i.e., MES structure), but a thin film transistor containing an organic semiconductor material may frequently have a MIS structure.

Hereinafter, referring to the figures, some embodiments of the organic thin film transistor (element) will be more specifically described.

In each of the embodiments shown in FIG. 1, reference number 1 represents a source electrode, reference number 2 represents a semiconductor layer, reference number 3 represents a drain electrode, reference number 4 represents an insulation layer, reference number 5 represents a gate electrode and reference number 6 represents a substrate. The arrangement of individual layers and electrodes can be appropriately selected depending upon applications of the element. A to D, and F are called a horizontal transistor because current flows in a direction parallel to the substrate. A is called as a bottom-contact bottom-gate structure, and B is called as a top-contact bottom-gate structure. C is called as a top-contact top-gate structure where source and drain electrodes and an insulator layer are provided on a semiconductor and a gate electrode is formed thereon. D is a structure called a top and bottom-contact type transistor. F is a bottom-contact top-gate structure E shows a schematic view of a transistor having a vertical structure, that is, a static induction transistor (SIT). In the SIT, current flow spreads in a plane, a large number of carriers can move at a time. A source electrode and a drain electrode are arranged vertically, and the distance between the electrodes can be therefore reduced. As a result, a response is made at a high speed. Accordingly, a SIT can be preferably employed to supply a large amount of current and to switch at a high speed. In B of FIG. 1, a substrate is not shown, but the substrate is usually provided outside the source or drain electrodes represented by reference numbers 1 and 3, respectively, in E of FIG. 1.

Individual constituent elements in each embodiment will be described. It is necessary for a substrate 6 to hold the layers to be formed thereon without being removed. As a substrate, an insulating material such as a resin plate or film, paper, glass, quartz and ceramic; an article where an insulator layer is formed on a conductive substrate such as a metal, an alloy or the like, by coating, etc.; and a material of a resin and an inorganic material in various combinations may be used. Examples of a resin film which is available include polyethylene terephthalate, polyethylene naphthalate, polyethersulfone, polyamide, polyimide, polycarbonate, cellulose triacetate or polyether imide. When a resin film or paper is used, a device can have flexibility. The device becomes flexible and light, and the practical performance thereof can be improved. A thickness of a substrate is usually 1 μm to 10 mm and preferably 5 μm to 5 mm.

As a source electrode 1, a drain electrode 3 and a gate electrode 5, a conductive material can be used. Examples of the material include metals such as platinum, gold, silver, aluminum, chromium, tungsten, tantalum, nickel, cobalt, copper, iron, lead, tin, titanium, indium, palladium, molybdenum, magnesium, calcium, barium, lithium, potassium and sodium and an alloy containing two or more of them; conductive oxides such as $InO_2$, $ZnO_2$, $SnO_2$ and ITO; conductive polymer compounds such as polyaniline, polypyrrole, polythiophene, polyacetylene, polyparaphenylene, vinylene and polydiacetylene; semiconductors such as silicon, germanium and gallium arsenide; and carbon materials such as carbon black, fullerene, carbon nanotube and graphite. A conductive polymer compound and semiconductor may be doped. Examples of the dopant include inorganic acids such as hydrochloric acid and sulfuric acid; organic acids having an acidic functional group such as sulfonic acid; Lewis acids such as $PF_5$, $ASF_5$ and $FeCl_3$; halogen atoms such as iodine; and metal atoms such as lithium, sodium and potassium. Boron, phosphorus and arsenic are frequently used as a dopant for an inorganic semiconductor such as silicon.

Furthermore, a composite material containing carbon black or metal particles dispersed into the dopant may be used as a conductive material. To reduce contact resistance of a source electrode 1 and a drain electrode 3, which are in direct contact with a semiconductor, it is important to select appropriate work functions or to apply a surface treatment to the electrodes.

In addition, the distance (channel length) between the source electrode and the drain electrode is an important factor for determining the characteristics of a device. The channel length is usually 0.1 to 300 μm and preferably 0.5 to 100 μm. As the channel length is short, the amount of outputted current increases, but it conversely causes a short channel effect such as an effect on contact resistance and controlling is difficult, therefore, a proper channel length is required. The width (channel width) between the source and drain electrode is usually 10 to 1000 μm and preferably 100 to 5000 μm. If an electrode has a comb structure or the like, the width of the channel can be increased. A channel can have an appropriate length in consideration of a demanded current amount and the structure of the element.

The structures (shapes) of a source electrode and a drain electrode each will be described. The structures of a source electrode and a drain electrode may be the same or different.

In the case of a bottom contact structure, individual electrode can be generally formed by a lithographic method. Each electrode may be preferably formed into a rectangular parallelepiped shape. In the case of a top contact structure where electrodes are formed on a semiconductor, vapor deposition can be performed using a shadow mask or the like. An electrode pattern can be directly printed and formed by means of inkjet printing or the like. A length of an electrode may be the same as the channel width mentioned above. The width of an electrode is not particularly defined, but the shorter the width, the more preferable in order to reduce the area of an element as long as electric characteristics can be stabilized. The width of an electrode is usually 0.1 to 1000 μm and preferably 0.5 to 100 μm. The thickness of an electrode is usually 0.1 to 1000 μm, preferably 1 to 500 μm and more preferably 5 to 200 μm. To electrodes 1, 3 and 5, wirings are connected. The wirings may be formed from substantially the same materials as those for the electrodes.

An insulator layer 4 can be obtained from a material having an insulation property. Examples of the material include polymers such as polyparaxylylene, polyacrylate, polymethyl methacrylate, polystyrene, polyvinyl phenol, polyamide, polyimide, polycarbonate, polyester, polyvinyl alcohol, polyvinyl acetate, polyurethane, polysulfone, epoxy resin and phenolic resin and copolymers thereof in combination; metal oxides such as silicon dioxide, aluminum oxide, titanium oxide and tantalum oxide; ferroelectric metal oxides such as $SrTiO_3$ and $BaTiO_3$; nitrides such as silicon nitride and aluminum nitride; dielectric substances such as sulfides and a fluoride; or a polymer in which particles of these dielectric substances are dispersed. The film thickness of an insulator layer 4 varies depending upon the material, but it is usually 0.1 nm to 100 μm and more preferably 1 nm to 10 μm.

As a material for an organic semiconductor, the organic compound represented by the general formulas (1) to (3) of the present invention can be used for a semiconductor layer 2. The semiconductor layer 2 is made by using the composition containing the organic compound represented by the general formulas (1) to (3) to form a thin film, and the film can be used. In case of using a solvent for the film formation, preferably after the solvent is evaporated, the film can be used. When an organic semiconductor layer is formed by a deposition method described below, a single compound represented by formula (1) to (3) is preferably used as an organic semiconductor, rather than a mixture of the compounds represented by the general formulas (1) to (3). For the purpose of improving characteristics of a transistor described above, the addition of dopants, etc., cannot be prevented. When a semiconductor layer is formed by a solution process, the process is not limited to this.

The additives mentioned above may be added within the range of usually 0.01 to 10 wt %, preferably 0.05 to 5 wt % and more preferably 0.1 to 3 wt % relative to the total amount of the organic semiconductor material as 1.

Furthermore, the semiconductor layer may consist of a plurality of layers, but a single layer structure is preferred. The thinner the film thickness of a semiconductor layer 2, the more preferable, as long as a requisite function maintained. This is because, in horizontal thin film transistors as shown in A, B and D of FIG. 1, the characteristics of the elements do not depend upon the film thickness as long as the film has a predetermined thickness or more; on the other hand, as the film thickness increases, leakage current may increase. To exert a requisite function, the film thickness of a semiconductor layer is usually 1 nm to 10 μm, preferably 5 nm to 5 μm, and more preferably 10 nm to 3 μm.

For a thin film transistor, if necessary, an additional layer may be provided, for example, between a substrate layer and an insulator film layer, between an insulating film layer and a semiconductor layer, or on the outer surface of the element. For example, a protective layer may be formed on an organic semiconductor layer directly or via another layer, and it can reduce the effect of the ambient air such as humidity. Such an additional layer can also increase the ON/OFF ratio of a thin film transistor element. Likewise, electric characteristics can be advantageously stabilized.

Examples of the material for the protective layer preferably include, but are not particularly limited to, films made of various types of resins such as an epoxy resin, an acrylic resin, e.g., polymethyl methacrylate, polyurethane, polyimide, polyvinyl alcohol, fluorine resin and polyolefin; and dielectric substance such as inorganic oxide film and a nitride film, e.g., silicon oxide, aluminum oxide and silicon nitride. Particularly, a resin (polymer) having less oxygen or water permeability, or less water absorption ability is preferable. A protective material developed for an organic EL display can be used. Ice film thickness of a protective layer can be optionally selected depending upon the purpose thereof, but it is usually 100 nm to 1 mm.

Thin film transistor properties can be also improved by previously conducting a surface treatment to a substrate or an insulator layer on which an organic semiconductor layer is laminated. For example, controlling the hydrophilic/hydrophobic rate of a substrate surface can allow the film formed on the substrate to be improved in film properties and film formation. Particularly, the organic semiconductor material may sometimes change in characteristics depending upon the conditions of the film such as molecular orientation. Therefore, when a surface treatment is conducted to a substrate, etc., the molecular orientation of an interface portion between, for example, the substrate and an organic semiconductor layer to be formed thereon is controlled, and the number of trap sites on the substrate or the insulator layer is reduced. As a result, characteristics such as carrier mobility would be improved. The trap site refers to a functional group such as a hydroxy group on an untreated substrate. If such a functional group is present, electrons are attracted to the functional group, with the result that carrier mobility is reduced. Therefore, it is often effective to reduce the number of trap sites for improving characteristics such as carrier mobility.

Examples of the substrate treatment for improving characteristics as mentioned above include: hydrophobic treatment with hexamethyldisilazane, octyltrichlorosilane, and octadecyltrichlorosilane; an acid treatment with hydrochloric acid, sulfuric acid, acetic acid or the like; an alkali treatment with sodium hydroxide, potassium hydroxide, calcium hydroxide, ammonia or the like; an ozone treatment; a fluorination treatment; a plasma treatment with oxygen plasma, argon plasma or the like; a treatment by forming a Langmuir-Blodgett film; a treatment by forming a thin film of another insulating material or a semiconductor; a mechanical treatment; an electric treatment with corona discharge or the like; a rubbing treatment with fiber or the like; and a combination thereof. In these embodiments, for example, a method of forming a substrate layer and an insulator film layer, or an insulator film layer and an organic semiconductor layer may be appropriately selected from a vacuum vaporization method, a sputter method, a coating method, a printing method and a sol-gel method.

Regarding a method for manufacturing the thin film transistor element, as an example, a top contact bottom gate type thin film transistor shown in embodiment example B of FIG. 1 will be described based on FIG. 2. It is to be noted that the manufacturing method can be also applied to the thin film transistors of other embodiments as mentioned above or the like.

(Substrate of Thin Film Transistor and Substrate Treatment)

The thin film transistor is manufactured by forming various necessary layers and electrodes on a substrate 6 (see FIG. 2 (1)). A substrate can contain the aforementioned materials. Onto a substrate, e.g., the aforementioned surface treatments can be applied. The thinner the thickness of a substrate 6, the more preferable, as long as a necessary function is maintained. Although the thickness varies depending upon the material, it is usually 1 μm to 10 mm and preferably 5 μm to 5 mm. A substrate may further have a function of an electrode, if necessary.

(Formation of Gate Electrode)

A gate electrode 5 may be formed on a substrate 6 (see FIG. 2 (2)). The aforementioned materials can be used as an electrode material. An electrode film can be formed by various methods. Examples thereof include a vacuum vaporization method, a sputter method, a coating method, a hot printing method, a printing method and a sal-gel method. During or after film formation, if necessary, patterning may be performed so as to form a desired shape. Patterning can be performed by various methods, examples thereof include a photolithographic method in which patterning and etching of a photoresist are combined. Also, patterning can be performed by using a sputtering method, a printing method such as an inkjet printing, a screen printing, an offset printing and a relief printing, a soft lithographic method such as a micro contact printing method, or a combination thereof. The film thickness of a gate electrode 5 varies depending upon the material, but it is usually 0.1 nm to 10 μm, preferably 0.5 nm to 5 μm and more preferably 1 nm to 3 μm. In the case that a gate electrode also acts as a substrate, the film thickness may be larger than the aforementioned one.

(Formation of Insulator Layer)

An insulator layer 4 may be formed on a gate electrode 5 (see FIG. 2 (3)). The insulating material as described above can be used. An insulator layer 4 can be formed by various methods. Examples thereof include a coating method such as spin coating, spray coating, dip coating, cast, bar coating and blade coating; a printing method such as a screen printing, an offset printing and an inkjet printing; and a dry process such as a vacuum vaporization method, a molecular beam epitaxial growth method, an ion cluster beam method, an ion plating method, a sputtering method, an atmospheric pressure plasma method and a CVD method. In addition, included are a sol-gel method, and a method for forming an oxide film on a metal such as an alumite film on aluminum and a dioxide silicon film on silicon, for instance, by a thermal oxidation methodology. Note that, in the area where an insulator layer and a semiconductor layer come into contact with each other, a predetermined surface treatment may be applied to the insulator layer to satisfactorily orient molecules constituting a semiconductor, e.g., molecules of a compound represented by the general formulas (1) to (3), at the interface between both layers. As a surface treatment, the method which is the same as the surface treatment of substrate can be used. The thickness of an insulation layer 4 may be preferably reduced as long as the function of the film is maintained. The film thickness is usually 0.1 nm to 100 μm, preferably 0.5 nm to 50 μm and more preferably 5 nm to 10 μm.

(Formation of Organic Semiconductor Layer)

An organic compound represented by the general formulas (1) to (3) of the present invention is used for forming an organic semiconductor layer as an organic semiconductor material (see FIG. 2 (4)). A film of an organic semiconductor layer can be formed by various methods. Specifically, examples of the method include a vacuum-process such as a sputtering method, a CVD method, a molecular beam epitaxial growth method and a vacuum vaporization method; and a coating method such as a dip coating method, a die coating method, a roll coating method, a bar coating method and a spin coating method; and a solution-process such as an inkjet method, a screen printing method, an offset printing method and a micro contact printing method.

First, a method for obtaining an organic semiconductor layer comprising forming a film of an organic semiconductor material by a vacuum process will be described. The method of forming the layer by a vacuum process may be preferably a vacuum vaporization method, and specifically a process comprising heating and vaporizing an organic semiconductor material as mentioned above in a crucible or a metal boat under vacuum and allowing the vaporized organic semiconductor material to attach (deposit) onto a base (e.g., substrate, an insulator layer, a source electrode and a drain electrode). In the process, a vacuum degree is usually $1.0 \times 10^{-1}$ Pa or less and preferably $1.0 \times 10^{-3}$ Pa or less. It is preferable to carefully select a substrate temperature because characteristics of the organic semiconductor film, or those of a thin film transistor, may change depending upon the temperature of a substrate during vapor deposition. The substrate temperature during vapor deposition is usually 0 to 200° C., preferably 5 to 150° C., more preferably 10 to 120° C., further preferably 15 to 100° C. and particularly preferably 20 to 80° C.

Furthermore, the vapor deposition rate is usually 0.001 nm/second to 10 nm/second and preferably 0.01 nm/second to 1 nm/second. The film thickness of an organic semiconductor layer formed from an organic semiconductor material is usually 1 nm to 10 μm, preferably 5 nm to 5 μm and more preferably 10 nm to 3 μm.

In place of the vapor deposition method in which an organic semiconductor material is heated and vaporized to be deposited on a substrate, other methods can be used to form an organic semiconductor layer.

Next, a method for obtaining an organic semiconductor layer formed by a solution process will be described. An organic compound represented by the general formulas (1) to (3) of the present invention is dissolved in a solvent or the like, and, if necessary, an additive can be added to the solution. The obtained composition can be applied to a substrate (insulator layer, exposed portions of a source electrode and a drain electrode). Examples of an applying method include a coating method such as casting, spin coating, dip coating, blade coating, wire-bar coating and spray coating; a printing method such as inkjet printing, screen printing, offset printing, and relief printing; and a soft lithographic method such as micro contact printing, and a combination method thereof.

In addition, examples of an analogous method to these applying methods capable of being also used include a Langmuir-Blodgett method, in which ink as mentioned above is dropped on a water surface to form a single molecular film of an organic semiconductor layer, which is transferred and laminated onto a substrate; and a method of introducing a liquid crystal material or a molten material between two substrates with the help of a capillary action.

An environment such as the temperatures of a substrate and a composition during film formation time is important. Transistor characteristics may be changed due to the temperatures of a substrate and a composition. Thus, it is preferable that the temperatures of a substrate and a composition are carefully selected. The substrate temperature is usually 0 to 200° C., preferably 10 to 120° C. and more preferably 15 to 100° C. It is to be noted that the substrate temperature varies depending upon the solvent used in the composition.

The less the film thickness of the organic semiconductor layer formed by this method, the more preferable, as long as the function is maintained. As the film thickness increases, leakage current may increase. The film thickness of an organic semiconductor layer is usually 1 nm to 10 μm, preferably 5 nm to 5 μm and more preferably 10 nm to 3 μm.

The organic semiconductor layer thus formed (see FIG. 2 (4)) can be further improved in characteristics by a post treatment. For instance, a heat treatment allows an organic semiconductor property to be improved and stabilized for the reasons that the treatment mitigates strain in a film is relaxed during film formation, that the number of pin holes is reduced and alignment and that orientation of a film can be controlled. Thus, it is effective to apply such a heat treatment in manufacturing the thin film transistor of the present invention in order to improve its properties. The heat treatment is performed by heating a substrate after an organic semiconductor layer is formed. The temperature of a heat treatment is not particularly limited, but it is usually from room temperature to about 150° C., preferably from 40 to 120° C. and further preferably from 45 to 100° C. The time for a heat treatment is not particularly limited, but it is usually from 10 seconds to 24 hours and preferably about 30 seconds to 3 hours. The atmosphere during heat treatment may be air or an atmosphere of an inert gas such as nitrogen or argon.

Another post treatment method for an organic semiconductor layer may be applied, including a treatment with an oxidizing or reducing gas such as oxygen or hydrogen or an oxidizing or reducing liquid. The treatment allows change in characteristics to be induced to the layer through oxidation or reduction. For instance, the treatment can be applied to increase or reduce the density of a carrier in the film.

Furthermore, the properties of an organic semiconductor layer can be changed by a doping process, which comprises adding a small amount of element, atomic group, molecule or polymer to an organic semiconductor layer. For instance, the following can be doped: an acid such as oxygen, hydrogen, hydrochloric acid, sulfuric acid and sulfonic acid; a Lewis acid such as $PF_5$, $AsF_5$ and $FeCl_3$; a halogen atom such as an iodine atom; and a metal atom such as a sodium atom and a potassium atom. The doping can be attained by bringing these gases into contact with an organic semiconductor layer, immersing an organic semiconductor layer in these solutions or applying an electrochemical doping treatment. These doping processes may not, be performed after formation of an organic semiconductor layer. A dopant may be added during synthesis of an organic semiconductor compound. Alternatively, in a process where an organic semiconductor layer is formed from ink to manufacture an organic semiconductor element, a dopant can be added to the ink or in a step of forming a thin film. Furthermore, code position may be made by adding a material for use in doping to a material for forming an organic semiconductor layer by vapor deposition. Furthermore, a doping material may be mixed with an ambient atmosphere where an organic semiconductor layer is formed (whereby an organic semiconductor layer can be formed under an ambient atmosphere containing a doping material). Furthermore, ions accelerated in vacuum can be bombarded to a film, thereby conducting the doping.

Examples of the effect of these doping processes include a change in electric conductivity due to an increase or decrease of a carrier density, a change in polarity of carrier (P-type, N-type) and a change in the Fermi level.

(Protective Layer)

Formation of a protective layer 7 on an organic semiconductor layer is advantageous because the ambient atmospheric effect can be minimized and the electric characteristics of an organic thin film transistor can be stabilized. (see FIG. 2 (6)). A material for the protective layer is as mentioned above. The film thickness of a protective layer 7 may be selected depending upon the purpose, but it is usually 100 nm to 1 μm.

Various methods can be employed in forming a protective layer. In the case that a protective layer is formed from a resin, for instance, the following may be employed: a method of applying a resin solution and drying it to form a resin film; and a method of applying or depositing a resin monomer and then polymerizing it. After the film is formed, a crosslinking treatment may be applied. In the case that a protective layer is formed from an inorganic material, for instance, the following may be employed: a vacuum process such as a sputtering method and a vapor deposition method; and a solution process such as a sol-gel method.

In a thin film transistor, a protective layer can be provided not only on an organic semiconductor layer but also between individual layers, if necessary. These layers may be helpful to stabilize electric characteristics of a thin film transistor.

Since the organic compound represented by the general formulas (1) to (3) is used as an organic semiconductor material, a thin film transistor can be manufactured by a relatively low temperature process. Therefore, a flexible material, such as a plastic plate and a plastic film, which has not been used under conditions exposed to high temperature, can be used as a substrate. As a result, an irrefrangible element with a light weight and an excellent flexibility can be manufactured and can be used as e.g., a switching device of an active matrix of a display.

The thin film transistor can be used also as digital elements and analog elements such as a memory circuit element, a signal driver circuit element and a signal processing circuit element. Furthermore, they are used in combination to form an IC card, an IC tag or the like. Furthermore, the thin film transistor, since change in characteristics thereof can be caused by external stimulation such as a chemical substance, can be used as an FET sensor.

(Organic EL Element)

Next, an organic EL element will be described.

An organic EL element has attracted attention by the characteristics that it is can be applied in a solid form to a self-luminous large-area color display, lighting and the like, and lots of elements have been developed. The structure of an organic EL element may be a structure comprising two layers of a light emitting layer and a charge transport layer between opposed electrodes consisting of cathode and an anode; a structure comprising three layers of an electron transport layer, a light emitting layer and a hole transport layer laminated between the electrodes opposed to each other; or a structure comprising three layers or more between the electrodes opposed to each other. It may be also a structure comprising a light emitting layer as a single layer.

The hole transport layer is a layer for allowing holes to be injected from an anode, and transporting the holes to a light emitting layer, and has a function of facilitating injection of holes to a light emitting layer and a function of blocking electrons. Furthermore, the electron transport layer is a layer for allowing electrons to be injected from a cathode, and transporting the electrons to a light emitting layer, and has a function of facilitating injection of electrons to a light emitting layer and a function of blocking holes. In the light emitting layer, the electrons and the holes separately injected are reunited to generate excitons. Energy is emitted in the process where the excitons radiate and lose activity. This energy is detected as emission of light. Now, preferable embodiments of the organic EL element will be described below.

An anode that can be used in the organic EL element is an electrode having a function of injecting holes into a hole injection layer, a hole transport layer and a light emitting layer. Generally, a metal oxide, a metal, an alloy or a conductive material having a work function of 4.5 eV or more are suitable for the anode. Examples thereof include, but are not particularly limited to, a conductive metal oxide such as tin oxide (NESA), indium oxide, indium tin oxide (ITO) and indium zinc oxide (IZO), a metal such as gold, silver, platinum, chromium, aluminum, iron, cobalt, nickel and tungsten, an inorganic conductive substance such as copper iodide and copper sulfide, a conductive polymer such as polythiophene, polypyrrole and polyaniline and carbon. Among them, ITO and NESA are preferable.

An anode may be formed from, if necessary, a plurality of materials and constituted of two layers or more. The resistance of an anode is not limited as long as sufficient current for light emission of an element can be supplied, but it is preferably lower in view of power consumption of the device. For example, an ITO substrate having a sheet resistance value of 300 $\Omega/\square$ or less would function as an electrode. However, a substrate having a sheet resistance value of several $\Omega/\square$ has been available, and it is thus desirable to select a substrate having low resistance. The thickness of an ITO substrate can be optionally selected depending on a resistance value, but it may be usually in the range of between 5 and 500 nm and preferably between 10 and 300 nm. Examples of a method for forming a film such as ITO include a vapor deposition method, an electron beam method, a sputtering method, a chemical reaction method and an application method.

A cathode that can be used in the organic EL element is an electrode having a function of injecting electrons into an electron injection layer, an electron transport layer and a light emitting layer. Generally, a metal and an alloy having a small work function (about 4 eV or less) are suitable for that cathode. Examples thereof include platinum, gold, silver, copper, iron, tin, zinc, aluminum, indium, chromium, lithium, sodium, potassium, calcium and magnesium. To improve element characteristics by increasing an electron injection efficiency, lithium, sodium, potassium, calcium and magnesium are preferable. An alloy includes an alloy with a metal having a low work function including aluminum or silver. Alternatively, these may be laminated to form the electrode structure. An electrode of a layered-structure may be composed of an inorganic salt, such as lithium fluoride. If emission light is taken out not from the anode side but from the cathode side, a transparent electrode which can be formed at a low temperature can be employed. Examples of a film-formation method include, but are not particularly limited to, a vapor deposition method, an electron beam method, a sputtering method, a chemical reaction method and a coating method. The resistance of a cathode is not limited as long as sufficient current for light emission of an element can be supplied, but it is preferably lower in view of power consumption of the element. Specifically, several hundreds to several $\Omega/\square$ is preferable. The film thickness usually falls within the range of 5 to 500 nm and preferably 10 to 300 nm.

For the purpose of sealing and protection, a cathode may be protected by an oxide or a nitride such as titanium oxide, silicon nitride, silicon oxide, silicon oxynitride and germanium oxide or a mixture thereof, polyvinyl alcohol, vinyl chloride, a hydrocarbon polymer or a fluorine polymer, and sealed together with a dehydrating agent such as barium oxide, phosphorus pentoxide and calcium oxide.

To take out light emission, it is preferable to form an electrode on a substrate having sufficient transparency generally within a light emission wavelength range of an element. Examples of a transparent substrate include a glass substrate and a polymer substrate. A glass substrate may be from soda lime glass, non-alkali glass or quartz. A glass substrate may have a thickness sufficient to keep mechanical/thermal strength, preferably a thickness of 0.5 mm or more. A glass material may be preferably a material having less ion elution. Non-alkali glass is more preferable. As a glass material having such a property, soda lime glass having a barrier coating of $SiO_2$ is commercially available. Examples of a polymer substrate include polycarbonate, polypropylene, polyethersulfone, polyethylene terephthalate and acryl substrate.

An organic thin film of an organic EL element is composed of a single layer or a plurality of layers between anode and cathode electrodes. An organic compound represented by the general formulas (1) to (3) is added to the organic thin film, which allows an obtained element to emit light by electric energy.

The "layer" of a single layer or a plurality of layers constituting an organic thin film refers to a hole transport layer, an electron transport layer, a hole transport light emitting layer, an electron transport light emitting layer, a hole blocking layer, an electron blocking layer, a hole injection layer, an electron injection layer, a light emitting layer or a single layer having the functions possessed by these layers, as shown in the following structural example 9). In the present invention, examples of the structure of a layer constituting an organic thin film include the following structural examples 1) to 9). Any of the structures may be employed.

Structural Examples

1) Hole transport layer/electron transport light emitting layer.
2) Hole transport layer/light emitting layer/electron transport layer.
3) Hole transport light emitting layer/electron transport layer.
4) Hole transport layer/light emitting layer/hole blocking layer.
5) Hole transport layer/light emitting layer/hole blocking layer/electron transport layer.
6) Hole transport light emitting layer/hole blocking layer/electron transport layer.
7) Structure formed by adding a single hole injection layer to each of the structures 1) to 6) before the formation of the hole transport layer or the hole transport light emitting layer.
8) Structure formed by adding a single electron injection layer to each of the structures 1) to 7) before the formation of the electron transport layer or the electron transport light emitting layer.
9) Structure consisting of a single layer containing the mixture of the materials constituting the layers of each of the structures 1) to 8).

The structure 9) may consist of a single layer made of a material generally called a bipolar light emitting material; or a single layer containing a light emitting material, and a hole transport material or an electron transport material. Generally, a multi-layer structure allows charges, i.e., holes and/or electrons, to be efficiently transported and reunited. Furthermore, quenching of charges can be suppressed, thereby preventing stability of an element from decreasing and improving efficiency of light emission.

A hole injection layer and transport layer are formed by laminating a hole transport material alone or a mixture of two or more hole transport materials.

Examples of a hole transport material preferably include a triphenyl amine such as N,N'-8-diphenyl-N,N'-di(3-methylphenyl)-4,4'-diphenyl-4,4'-diamine and N,N'-dinaphthyl-N,N'-diphenyl-N,N'-diphenyl-1,1'-diamine; a heterocyclic compound such as a bis(N-allylcarbazole), or a bis(1,1'-alkylcarbazole), a pyrazoline derivative, a stilbene compound, a hydrazone compound, a triazole derivative, an oxadiazole derivative and a porphyrin derivative; and a polymer such as a polycarbonate and a styrene derivative having a monomer as mentioned above as a side chain, polyvinylcarbazole and polysilane. A hole transport material is not particularly limited as long as it can form a thin film required for the element and is capable of injecting holes from an electrode and transporting holes. A hole injection layer, which is provided between a hole transport layer and an anode to improve a hole injection property, may be formed from a phthalocyanine derivative, a star burst amine such as m-MTDATA, and a polymer such as a polythiophene (e.g., PEDOT) and a polyvinylcarbazole derivative.

An electron transport material is required to efficiently transport electrons between the electrodes to which an electric field is applied and from the negative electrode. An electron transport material preferably has high electron injection efficiency and efficiently transports electrons injected. Accordingly, an electron transport material is required to have high electron affinity, large electron mobility and excellent stability, and to generate few impurities acting as a trap during manufacturing and use. Examples of such a substance satisfying these conditions include, but are not particularly limited to, a quinolinol derivative/metal complex represented by tris(8-quinolinolato)aluminum complex, a tropolone/metal complex, a perylene derivative, a perinone derivative, a naphthalimide derivative, a naphthalic acid derivative, an oxazole derivative, an oxadiazole derivative, a thiazole derivative, a thiadiazole derivative, a triazole derivative, a bisstyryl derivative, a pyrazine derivative, a phenanthroline derivative, a benzoxazole derivative and a quinoxaline derivative. These electron transport materials can be used alone or in combination with another electron transport material in the form of a laminate or as a mixture. Examples of an electron injection layer, which is provided between an electron transport layer and a cathode to improve electron injection property, include a metal such as cesium, lithium and strontium, and lithium fluoride.

A hole blocking layer is formed from a hole blocking substance alone or two types or more hole blocking substances in the form of a laminate or as a mixture. Examples of a hole blocking substance preferably include a phenanthroline derivative such as bathophenanthroline and bathocuproine, a silole derivative, a quinolinol derivative/metal complex, an oxadiazole derivative and an oxazole derivative. A hole blocking substance is not particularly limited as long as it is capable of blocking holes from discharging out of an element from the cathode side, thereby preventing luminous efficiency from decreasing.

A light emitting layer refers to an organic thin film which emits light and includes a hole transport layer, an electron transport layer or a bipolar transport layer which is capable of emitting intensive light. A light emitting layer may be only formed from a light emitting material (e.g., host material, dopant material). This may be either a mixture of a host material and a dopant material or a host material alone. Each of a host material and a dopant material may be a single material or a mixture of plurality of materials.

A dopant material may be contained either wholly or partly in the host material. A dopant material may be either laminated or dispersed. Examples of a light emitting layer include a hole transport layer and an electron transport layer as mentioned above. Examples of the materials for a light emitting layer include a carbazole derivative, an anthracene derivative, a naphthalene derivative, a phenanthrene derivative, a phenylbutadiene derivative, a styryl derivative, a pyrene derivative, a perylene derivative, a quinoline derivative, a tetracene derivative, a perylene derivative, a quinacridone derivative, a coumarin derivative, a porphyrin derivative, and a phosphorescence metal complex (e.g., Ir complex, Pt complex and Eu complex).

Examples of a method for forming an organic thin film of an organic EL element generally include a vacuum process such as resistance heating vapor deposition, electron beam vapor deposition, sputtering and a molecular stacking method; a solution process such as a coating method including casting, spin coating, dip coating, blade coating, wire-bar coating and spray coating; a printing method including inkjet printing, screen printing, offset printing and relief printing; a soft lithographic method including a micro contact printing method; and a combination of these methods. The thickness of each layer varies depending upon the resistance values/charge mobility of individual substances. Thus, it is not particularly limited but selected from the range between 0.5 and 5000 nm, preferably between 1 and 1000 nm and more preferably between 5 and 500 nm.

Among the organic thin films constituting an organic EL element, a single or a plurality of thin films including a light emitting layer, a hole transport layer or an electron transport layer present between an anode electrode and a cathode electrode can contain an organic compound represented by the general formulas (1) to (3), thereby obtaining an element efficiently emitting light even at low electric energy.

An organic compound represented by the general formulas (1) to (3) can preferably constitute a hole transport layer, a light emitting layer or an electron transport layer. The organic compound can be also combined or mixed with an electron transport material or a hole transport material and a light emitting material.

When the organic compound represented by the general formulas (1) to (3) is used as a host material in combination with a dopant material, examples of the dopant material specifically include, but are not limited to, a perylene derivative such as bis(diisopropyl phenyl)perylenetetracarboxylic imide, a perinone derivative, 4-(dicyanomethylene)-2-methyl-6-(p-dimethylaminostyryl)-4H-pyran (DCM) and its analogue, a metal phthalocyanine derivative such as magnesium phthalocyanine and aluminum chlorophthalocyanine, a rhodamine compound, a deazaflavin derivative, a coumarin derivative, an oxazine compound, a squarylium compound, a violanthrone compound, Nile red and a pyrromethene derivative such as 5-cyanopyrromethene-$BF_4$ complex. Furthermore, included are a phosphorescence material such as an Eu complex containing acetyl acetone or benzoyl acetone and phenanthroline as a ligand, and a porphyrin or ortho metal complex such as an Ir complex, an Ru complex, a Pt complex and an Os complex. When two types of dopant materials are mixed, an assist dopant such as rubrene can be contained to efficiently transfer energy from a host dye, thereby obtaining light emission with improved color purity in either case, a dopant having a high fluorescence quantum yield can be preferably contained to obtain high brightness property.

If a dopant material is contained too much, a concentration quenching phenomenon occurs. Thus, a dopant material may be contained usually in an amount of 30 mass % or less relative to a host material, preferably 20 mass % or less, further preferably 10 mass % or less. A method of doping a dopant material to a host material in a light emitting layer may be performed by co-depositing the dopant with the host material. A dopant material may be also previously mixed with a host material, and the mixture may be subjected to co-vapor deposition. The doping can be also performed by sandwiching the dopant material between host materials. In this case, a single or two or more dopant layers may be laminated with a host material layer.

These dopant layers may each form a layer alone, or mixed dopant materials may be used. Furthermore, a dopant material can be dissolved or dispersed in a polymer binder such as a solvent-soluble resin including polyvinyl chloride, polycarbonate, polystyrene, polystyrene sulfonic acid, poly (N-vinylcarbazole), poly(methyl) (meth)acrylate, polybutyl methacrylate, polyester, polysulfone, polyphenylene oxide, polybutadiene, a hydrocarbon resin, a ketone resin, a phenoxy resin, polysulfone, polyamide, ethylcellulose, vinyl acetate, an ABS resin and a polyurethane resin; or a curable resin including a phenolic resin, a xylene resin, a petroleum resin, a urea resin, a melamine resin, an unsaturated polyester resin, an alkyd resin, an epoxy resin and a silicone resin.

The organic EL element can be suitably applied to a flat panel display. It can be further applied to a flat backlight. In this case, the element can be applied to not only a backlight emitting color light but also a backlight emitting white light. A backlight is principally used for the purpose of improving visibility of a display apparatus not emitting light by itself, and applied to e.g., a liquid crystal display apparatus, a clock, an audio instrument, an automobile panel, a display board and an indicator. Particularly, a conventional backlight for use in a liquid crystal display apparatus, in particular, for a personal computer (reducing thickness remains a problem) has been composed of a fluorescent light or a light guide plate, which makes it difficult to reduce the thickness. However, a backlight composed of a light emitting element of the present invention is characterized by being thin and light and can thus overcome the above problems. Similarly, an organic EL element of the present invention can be advantageously applied to a lighting device.

The organic compound represented by the general formulas (1) to (3) of the present invention can provide an organic EL display apparatus having a high emitting efficiency and a long life. Furthermore, thin film transistor elements of the present invention can be combined to provide an organic EL display apparatus capable of electrically controlling an ON/OFF phenomenon of applied voltage with high accuracy at low cost.

(Organic Solar Cell Element)

Next, an organic solar cell device will be described. The organic compound represented by the general formulas (1) to (3) of the present invention can be used to easily manufacture a flexible and inexpensive organic solar cell element. That is, the organic solar cell element is more advantageous in flexibility and improved life, because an electrolyte as used in a dyed-sensitized solar cell is not used. Conventionally, development of a solar cell containing an organic semiconductor thin film in combination with a conductive polymer or fullerene has been in a mainstream, but the solar cell has a problem with a photoelectric conversion efficiency.

In general, an organic solar cell element is constructed in the same manner as in a silicon solar cell, i.e., by sandwiching a layer generating power (a power generating layer) between an anode and a cathode. The element functions as a solar cell by absorbing light to generate holes and electrons and receives the holes and electrons at each of the electrodes. The power generation layer thereof may be composed of a P-type material, an N-type material and other materials (e.g., buffer layer). If these materials are organic materials, the resultant solar cell is referred to as an organic solar cell.

Examples of the structure thereof include Schottky junction, heterojunction, bulk heterojunction, nanostructure junction and hybrid. The element functions as a solar cell by efficiently absorbing incident light by the individual materials, generating charges, separating the charges into holes and electrons, transporting the holes and electrons and collecting them.

Now, components of an organic solar cell element will be described.

An anode and a cathode of the organic solar cell element are the same as defined in an organic EL element as mentioned above. Since light has to be efficiently absorbed, an electrode is desirably transparent to light within a wavelength region absorbed by a power generation layer. In order to have satisfactory solar cell characteristics, it is preferable that the sheet resistance thereof is 20Ω/□ or less.

The power generation layer is composed or a plurality of organic thin films containing at least an organic compound represented by the general formulas (1) to (3) of the present invention. An organic solar cell element may have the structure previously mentioned; however, it may be basically constructed of a P-type material, an N-type material and a buffer layer.

Examples of a P-type material basically include the same hole transport compounds as those for the hole injection layer and the hole transport layer as described in the section of an organic element, π conjugated polymers such as a polyparaphenylene vinylene derivative, a polythiophene derivative, a polyfluorene derivative and a polyaniline derivative; and polymers having a carbazole and other heterocyclic ring in a side chain. Examples of the P-type material further include a pentacene derivative, a rubrene derivative, a porphyrin derivative, a phthalocyanine derivative, an indigo derivative, a quinacridon derivative, a merocyanine derivative, a cyanine derivative, a squarylium derivative and a benzoquinone derivative.

Examples of the N-type material basically include the same electron transport compounds as those for the electron transport layer as described in the section of an organic EL element; polymer materials such as an oligomer or polymer having pyridine or a derivative thereof as the skeleton, an oligomer or polymer having quinoline or a derivative thereof as the skeleton, a polymer having benzophenanthroline or a derivative thereof, and a high molecular weight material such as a cyanopolyphenylene vinylene derivative (e.g., CN-PPV); and low molecular weight materials such as a fluorinated phthalocyanine derivative, a perylene derivative, a naphthalene derivative, a bathocuproine derivative, and a fullerene derivative such as C60, C70 and PCBM. Materials capable of efficiently absorbing light to generate charges are preferable, and materials having a high absorbance index are preferable.

The organic compound represented by the general formulas (1) to (3) of the present invention can be preferably used particularly as a N-type material. A method for forming a thin film acting as a power generation layer of an organic solar cell is the same as previously described in the section of an organic element. The thickness of a thin film varies depending upon the structure of a solar cell. The thicker the film, the more preferable to sufficiently absorb light and prevent short circuit. On the other hand, the thinner the film, the more suitable to shorten the distance for transporting charges generated. In general, the thickness of a power generation layer is preferably about 10 to 5000 nm, (Organic Semiconductor Laser Element)

The organic compound represented by the general formulas (1) to (3) of the present invention has an organic semiconductor property and is expected to be applied to an organic semiconductor laser element. That is, if carrier density under the excited state can be enhanced by effective injection of carrier by incorporating a resonant structure into the organic semiconductor element containing the organic compound represented by the general formulas (1) to (3), it is expected that laser oscillation can be attained by amplification of laser. Conventionally, a laser oscillation is observed only, therefore, it is said that high density excited status is very difficult to be generated by injecting carriers having high density into an organic semiconductor element, which is needed for laser oscillation due to electricity excitation. However, by using the organic semiconductor device containing an organic compound represented by the general formulas (1) to (3), the possibility of high effective light emitting (electroluminescent) is expected.

(Organic Light Emitting Transistor)

Next, an organic light emitting transistor is described. The organic compound represented by the general formulas (1) to (3) can be used for an organic light-emitting transistor. A light emitting transistor where an organic transistor is combined with an organic electroluminescence device has a structure where a drive circuit and a light emitting part in the display are integrated, and due to the structure, an occupation area of the driving transistor circuit can be reduced and an aperture rate of the display part can be increased. That is, the reduction of the number of the parts and the simple manufacturing process can provide a low-cost display. Theoretically, from the source and the drain electrodes of the organic light emitting transistor, electrons and holes are injected into an organic light-emitting material at the same time to conduct the recombination. The amount of the light emission can be controlled by electric field from a gate electrode.

The structure can be the same as the structure explained in the organic light emitting transistor described above. A light emitting transistor material can be used in place of the constitution of the semiconductor layer for the organic light emitting transistor. Materials and processes can be appropriately selected in accordance with the characteristics of the semiconductor compound, and a constitution for emitting a light to the outside is desirable. In usual organic light-emitting transistors, either one of an electron or a positive hole is injected. In the case of a light emitting transistor, a structure for promoting effective injection of an electric charge from an electrode, combination and light emission is preferred, because light emission is conducted due to the combination of an electron and a positive hole in a semiconductor layer.

(Photoelectric Conversion Element)

Next, a photoelectric conversion element is explained.

A photoelectric conversion film including the organic compound represented by the general formulas (1) to (3) can be used as a photoelectric conversion element. In particular, the organic compound represented by the general formulas (1) to (3) can be suitably used as a material of the photoelectric conversion layer.

The photoelectric conversion element is an element where a photoelectric conversion part including a photoelectric conversion film is provided between two electrode films (an upper electrode and a lower electrode) which are opposite to each other. From the upper side of one of the electrodes, light falls into the photoelectric conversion part. The photoelectric conversion part produces electrons and holes according to the amount of the incident light. A semiconductor reads out signals according to the charge so as to reveal the amount of the incident light according to an absorption wavelength of the photoelectric conversion part. The lower electrode film may be connected to a transistor for the reading out.

When some of the photoelectric conversion elements are provided in arrays, the photoelectric conversion element is an imaging element, because the incident light position information is provided in addition to incident light amount. Regarding the incident of light, when the light of the wavelength absorbed by a photoelectric conversion element located posteriorly is not inhibited by a photoelectric conversion element located more anteriorly, a plurality of the photoelectric conversion elements may be layered. Besides, when each of the photoelectric conversion element absorbs different visible light, the imaging element can be a multi-color imaging element, that is, a full color photodiode can be obtained.

FIG. 3 shows an embodiment of the photoelectric conversion element. In each embodiment of FIG. 3, reference number 11 represents an insulation, reference number 12 represents an upper electrode, reference number 13 represents an electron blocking layer, reference number 14 represents a photoelectric conversion part, reference number 15 represents a hole blocking layer, reference number 16 represents a lower electrode and reference number 17 represents an insulation substrate or a photoelectric conversion element. In the figure, a transistor for reading out is not shown, but the transistor may be connected to the lower electrode. If a semiconductor is transparent, a film transistor may be formed below the lower electrode. The light is provided from the upper side or the bottom side, as long as the part other than the photoelectric conversion element largely does not inhibit the light of the absorption wavelength of the photoelectric conversion part.

The photoelectric conversion part (reference number 14) is often comprised of a plurality of layers such as a photoelectric conversion layer, an electron transport layer, a hole transport layer, an electro blocking layer, a hole blocking layer, a crystallization prevention layer and an interlayer contact improvement layer, however, is not limited to these.

An organic semiconductor film (photoelectric conversion film) is generally used for a photoelectric conversion layer. The organic semiconductor film may be comprised of a single layer, or a plurality of layers. In the case of the single layer, a P-type organic semiconductor film, an N-type organic semiconductor film or a mixture films (bulk heterostructure) thereof are used. In the case of multilayers, the organic semiconductor film contains around 2-10 layers and the structure is a structure where any of a P-type organic semiconductor film, an N-type organic semiconductor film or mixed films (bulk heterostructure) thereof is laminated, and a buffer layer may be inserted between the layers.

As necessary, for an organic semiconductor film, a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a melocyanine compound, an oxonol compound, a polyamine compound, an indole compound, a pyrrole compound, a pyrazole compound, a polyarylene compound, a carbazole derivative, a naphthalene derivative, an anthracene derivative, a phenanthrene derivative, a phenyl butadiene derivative, a styryl derivative, a quinoline derivative, a tetracene derivative, a pyrene derivative, a perylene derivative, a fluoranthene derivative, a quinacridone derivative, a coumalin derivative, a porphyrin derivative or a phosphorescence metal complex (Ir complex, Pt complex and Eu complex) can be used depending on a wavelength range of absorption.

A hole transport layer has a function to transport holes which is occurred from a photoelectric conversion layer to an electrode and to facilitate the transportation of holes from a photoelectric conversion layer to an electrode, and also has a function to block electrons from an electrode. An electron transport layer has a function to transport an electron which is occurred from a photoelectric conversion layer to an electrode and to facilitate the transportation of electrons from a photoelectric conversion layer to an electrode, and also has the function to block holes from an electrode.

A hole blocking layer has the function to disturb the movement of holes from an electrode to a photoelectric conversion layer and to prevent recombination in the photoelectric conversion layer so as to reduce a dark current. An electron blocking layer has a function to disturb the movement of electrons from an electrode to a photoelectric conversion layer and to prevent recombination in the photoelectric conversion layer so as to reduce a dark current. The hole blocking layer and the electron blocking layer preferably has a high transmittance at the absorption wavelength of the photoelectric conversion layer or is used as a thin film so as not to disturb the absorption of light of the photoelectric conversion film.

In a photoelectric conversion layer, incident light is received to transport electrons and holes occurred to electrodes, thereby tanking out and sending an electron signal to a readout circuit.

An electronic film used for a photoelectric conversion element can be selected in view of coherency with an adjacent film such as a hole transportability photoelectric conversion film and a hole transportation film, or other adjacent film such as an electron transportability photoelectric conversion film and an electronic transport film, electron affinity, ionization potential, stability and so on, because holes are taken from a photoelectric conversion film having hole transportability or hole transport film contained in a photoelectric conversion layer and received, or because electrons are taken from a photoelectric conversion film having electron transportability or electron transport film contained in a photoelectric conversion layer and provided. Materials for electrode film are not particularly limited, but examples of the materials include conductive metal oxides such as tin oxide (NESA), indium oxide, indium tin oxide (ITO), and indium zinc oxide (IZO); metals such as gold, silver, platinum, chrome, aluminum, iron, cobalt, nickel and tungsten; inorganic conductive materials such as copper iodide and copper sulfide; conductive polymer such as polythiophene, polypyrrole and polyaniline; and carbon. As necessary, for the electrode film, a plurality of materials can be used. Furthermore, the electrode film can be comprised of two or more of layers. A resistance of the electrode is not limited as long as light receipt of device is not disturbed beyond necessity. However, in view of signal strength and power consumption, the resistance is preferably low. For examples, ITO substrate having a value of seat resistance of $300\Omega/\square$ or less can work as a device electrode. A substrate having a seat resistance of several $\Omega/\square$ is available. Therefore, using a low resistance substrate is desirable. A thickness of the ITO can be optionally selected in accordance with a resistance value. The thickness is usually within 5 to 500 nm, preferably within 10 to 300 nm. Examples of a method for forming a film such as an ITO film include a vapor deposition method, an electron beam method, a sputtering method, a chemical reaction method and an applying method. As needed, a UV-ozonation treatment and a plasma treatment, etc., can be conducted.

A material for a transparent electrode film which is particularly preferred is any material of ITO, IZO, $SnO_2$, ATO (antimonial doped tin oxide), ZnO, AZO (Al doped zinc oxide), GZO (gallium doped zinc oxide), $TiO_2$, and FTO (fluorine doped oxide tin).

A light transmittance of a transparent electrode film is preferably 60% or more, more preferably 80% or more, more preferably 90% or more, more preferably 95% or more at an absorption peak wavelength of a photoelectric conversion film included in a photoelectric conversion part including the transparent, electrode film.

When plural photoelectric conversion layers are laminated, it is necessary for the electrodes which are inside of the laminated film to transmit a light having a wavelength except for the light which is detected by each electrode film. As a material for the electrode, a material through which a light of 90% or more to the absorbed light penetrates is preferably used, and a material which a light of 95% or more to the absorbed light penetrates is further preferably used.

An electrode film is preferably manufactured under plasma-free. By manufacturing an electrode film under plasma-free, the influence of plasma to a substrate can be reduced to improve photoelectric conversion characteristics. The term "plasma-free" is meant to be conditions of no plasma during formation of an electrode film, or conditions of reduced plasma reaching a substrate wherein the distance between the plasma generation source and the substrate is 2 cm or more, preferably 10 cm or more, and further preferably 20 cm or more.

Examples of an apparatus producing no plasma during formation of an electrode film include an electron beam vapor deposition apparatus (EB vapor deposition apparatus) and a pulse laser vapor deposition apparatus. In the following, a method for forming a transparent electrode film using an EB vapor deposition apparatus is called EB vapor deposition method, and a method for forming a transparent electrode film by a pulse laser vapor deposition apparatus is called a pulse laser vapor deposition method.

Regarding the apparatus capable of realizing the conditions to reduce plasma during film formation (referred to as a plasma free film formation apparatus), the examples include an opposed target type sputtering apparatus and an arc plasma vapor deposition method.

When a transparent conductive film such as TCO is used as an electrode film, DC short out or leak current increase may occur. As one of these causes, it is conceivable that fine cracks introduced into a photoelectric conversion film is coated by dense films such as the TCO to increase electric conduction between the photoelectric conversion film and the opposite electrode film. In the case of an electrode that the film quality is inferior to, such as Al, the increase of the leak current is hard to occur. By controlling the thickness of electrode film to a thickness of the photoelectric conversion film (depth of the clacks), the increase of the leak current may be greatly suppressed.

When a thickness of a conductive film decreases below a specific region, sudden increase of the resistance value may be observed. In the solid imaging element of the present embodiment, the seat resistance may be preferably 100 to 10000Ω/□. The thickness capable of making a thin film may be changed in wide flexibility. When the thickness of a transparent conductive thin film decreases, the amount of absorbed light decreases and the light transmittance generally increases. Increasing the light transmittance enhances light absorbance in a photoelectric conversion film so as to improve the photoelectric conversion ability, which is very preferred.

A hole blocking layer is formed of a hole blocking material only or by laminating or mixing two or more types of the hole blocking materials. As a hole blocking material, phenanthroline derivatives such as bathophenanthroline and bathocuproine, silole derivatives, quinolinol derivative metal complexes, oxadiazole derivatives and oazole derivatives are used. A hole blocking material is not limited, as long as the hole blocking material is a compound which prevents drain of holes toward the outside of electrodes. A method for forming a thin film of a hole blocking layer of a photoelectric conversion element can be the ones described below. For the purpose of preventing the leak of current, the thickness is preferably thin. For the purpose of reading out the signal at the time of light incident, the thickness is preferably thin because sufficient current amount is needed. Generally, as a power generation layer, a thickness of around 5 to 500 nm is preferable.

As a method for forming an organic thin film of a photoelectric conversion element, resistance heating vapor deposition, electron-beam deposition, sputtering and molecule laminating method which are vacuum processes; coating methods such as casting, spin-coating, dip coating, blade coating, wire bar coating and spray coating, printing methods such as in: jet printing, screen-printing, offset printing and relief printing, software lithography methods such as microcontact printing method which are solution processes; and a method including the combinations of two or more of these methods may be used. The thickness of each layer cannot be limited, because the resistance and charge mobility of each material should be considered, but the thickness is selected from the range of 0.5 to 5000 nm. The thickness is preferably 1 to 1000 nm, and more preferably 5 to 500 nm.

The element capable of effectively converting to the electric signal even in weak light energy can be obtained by introducing the organic compound represented by the general formulas (1) to (3) into one or two or more of layers of the thin films such as a photoelectric conversion layer, a hole transport layer, a hole blocking layer, an electron transport layer and an electron blocking layer which are located between the electrodes.

(Light Sensor and Image Sensor)

A photoelectric conversion element is used as a light sensor, by entering light from a transparent or semitransparent electrode side and flowing photocurrent under the conditions to keep applying voltage on the electrodes or the conditions to apply no voltage. A module made by accumulating two or more of the light sensors and making modularization is used as an image sensor. A module is a device including a plurality of photoelectric conversion elements. The module is constituted of a plurality of photoelectric conversion elements accumulated. The module includes an image sensor etc. A light sensor includes a device such as a near infrared sensor.

A near infrared sensor is meant to be applied technique to receive light having an infrared range (infrared ray), convert to an electric signal, and read out the needed information, or an apparatus using the technique. A near infrared sensor has characteristics to able to see an object without stimulating human sight and to measure a temperature of an object instantly with a non-contacting manner from a distance. An infrared film or an infrared image sensor which is sensitive to near infrared light is used to take an image which is different from a visible image to the naked eye.

(Application of Photoelectric Conversion Element)

The photoelectric conversion element containing the organic compound represented by the general formulas (1) to (3) can be applied to fields of a camera, a digital still camera, an infrared camera and so on by using devices such as a light sensor using excellent photoelectric conversion property and infrared-absorbing property.

As another application, it can be used for the applications such as digital video camera, sensors for monitoring cameras (for an office building, a parking area, a financial institution, a unmanned contract machine, a shopping center, a convenience store, an outlet mall, a department store, a pachinko saloon, a karaoke room, an amusement arcade and a hospital), various sensors (a TV door phone, a sensor for personal identification, a sensor for factory automation, a home robot, an industrial robot and a piping inspection system), medical sensors (for an endoscope and a fundus camera), a teleconference system, a picturephone, a mobile phone with a camera, an automobile safety system (for a back guiding monitor, a collision prediction, a traffic lane keeping system), and video game sensors.

Hereinafter, the present invention will be described in more detail in the following Examples. However, these Examples are not intended to limit the scope of the present invention. In the Examples, the term "part" indicates part by mass, and the symbol "%" indicates % by mass, unless otherwise specified. In addition, the reaction temperature indicates an internal temperature in the reaction system, unless otherwise specified.

Compounds 2-1 to 2-6 found in the following Synthesis Examples were synthesized in accordance with known publications (see Org. Lett., 2011, 4547, etc.). Various types of compounds obtained in Synthesis Examples were measured in terms of MS (mass spectrum) and NMR (nuclear magnetic resonance spectrum), as necessary, so that the structural formulas thereof were determined.

Moreover, in the following Examples, the current and voltage applied were measured using a semiconductor parameter analyzer 4200-SCS (Keithley Instruments, Inc.), unless otherwise specified. For irradiation with an incident light, PVL-3300 (Asahi Spectra Co., Ltd.) was used, unless otherwise specified.

Synthesis of Compound (1)

Compound (1) was synthesized according to the following reaction equation (2). Specific explanation is given below.

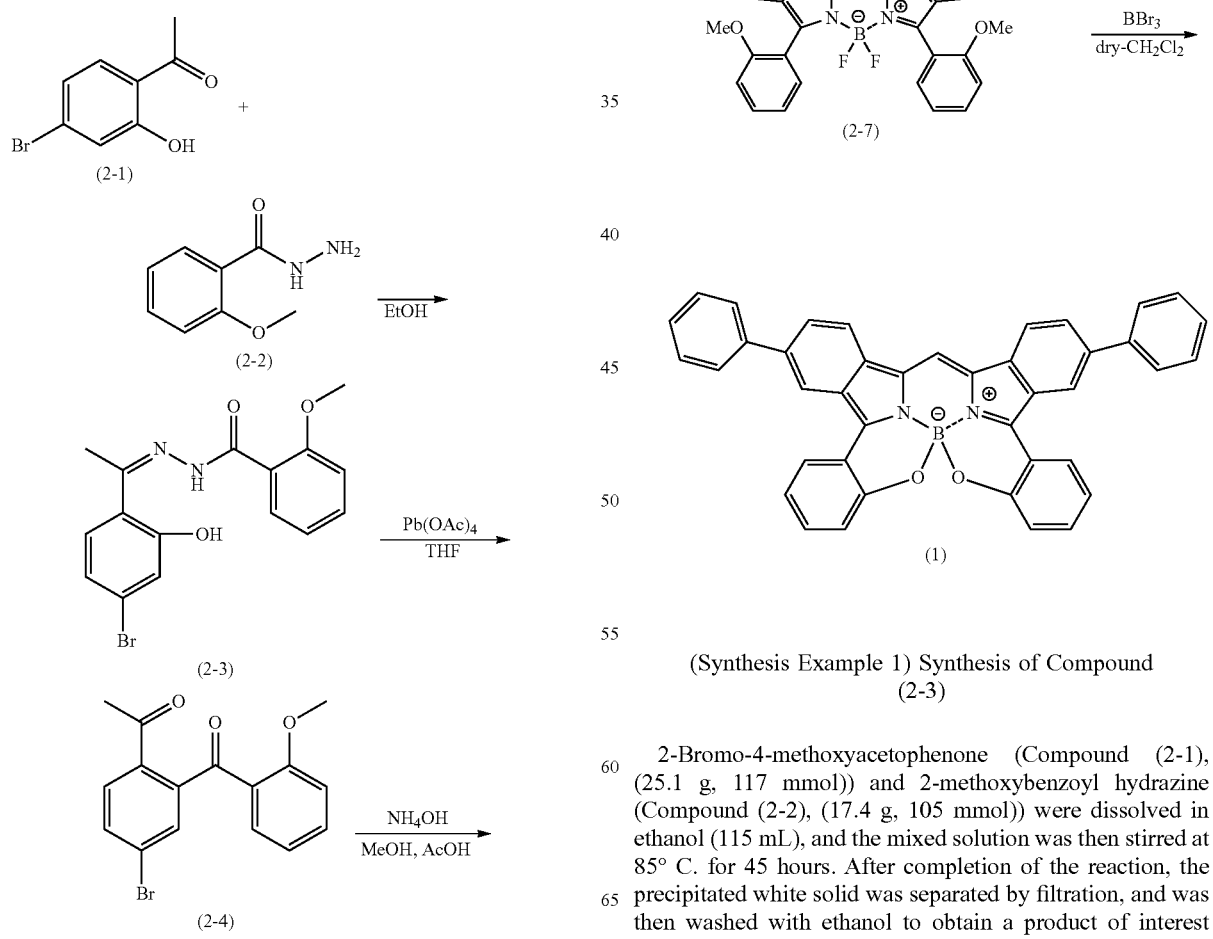

(Synthesis Example 1) Synthesis of Compound (2-3)

2-Bromo-4-methoxyacetophenone (Compound (2-1), (25.1 g, 117 mmol)) and 2-methoxybenzoyl hydrazine (Compound (2-2), (17.4 g, 105 mmol)) were dissolved in ethanol (115 mL), and the mixed solution was then stirred at 85° C. for 45 hours. After completion of the reaction, the precipitated white solid was separated by filtration, and was then washed with ethanol to obtain a product of interest (yield amount: 37.4 g, yield: 95%).

(Synthesis Example 2) Synthesis of Compound (2-4)

Compound (2-3) (17.2 g, 47.5 mmol) was suspended in tetrahydrofuran (750 mL). Thereafter, lead tetraacetate (25.0 g) was slowly added to the suspension, and the obtained mixture was then stirred at a room temperature for 16 hours. Thereafter, the precipitate was separated by filtration. The filtrate was concentrated under a reduced pressure, and methanol was then added thereto. The generated yellowish white solid was filtered to obtain a product of interest (yield amount: 14.9 g, yield: 95%).

(Synthesis Example 3) Synthesis of Compound (2-5)

Compound (2-4) (14.5 g, 39.9 mmol) was suspended in methanol (200 mL) and acetic acid (460 The obtained suspension was cooled to 0° C., and an ammonia aqueous solution (200 mL) was then added dropwise into the suspension over 1 hour. After completion of the dropping, the reaction solution was stirred at 40° C. for 5 days. Thereafter, a purple precipitate was separated by filtration, was then washed with water and methanol, and was then dried under vacuum at 80° C. The obtained crude product was purified by column chromatography (normal phase silica gel, chloroform/hexane) to obtain Compound (2-5) (yield amount: 5.37 g, yield: 44%).

(Synthesis Example 4) Synthesis of Compound (2-6)

Compound (2-5) (2.15 g, 3.50 mmol) was dissolved in toluene (130 mL), and triethylamine (1.4 mL, 10 mmol) was then added to the solution, followed by heating the mixed solution up to 80° C. After that, boron trifluoride diethyl ether (4.2 mL, 34 mmol) was added dropwise into the reaction mixture. The reaction solution was stirred at 100° C. for 2 hours, and the reaction solution was then add to water, followed by extraction with ethyl acetate. The organic phase was washed with water and a saturated saline, was then dried over sodium sulfate, and was the filtered. The obtained filtrate was concentrated under a reduced pressure. The thus obtained crude product was purified by column chromatography (normal phase silica gel, chloroform/hexane) to obtain Compound (2-6) (yield amount: 2.02 g, yield: 87%).

(Synthesis Example 5) Synthesis of Compound (2-7)

Compound (2-6) (1.01 g, 1.53 mmol), Phenylboronic acid (1.05 g, 8.61 mmol), and potassium carbonate (1.03 g) were suspended in a mixed solution of toluene (150 mL) and water (30 mL). The obtained mixture was bubbled with nitrogen gas for 20 minutes, and Pd $(PPh_3)_4$ (0.177 g, 0.153 mmol) was then added to the mixture, followed by heating the mixture to reflux for 9 hours. Thereafter, the reaction solution was air-cooled and was then extracted with ethyl acetate. The organic layer was washed with water and a saturated saline. The resulting organic layer was dried over sodium sulfate and was then filtered. The obtained filtrate was concentrated under a reduced pressure. The thus obtained crude product was purified by column chromatography (normal phase silica gel, ethyl acetate/hexane) to obtain Compound (2-7) (yield amount: 0.776 g, yield: 74%).

$^1$HNMR (400 MHz, $CDCl_3$, a mixture of a meso form and a dl form) δ (ppm): 7.98 (d, 2H, J=7.2 Hz), 7.86 (d, 1H, J=1.6 Hz), 7.72-7.68 (m, 3H), 7.59-7.57 (m, 5H), 7.53 (d, 2H, J=4.4 Hz), 7.46-7.40 (m, 6H), 7.33 (t, 2H, J=7.6 Hz), 7.09 (dt, 1H, J=7.6 and 0.4 Hz), 7.06-6.99 (m, 3H), 3.79 (s, 3H), 3.71 (s, 3H).

Example 1

Synthesis of Compound (1)

Under a nitrogen atmosphere, Compound (2-7) (0.73 g, 1.11 mmol) was dissolved in dehydrated dichloromethane (80 mL). The obtained solution was cooled to 0° C., and thereafter, a boron tribromide dichloromethane solution (3.4 mL) was added dropwise into the reaction solution over 2 minutes. The obtained solution was stirred at a room temperature for 3.5 hours. Thereafter, the reaction solution was poured into saturated sodium bicarbonate water, the obtained solution was then stirred for 2 hours, and a precipitate was then separated by filtration. The organic layer from the filtrate was washed with water and a saturated saline, was then dried over sodium sulfate, and was then filtered. The obtained filtrate was concentrated under a reduced pressure. The thus obtained crude product was purified by vacuum sublimation ($1.2 \times 10^{-2}$ Pa, 450° C.) to obtain Compound (1) (yield amount: 0.42 g, yield: 64%). The measurement results of the EI-MS of the obtained compound are shown below.

DI-MS m/z=588$[M]^+$.

Synthesis of Compound (296)

Compound (296) was synthesized according to the following reaction equation (3). Specific explanation is given below.

Reaction Equation (3)

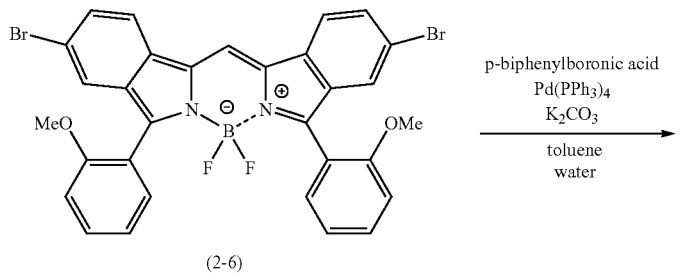

(2-6)

p-biphenylboronic acid
Pd(PPh3)4
K2CO3
———→
toluene
water

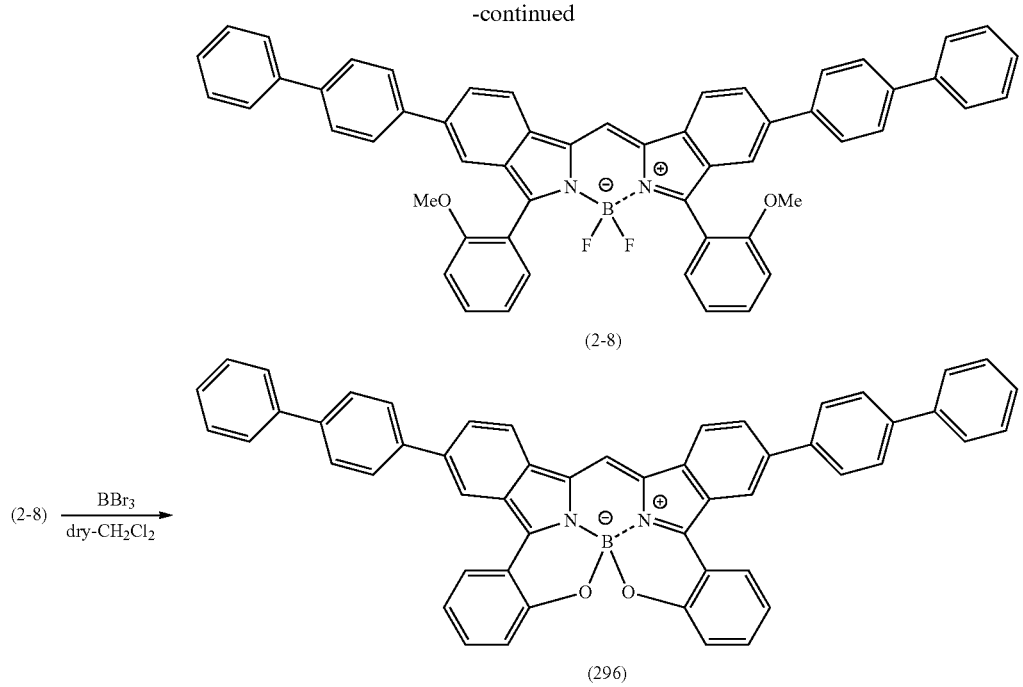

(2-8)

(296)

(Synthesis Example 6) Synthesis of Compound (2-8)

Compound (2-6) (0.90 g, 1.36 mmol), biphenylboronic acid (1.48 g, 7.47 mmol), and potassium carbonate (0.93 g) were suspended in a mixed solution of toluene (133 mL) and water (27 mL). The obtained mixture was bubbled with nitrogen gas for 20 minutes, and Pd(PPh$_3$)$_4$ (0.168 g) was then added to the mixture, followed by heating the mixture to reflux for 7 hours. Thereafter, the reaction solution was air-cooled and was then extracted with ethyl acetate. The organic phase was washed with water and a saturated saline. The resulting organic phase was dried over sodium sulfate and was then filtered. The obtained filtrate was concentrated under a reduced pressure. The thus obtained crude product was washed with methanol to obtain Compound (2-8) (yield amount: 0.777 g, yield: 70%).

DI-MS=808[M]$^+$.

Example 2

Synthesis of Compound (296)

Under a nitrogen atmosphere, Compound (2-8) (0.70 g, 0.86 mmol) was dissolved in dehydrated dichloromethane (70 mL). The obtained solution was cooled to 0° C., and thereafter, a boron tribromide dichloromethane solution (3.4 mL) was added dropwise into the reaction solution over 2 minutes. The obtained solution was stirred at a room temperature for 15 hours. Thereafter, the reaction solution was poured into saturated sodium bicarbonate water, the obtained solution was then stirred for 2 hours, and a precipitate was then separated by filtration. The organic layer from the filtrate was washed with water and a saturated saline, was then dried over sodium sulfate, and was then filtered. The obtained filtrate was concentrated under a reduced pressure. The thus obtained crude product was purified by vacuum sublimation to obtain Compound (296) (yield amount: 0.21 g, yield: 33%). The measurement results of the EI-MS of the obtained compound are shown below.

EI-MS m/z=740[M]$^+$.

Synthesis of Compound (581)

Compound (581) was synthesized according to the following reaction equation (4). Specific explanation is given below.

Reaction Equation (4)

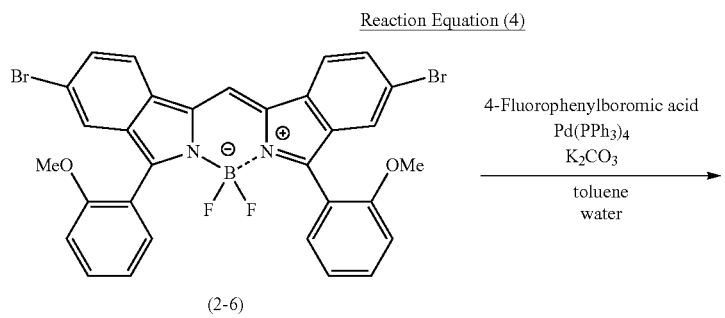

(2-6)

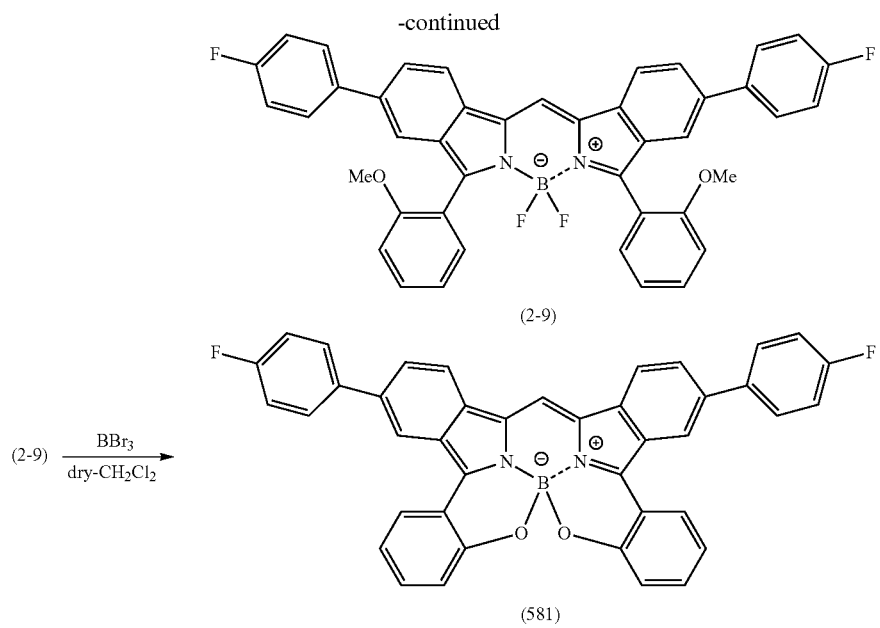

(2-9) →[BBr₃][dry-CH₂Cl₂]

(581)

(Synthesis Example 7) Synthesis of Compound (2-9)

Compound (2-6) (1.08 g, 1.63 mmol, 4-fluoride phenylboronic acid (1.02 g, 7.29 mmol), and potassium carbonate (1.03 g) were suspended in a mixed solution of toluene (150 mL) and water (30 mL). The obtained mixture was bubbled with nitrogen gas for 20 minutes, and Pd (PPh₃)₄ (0.186 g) was then added to the mixture, followed by heating the mixture to reflux for 6 hours. Thereafter, the reaction solution was air-cooled and was then extracted with ethyl acetate. The organic layer was washed with water and a saturated saline. The resulting organic layer was dried over sodium sulfate and was then filtered. The obtained filtrate was concentrated under a reduced pressure. The obtained crude product was purified by column chromatography (normal phase silica gel, chloroform/hexane=4:1) to obtain Compound (2-9) (yield amount: 0.461 g, yield: 41%).

DI-MS m/z=692 [M]⁺.

Example 3

Synthesis of Compound (581)

Under a nitrogen atmosphere, Compound (2-9) (0.43 g, 0.62 mmol) was dissolved in dehydrated dichloromethane (50 mL). The obtained solution was cooled to 0° C., and thereafter, a boron tribromide dichloromethane solution (2.5 mL) was added dropwise into the reaction solution over 2 minutes. The obtained solution was stirred at a room temperature for 3 hours. Thereafter, the reaction solution was poured into saturated sodium bicarbonate water, the obtained solution was then stirred for 2 hours, and a precipitate was then separated by filtration. The organic phase from the filtrate was washed with water and a saturated saline, was then dried over sodium sulfate, and was then filtered. The obtained filtrate was concentrated under a reduced pressure. The thus obtained crude product was purified by vacuum sublimation to obtain Compound (581) (yield amount: 0.27 g, yield: 70%). The measurement results of the DI-MS of the obtained compound are shown below.

DE-MS m/z=624 [M]⁺.

Synthesis of Compound (315)

Compound (315) was synthesized according to the following reaction equation (5). Specific explanation is given below.

Reaction Equation (5)

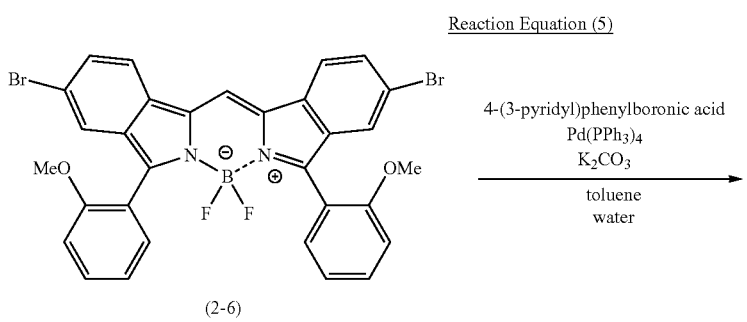

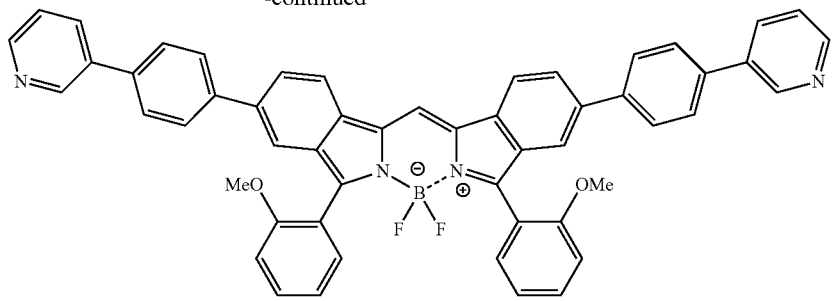

(2-10)

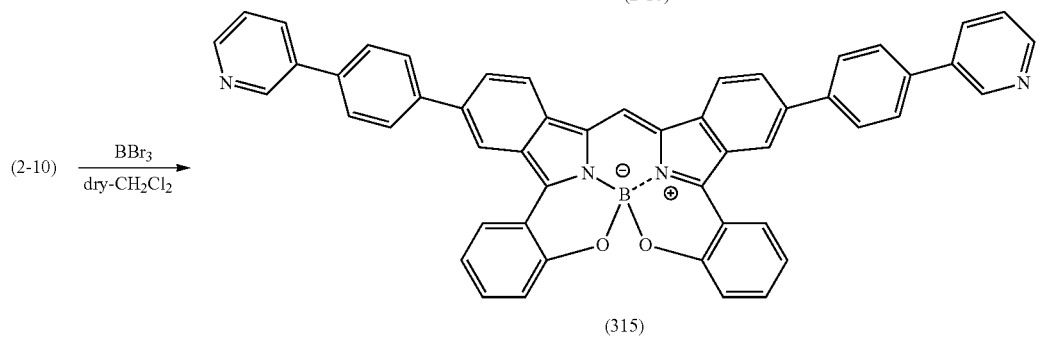

(315)

(Synthesis Example 8) Synthesis of Compound (2-10)

Compound (2-6) (0.97 g, 1.46 mmol), 4-(3-pyridyl)phenylboronic acid (1.02 g, 5.15 mmol), and potassium carbonate (1.01 g) were suspended in a mixed solution of toluene (150 mL) and water (30 mL). The obtained mixture was bubbled with nitrogen gas for 20 minutes, and Pd(PPh$_3$)$_4$ (0.188 g) was then added to the mixture, followed by heating the mixture to reflux for 11 hours. Thereafter, the reaction solution was air-cooled, and a precipitate was then separated by filtration. The filtrate was extracted with chloroform, and the organic phase was then washed with water and a saturated saline. The resulting organic phase was dried over sodium sulfate, and the filtrate was then concentrated under a reduced pressure. The obtained crude product was dissolved in chloroform, and was then filtered through Celite to obtain Compound (2-10) (yield amount: 0.50 g, yield: 42%).
DI-MS m/z=810[M]$^+$.

Example 4

Synthesis of Compound (315)

Under a nitrogen atmosphere, Compound (2-10) (0.56 g, 0.75 mmol) was dissolved in dehydrated dichloromethane (56 mL). The obtained solution was cooled to 0° C., and thereafter, a boron tribromide dichloromethane solution (2.7 mL) was added dropwise into the reaction solution over 2 minutes. The obtained solution was stirred at a room temperature for 3 hours. Thereafter, the reaction solution was poured into saturated sodium bicarbonate water, the obtained solution was then stirred for 2 hours, and a precipitate was then separated by filtration. The organic layer from the filtrate was washed with water and a saturated saline, was then dried over sodium sulfate, and was then filtered. The obtained filtrate was concentrated under a reduced pressure (yield amount: 0.36 g, 64%). The measurement results of the DI-MS of the obtained compound are shown below.
DI-MS m/z=742[M]$^+$.

Example 5

Production of Organic Thin Film (Optical Film) of Near Infrared Absorbing Dye

A vacuum-deposited film having a thickness of 70 nm was formed with the Compound (1) obtained in Example 1 on a quartz substrate according to resistance heating vacuum deposition to produce an organic thin film test piece. The obtained wavelength-absorbance graph is shown in FIG. 4. The absorption edge of the Compound (1) in an organic thin film state was measured at 927 nm.

Example 6

Production of Thin Film (Optical Film) of Near Infrared Absorbing Dye

A vacuum-deposited film having a thickness of 80 nm was formed with the Compound (296) obtained in Example 2 on a glass substrate according to resistance heating vacuum deposition to produce a thin film test piece. The obtained wavelength-absorbance graph is shown in FIG. 5. The absorption edge of the Compound (296) in a thin film state was measured at 937 nm.

Example 7

Production of Thin Film (Optical Film) of Near Infrared Absorbing Dye

A vacuum-deposited film having a thickness of 90 nm was formed with the Compound (581) obtained in Example 3 on a glass substrate according to resistance heating vacuum deposition to produce a thin film test piece. The obtained wavelength-absorbance graph is shown in FIG. 6. The absorption edge of the Compound (581) in a thin film state was measured at 937 nm.

Synthesis of Comparative Compound A

Comparative Compound A is a compound represented by the following formula:

(Comparative Compound A)

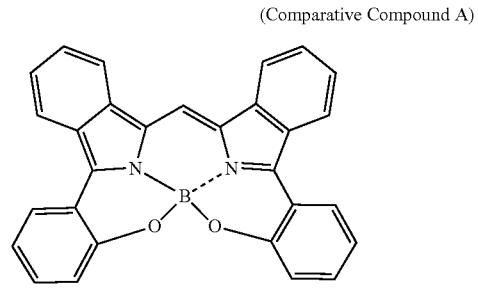

Comparative Compound A was synthesized according to the following reaction equation (6). Specific explanation is given below.

Reaction Equation (6)

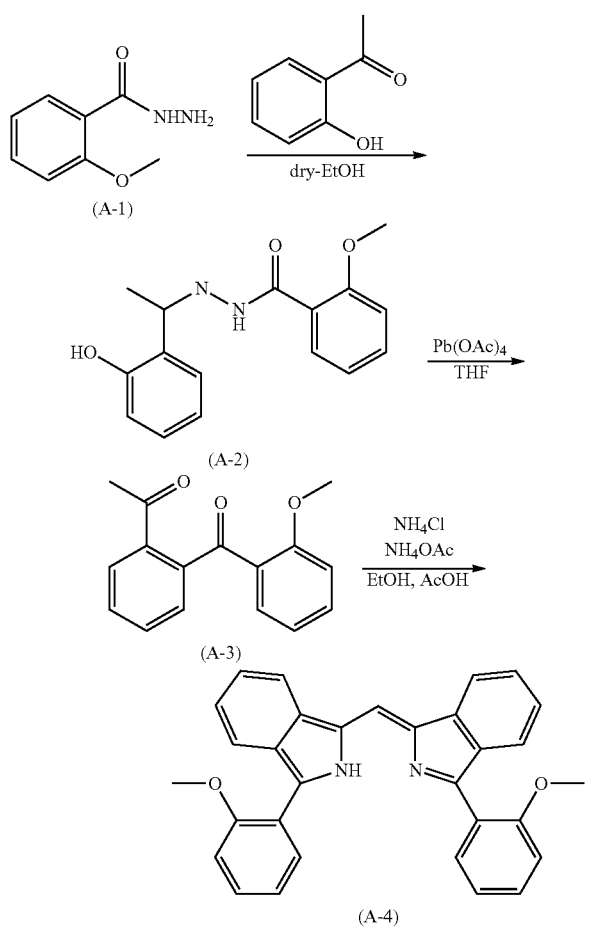

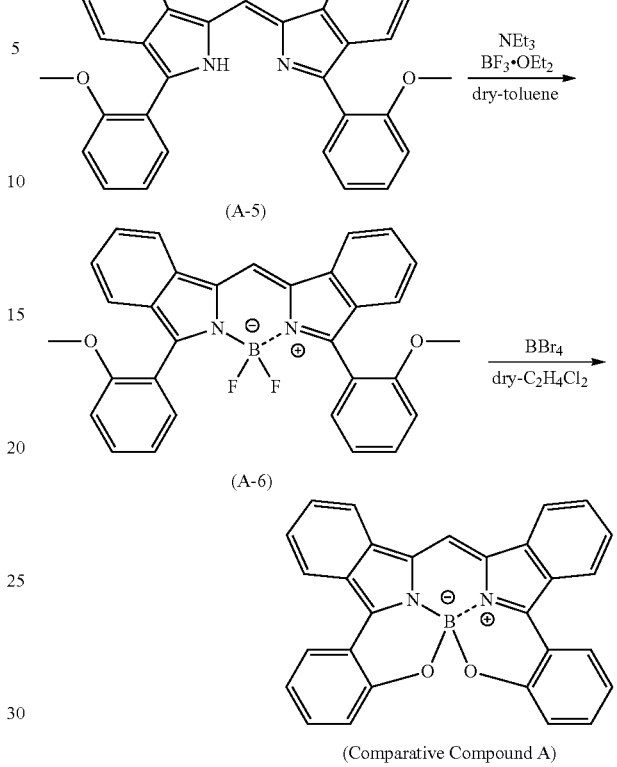

Synthesis of Compound (A-2)

Under a nitrogen atmosphere, Compound (A-1) (5.01 g, 30.1 mmol) and 2-hydroxyacetophenone (4.5 mL, 37.4 mmol) were dissolved in dehydrated ethanol (80 mL), and the obtained solution was then refluxed overnight. After completion of the reaction, Compound (A-2) was obtained as a white solid precipitated by filtration (5.80 g, yield: 68%).

$^1$HNMR (500 MHz, CDCl$_3$): δ (ppm) 12.9 (s, 1H), 11.0 (s, 1H), 8.36 (dd, 1H, J=7.80, 1.80 Hz), 7.53 (ddd, 1H, J=8.34, 7.26, 1.79 Hz), 7.47 (dd, 1H, J=7.97, 1.58 Hz), 7.29 (td, 1H, J=7.70, 1.50 Hz), 7.17 (td, 1H, J=7.56, 0.88 Hz, Hd), 7.05 (dd, 1H, J=8.33, 1.13 Hz), 7.05 (dd, 1H, J=8.23, 1.35 Hz), 6.87 (td, 1H, J=7.59, 1.23 Hz), 4.10 (s, 3H), 2.39 (s, 3H). FAB-MS: m/z=285[M+H]$^+$.

Synthesis of Compound (A-3)

Compound (A-2) (3.01 g, 10.6 mmol) was dissolved in tetrahydrofuran (190 mL). While cooling on ice, lead tetraacetate (5.72 g, 12.9 mmol) was added, little by little, to the obtained solution, and the mixed solution was then stirred at a room temperature for 2 hours. After completion of the reaction, a precipitated solid was removed by Kiriyama filtration using silica gel, the solvent was then distilled away, and the residue was subjected to a liquid separation treatment using dichloromethane and distilled water. The organic phase was dried, and the solvent was then distilled away to obtain Compound (A-3) as a light yellow solid (2.61 g, yield: 97%).

$^1$HNMR (500 MHz, CDCl$_3$): δ (ppm) 7.65-7.68 (m, 2H), 7.47-7.54 (m, 3H), 7.37 (dd, 1H, J=6.98, 1.78 Hz), 7.03 (td, 1H, J=7.58, 0.95 Hz), 6.94 (d, 1H, J=8.25 Hz), 3.64 (s, 3H), 2.49 (s, 3H).

FAB-MS: m/z=255[M+H]$^+$.

Synthesis of Compound (A-4)

Compound (A-3) (1.00 g, 3.95 mmol) was dissolved in ethanol (55 mL) and acetic acid (11 mL), and the obtained solution was then heated to 65° C. Thereafter, ammonium chloride (216 mg, 4.03 mmol) and ammonium acetate (1.95 g, 25.4 mmol) were added to the reaction solution. The obtained mixture was stirred at 80° C. overnight, was then quenched with saturated sodium bicarbonate water, and was then subjected to a liquid separation treatment using dichloromethane and a saturated saline. The organic phase was dried over sodium sulfate, the solvent was then distilled away, and the residue was then purified by column chromatography (normal phase silica gel, dichloromethane: hexane=1:1) to obtain Compound (A-4) as a lustrous, dark green solid (458 mg, yield: 51%).

$^1$HNMR (500 MHz, CDCl$_3$): δ (ppm) 7.94 (dd, 2H, J=7.48, 1.53 Hz), 7.93 (d, 2H, J=7.95 Hz), 7.84 (d, 2H, J=8.15 Hz), 7.61 (s, 1H), 7.38 (td, 2H, J=7.82, 1.35 Hz), 7.35 (t, 2H, J=7.43 Hz), 7.24 (t, 2H, J=7.58 Hz), 7.11 (td, 2H, J=7.32, 0.70 Hz), 7.04 (d, 2H, J=8.25 Hz), 3.77 (s, 6H).

FAB-MS: m/z=456[M]$^+$.

Synthesis of Compound (A-5)

Under a nitrogen atmosphere, Compound (A-4) (1.01 g, 2.21 mmol) was dissolved in dehydrated toluene (88 mL), and triethylamine (0.8 mL, 5.77 mmol) was then added to the obtained solution, followed by stirring the obtained mixture. The reaction mixture was heated to 80° C., and a boron trifluoride diethyl ether complex (2.5 ml, 20.3 mmol) was then added dropwise into the mixture. The thus obtained mixture was stirred at 100° C. for 3 hours. Thereafter, distilled water was added to the reaction mixture to quench it, and the mixture was then subjected to a liquid separation treatment using dichloromethane and distilled water. The organic phase was dried over sodium sulfate, and the solvent was then distilled away. The obtained solid was washed with methanol and was then filtered to obtain Compound (A-5) as a bluish purple solid (1.10 g, yield: 99%).

$^1$HNMR (500 MHz, DMSO-d$_6$): δ (ppm) 8.65 (s, 1H), 8.16 (d, 1H, J=8.20 Hz), 8.15 (d, 1H, J=8.20 Hz), 7.54 (t, 2H, J=7.37 Hz), 7.48 (td, 2H, J=7.91, 1.63 Hz), 7.45 (d, 1H, J=7.60 Hz), 7.38 (d, 1H, J=7.15 Hz), 7.29 (d, 1H, J=8.10 Hz), 7.26 (d, 1H, J=6.85 Hz), 7.28 (t, 1H, J=8.15 Hz), 7.25 (t, 1H, 3=7.43 Hz), 7.20 (d, 1H, J=8.25 Hz), 7.17 (d, 1H, J=8.25 Hz), 7.07 (td, 1H, J=7.50, 0.75 Hz), 7.01 (td, 1H, J=7.49, 0.72 Hz), 3.72 (s, 6H) 3.66 (s, 6H).

FAB-MS: m/z=504[M]$^+$.

Synthesis of Comparative Compound (A)

Under a nitrogen atmosphere, Compound (A-5) (700 mg, 1.39 mmol) was dissolved in dehydrated dichloroethane (138 mL), and the obtained solution was then stirred at 0° C. Thereafter, boron tribromide (7.0 mL, 7.0 mmol) was added dropwise into the reaction solution, and the obtained mixture was continuously stirred for 2 hours. Thereafter, the reaction solution was heated to 40° C., and was then stirred overnight. After completion of the reaction, while cooling on ice, saturated sodium bicarbonate water was added to the reaction solution, and the obtained mixture was then quenched. The water phase was removed, the solvent was then distilled away, and a solid precipitated with methanol was then washed, followed by filtration, to obtain a bluish green solid (515 mg, crude yield: 85%). Thereafter, the bluish green solid was subjected to sublimation purification to obtain Comparative Compound A as a lustrous green solid.

APCI-MS: m/z=436[M]$^+$.

Comparative Example 1

Production of Thin Film Using Comparative Compound (A), and Evaluation Thereof

Comparative Compound A was deposited on a previously washed glass substrate to a film thickness of 80 nm according to resistance heating vacuum deposition, and the absorption spectrum of the obtained organic thin film was then measured. The obtained absorption spectrum is shown in FIG. 7. As a result, the absorption edge of the Comparative Compound A in a thin film state was measured at 838 nm.

In comparison to the Comparative Compound (A) obtained in Comparative Example 1, the absorption edge of a thin film produced using the dibenzopyrromethene boron chelate compound of the present invention has a longer wavelength (100 nm), and thus, light absorption in the near infrared light region becomes possible more effectively. From these results, it can be confirmed that the compound of the present invention is useful as a near infrared absorbing dye, and as an optical film.

Example 8

Production of Thin Film (Optical Film) of Near Infrared Absorbing Dye and Light Resistance Test A vacuum-deposited film having a thickness of 100 nm was formed with the Compound (1) obtained in Example 1 on a glass substrate according to resistance heating vacuum deposition to produce a thin film test piece. The test piece was loaded on a low-temperature cycle xenon weather meter XL75, manufactured by Suga Test Instruments Co., Ltd., and was then irradiated under conditions of an irradiance of 100,000 Lux, a humidity of 60% RH, and a temperature of 24° C. After predetermined periods of time (0 min, 90 min, 300 min, and 1200 min) had elapsed, the test piece was taken out, and a change in the absorbance was then recorded using an ultraviolet visible absorption spectrum. The obtained wavelength-absorbance graph is shown in FIG. 8.

Comparative Example 2

Production of Thin Film of Near Infrared Absorbing Dye and Light Resistance Test An acetone solution of 0.2% by weight of an infrared absorbing cyanine dye KAYASORB CY-10, manufactured by Nippon Kayaku Co., Ltd., was spin-coated at 2000 rpm on a glass substrate, so as to form a film. Then, the film was subjected to a drying treatment at 100° C. for 30 minutes to produce a thin film test piece. The test piece was loaded on a low-temperature cycle xenon weather meter XL75, manufactured by Suga Test Instruments Co., Ltd., and was then irradiated under conditions of an irradiance of 100,000 Lux, a humidity of 60% RH, and a temperature of 24° C. After predetermined periods of time (0 min, 30 min, 60 min, and 90 min) had elapsed, the test piece was taken out, and a change in the absorbance was then recorded using an ultraviolet visible absorption spectrum. The obtained wavelength-absorbance graph is shown in FIG. 9.

Comparative Example 3

Production of Near Infrared Absorbing Thin and Light Resistance Test

An acetone solution of 0.2% by weight of an infrared absorbing cyanine dye KAYASORB IR-820, manufactured by Nippon Kayaku Co., Ltd., was spin-coated at 2000 rpm on a glass substrate, so as to form a film. Then, the film was subjected to a drying treatment at 100° C. for 30 minutes to produce a thin film test piece. The test piece was loaded on a low-temperature cycle xenon weather meter XL75, manufactured by Suga Test Instruments Co., Ltd., and was then irradiated under conditions of an irradiance of 100,000 Lux, a humidity of 60% RH, and a temperature of 24° C. After predetermined periods of time (0 min, 90 min, 300 min, and 1200 min) had elapsed, the test piece was taken out, and a change in the absorbance was then recorded using an ultraviolet visible absorption spectrum. The obtained wavelength-absorbance graph is shown in FIG. 10.

As is apparent from FIG. 8 to FIG. 10, in comparison to the Comparative Examples in which organic compounds each having a similar structure were used, the organic compound of the present invention exhibited extremely high light resistance, and thus, it can be confirmed that the present organic compound is a near infrared absorbing dye having stability in the atmosphere and excellent light resistance.

Example 9

Production of Photoelectric Conversion Element and Evaluation Thereof

Compound (1) was vacuum-deposited on an ITO transparent conductive glass (manufactured by GEOMATEC Co., Ltd., ITO film thickness: 150 nm) as a photoelectric conversion layer having a thickness of 100 nm. Thereafter, aluminum was vacuum-deposited thereon as an electrode having a thickness of 100 nm, so as to produce a photoelectric conversion element. When a voltage of 2 V was applied to ITO and aluminum serving as electrodes, the current was $2.71 \times 10^{-9}$ A/cm$^2$ in a dark place. When a voltage of 2 V was applied to the transparent conductive glass side and light irradiation was then carried out at an irradiation light wavelength of 800 nm and at a half width of 20 nm, the current was $1.54 \times 10^{-6}$ A/cm$^2$. The current response characteristics of the obtained photoelectric conversion element are shown in FIG. 11. The photoelectric conversion spectrum of the obtained photoelectric conversion element is shown in FIG. 12. The optical response sensitivity was 760 nm at maximum, and the sensitivity was reduced by half at 877 nm.

Example 10

Production of Photoelectric Conversion Element and Evaluation Thereof

Compound (296) was vacuum-deposited on an ITO transparent conductive glass (manufactured by GEOMATEC Co., Ltd., ITO film thickness: 150 nm) as a photoelectric conversion layer having a thickness of 100 nm. Thereafter, aluminum was vacuum-deposited thereon as an electrode having a thickness of 100 nm, so as to produce a photoelectric conversion element. When a voltage of 2 V was applied to ITO and aluminum serving as electrodes, the current was $6.89 \times 10^{-9}$ A/cm$^2$ in a dark place. When a voltage of 2 V was applied to the transparent conductive glass side and light irradiation was then carried out at an irradiation light wavelength of 800 nm and at a half width of 20 nm, the current was $7.90 \times 10^{-7}$ A/cm$^2$. The current response characteristics of the obtained photoelectric conversion element are shown in FIG. 13. The photoelectric conversion spectrum of the obtained photoelectric conversion element is shown in FIG. 14. The optical response sensitivity was 766 nm at maximum, and the sensitivity was reduced by half at 906 nm.

Example 11

Production of Photoelectric Conversion Element and Evaluation Thereof

Compound (581) was vacuum-deposited on an ITO transparent conductive glass (manufactured by GEOMATEC Co., Ltd., ITO film thickness: 150 nm) as a photoelectric conversion layer having a thickness of 100 nm. Thereafter, aluminum was vacuum-deposited thereon as an electrode having a thickness of 80 nm, so as to produce a photoelectric conversion element. When a voltage of 2 V was applied to ITO and aluminum serving as electrodes, the current was $8.91 \times 10^{-9}$ A/cm$^2$ in a dark place. When a voltage of 2 V was applied to the transparent conductive glass side and light irradiation was then carried out at an irradiation light wavelength of 800 nm and at a half width of 20 nm, the current was $1.89 \times 10^{-6}$ A/cm$^2$. The current response characteristics of the obtained photoelectric conversion element are shown in FIG. 15. The photoelectric conversion spectrum of the obtained photoelectric conversion element is shown in FIG. 16. The optical response sensitivity was 778 nm at maximum, and the sensitivity was reduced by half at 896 nm.

Comparative Example 4

Production of Photoelectric Conversion Element and Evaluation Thereof

Comparative Compound A was deposited on an ITO transparent conductive glass (manufactured by GEOMATEC Co., Ltd., ITO film thickness: 150 nm) as a photoelectric conversion layer according to resistance heating vacuum deposition, so as to form a film having a thickness of 80 nm. Thereafter, aluminum was deposited thereon as an electrode according to resistance heating vacuum deposition, so as to form a film having a thickness of 100 nm, thereby producing a photoelectric conversion element to be used as a control. A voltage of 0.05 V was applied to ITO and aluminum serving as electrodes while light irradiation was carried out at an irradiation light wavelength of 775 nm and at a half width of 20 nm, and the photocurrent responsiveness was measured. As a result, the current was $5.18 \times 10^{-8}$ A/cm$^2$ in a dark place, the current was $9.47 \times 10^{-8}$ A/cm$^2$ in a bright place, and the contrast ratio was 18. The photocurrent response characteristics of the obtained photoelectric conversion element are shown in FIG. 17. Moreover, a voltage of 1 V was applied, and the photocurrent responsiveness was then measured. As a result, the current was $8.15 \times 10^{-6}$ A/cm$^2$ in a dark place, the current was $1.42 \times 10^{-5}$ A/cm$^2$ in a bright place, and the contrast ratio was 1.7. The photoelectric conversion spectrum of the obtained photoelectric conversion element is shown in FIG. 18. The optical response sensitivity was 775 nm at maximum, and the sensitivity was reduced by half at 818 nm.

The photoelectric conversion element comprising the Comparative Compound A shown in Comparative Example 4 has a significant leakage of dark current in a state where light irradiation is not carried out, and the contrast ratio is significantly poor. In contrast, since a contrast ratio consisting a 3-digit number could be obtained from the photoelectric conversion element of the present invention comprising a dibenzopyrromethene boron chelate compound, it can be confirmed that the present photoelectric conversion element is excellent in terms of photoelectric conversion properties. Furthermore, the optical response sensitivity of the element comprising the Comparative Compound A shown in Comparative Example 1 was reduced by half at 818 nm, whereas the optical response sensitivity of the element of the present invention comprising a dibenzopyrromethene boron chelate compound was not reduced by half until it has a wavelength of 870 nm or more.

Since the photoelectric conversion element of the present invention exhibits good near infrared absorption properties and also exhibits excellent photoelectric conversion properties, it can be confirmed that the present photoelectric conversion element is useful as a near infrared sensor.

It can be confirmed that the organic compound of the present invention exhibits excellent photoelectric conversion properties also as a photoelectric conversion element.

REFERENCE SIGNS LIST

1 Source electrode
2 Semiconductor layer
3 Drain electrode
4 Insulator layer
5 Gate electrode
6 Substrate
11 Insulation
12 Upper electrode
13 Electron blocking layer or hole transport layer
14 Photoelectric conversion part
15 Hole blocking layer or electron transport layer
16 Lower electrode
17 Insulating base material, or other photoelectric conversion element

The invention claimed is:

1. An organic compound represented by the following general formula (1):

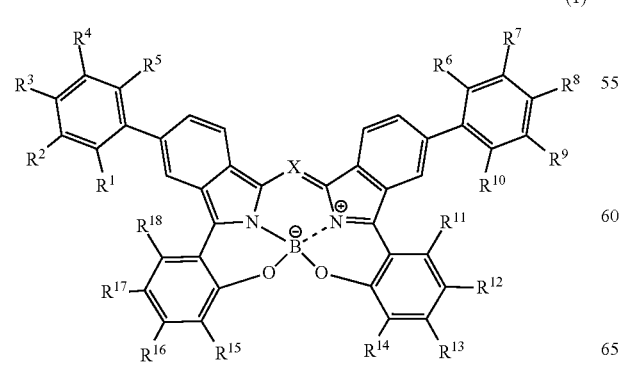

(1)

wherein
$R^1$ to $R^2$, $R^4$ to $R^7$, and $R^9$ to $R^{18}$ each represent a hydrogen atom,
$R^3$ and $R^8$ each represent a hydrogen atom, an aryl group, or a halogen atom, and
X represents a substituted or unsubstituted methine group.

2. An organic compound represented by the following general formula (2):

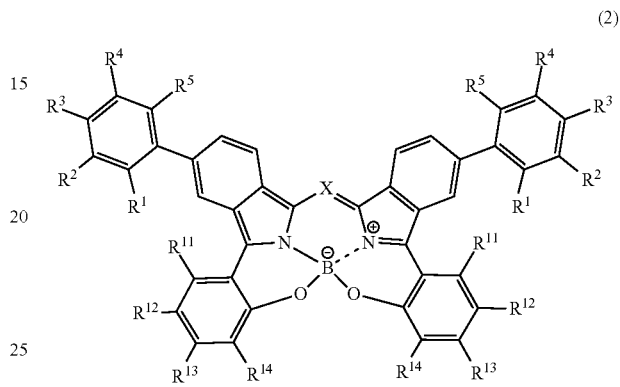

(2)

wherein
$R^1$ to $R^2$, $R^4$ to $R^5$, and $R^{11}$ to $R^{14}$ each represent a hydrogen atom,
$R^3$ represents a hydrogen atom, an aryl group, or a halogen atom and
X represents a substituted or unsubstituted methine group.

3. An organic compound represented by the following general formula (3):

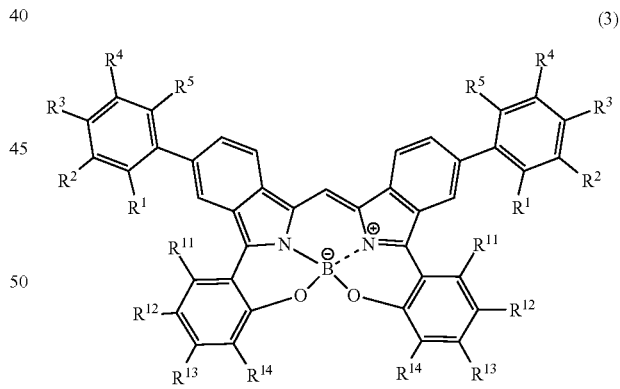

(3)

wherein
$R^1$ to $R^2$, $R^4$ to $R^5$, and $R^{11}$ to $R^{14}$ each represent a hydrogen atom,
$R^3$ represents a hydrogen atom, an aryl group, or a halogen atom.

4. A near infrared absorbing dye comprising the organic compound according to claim 1.

5. An optical film using the organic compound according to claim 1.

6. An organic electronic device using the organic compound according to claim 1.

7. A photoelectric conversion element comprising a photoelectric conversion film comprising a compound represented by the following general formula (1):

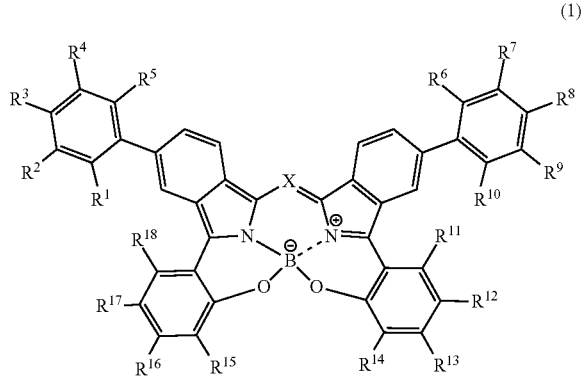

(1)

wherein
R$^1$ to R$^2$, R$^4$ to R$^7$, and R$^9$ to R$^{18}$ each represent a hydrogen atom,
R$^3$ and R$^8$ each independently represent a hydrogen atom an aryl group, or a halogen atom, and
X represents a substituted or unsubstituted methine group.

8. A light sensor comprising the photoelectric conversion element according to claim 7.

9. An imaging element comprising the photoelectric conversion element according to claim 7.

10. An image sensor comprising the photoelectric conversion element according to claim 7.

11. A material for a photoelectric conversion element, comprising a compound represented by the following general formula (1):

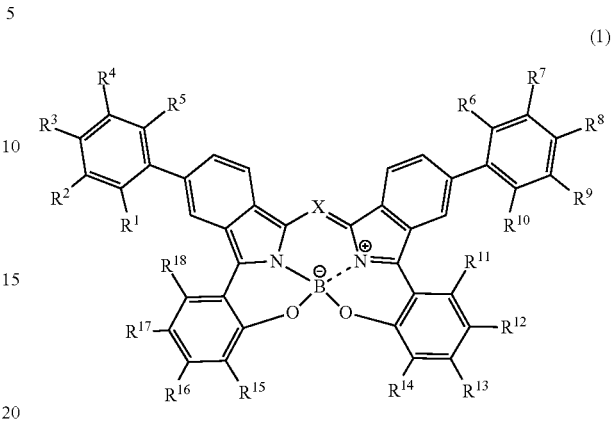

(1)

wherein
R$^1$ to R$^2$, R$^4$ to R$^7$, and R$^9$ to R$^{18}$ each represent a hydrogen atom,
R$^3$ and R$^8$ each independently represent a hydrogen atom, an aryl group, or a halogen atom, and
X represents a substituted or unsubstituted methine group.

12. A near infrared absorbing dye comprising the organic compound according to claim 2.

13. An optical film using the organic compound according to claim 2.

14. An organic electronic device using the organic compound according to claim 2.

15. A near infrared absorbing dye comprising the organic compound according to claim 3.

16. An optical film using the organic compound according to claim 3.

17. An organic electronic device using the organic compound according to claim 3.

* * * * *